(12) United States Patent
Peng et al.

(10) Patent No.: US 12,255,238 B2
(45) Date of Patent: Mar. 18, 2025

(54) INTEGRATED CIRCUIT, SYSTEM AND METHOD OF FORMING SAME

(71) Applicant: TAIWAN SEMICONDUCTOR MANUFACTURING COMPANY, LTD., Hsinchu (TW)

(72) Inventors: Shih-Wei Peng, Hsinchu (TW); Chih-Min Hsiao, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 814 days.

(21) Appl. No.: 17/313,576

(22) Filed: May 6, 2021

(65) Prior Publication Data
US 2022/0130968 A1   Apr. 28, 2022

Related U.S. Application Data

(60) Provisional application No. 63/106,090, filed on Oct. 27, 2020.

(51) Int. Cl.
| | | |
|---|---|---|
| *H01L 23/00* | (2006.01) | |
| *H01L 21/311* | (2006.01) | |
| *H01L 21/768* | (2006.01) | |
| *H01L 23/522* | (2006.01) | |
| *H01L 23/528* | (2006.01) | |

(Continued)

(52) U.S. Cl.
CPC .... *H01L 29/4175* (2013.01); *H01L 21/31144* (2013.01); *H01L 21/76877* (2013.01); *H01L 23/5226* (2013.01); *H01L 23/5286* (2013.01); *H01L 29/401* (2013.01)

(58) Field of Classification Search
CPC ............ H01L 23/5286; H01L 23/5226; H01L 29/4175
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| 2014/0040838 A1 | 2/2014 | Liu et al. |

(Continued)

FOREIGN PATENT DOCUMENTS

| | | |
|---|---|---|
| TW | 201719855 | 6/2017 |
| TW | 202022990 | 6/2020 |

OTHER PUBLICATIONS

Office Action dated May 20, 2022 for corresponding case No. TW 11120500950. (pp. 1-8).

*Primary Examiner* — Reema Patel
(74) *Attorney, Agent, or Firm* — Hauptman Ham, LLP

(57) ABSTRACT

An integrated circuit includes a set of power rails, a set of active regions, a first set of conductive lines and a first and a second set of vias. The set of power rails is configured to supply a first or second supply voltage, and is on a first level of a back-side of a substrate. The set of active regions is a second level of a front-side of the substrate. The first set of conductive lines extend in a second direction and overlap the set of active regions. The first set of vias is between and electrically couples the set of active regions and the first set of conductive lines together. The second set of vias is between and electrically couples the first set of conductive lines and the set of power rails together.

20 Claims, 47 Drawing Sheets

(51) Int. Cl.
*H01L 29/40* (2006.01)
*H01L 29/417* (2006.01)

(56) References Cited

U.S. PATENT DOCUMENTS

2014/0246791 A1    9/2014  Stephens et al.
2015/0278429 A1   10/2015  Chang
2020/0020591 A1    1/2020  Anderson et al.
2020/0373242 A1*  11/2020  Hiblot ................ H01L 23/5384

* cited by examiner

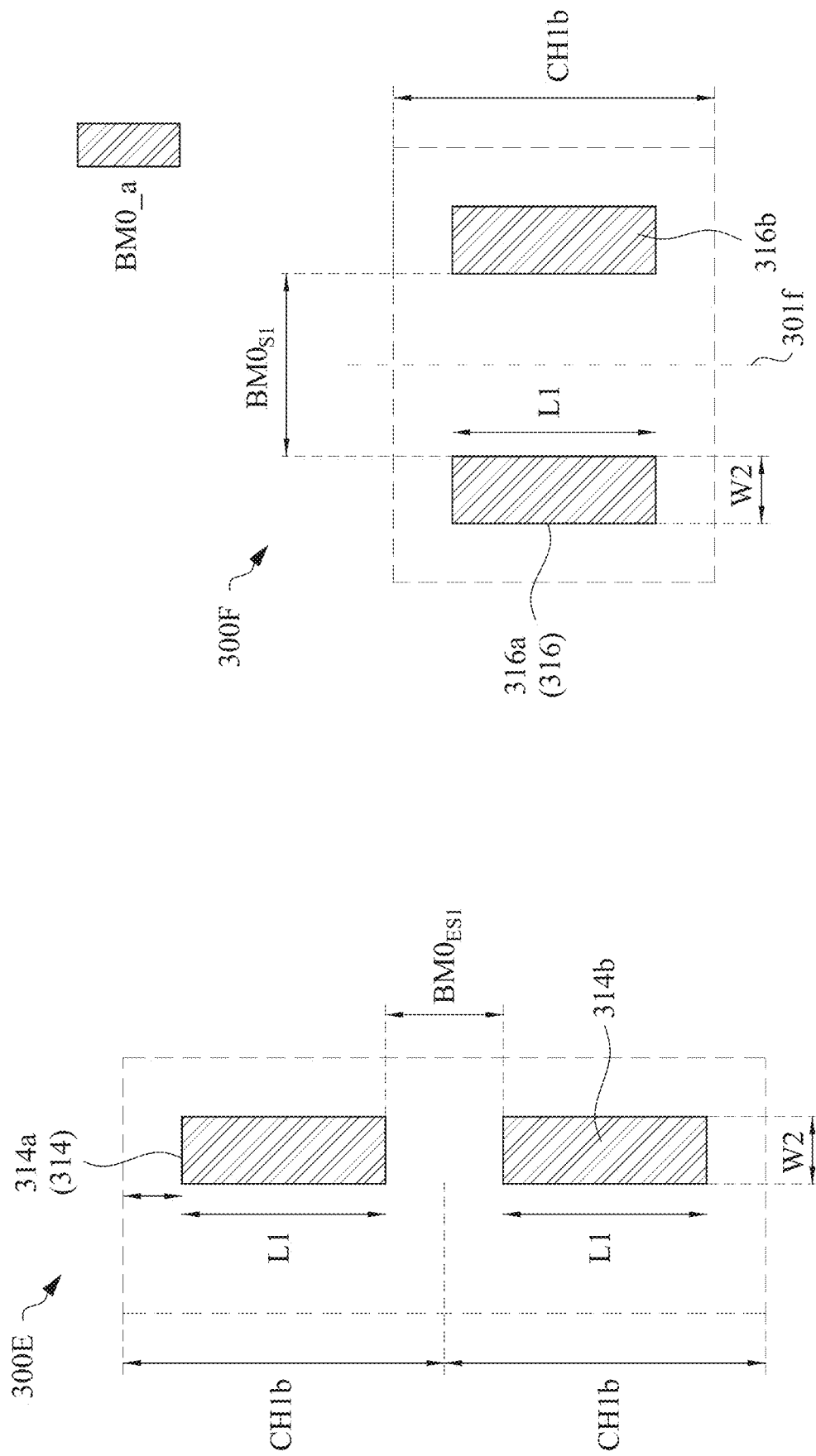

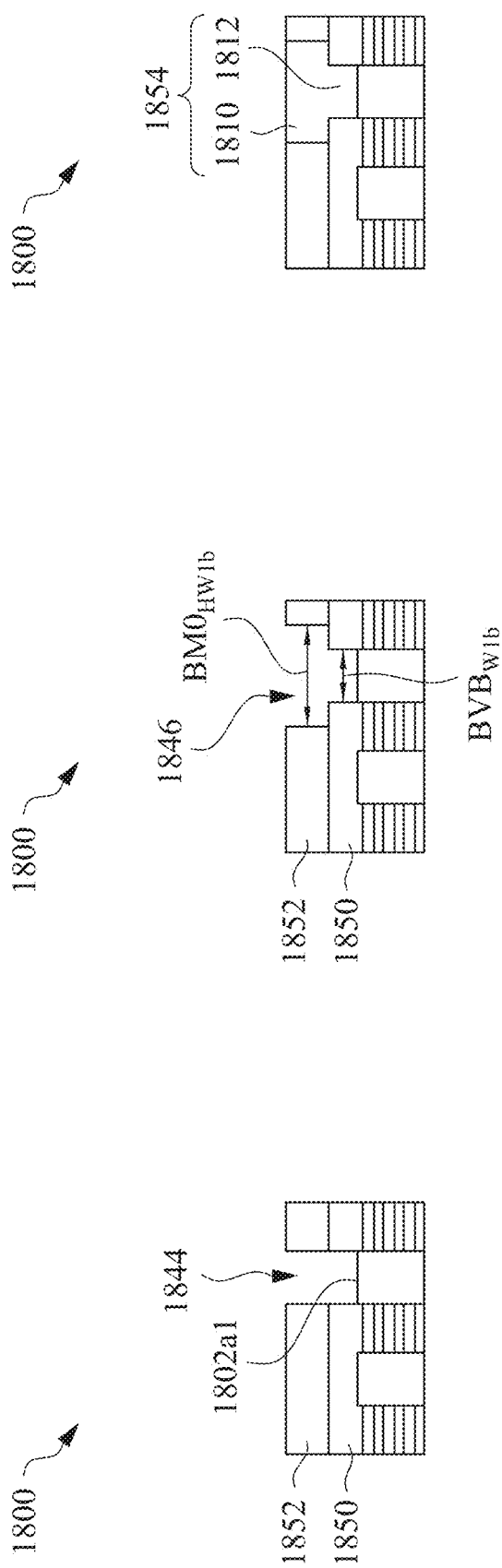

INTEGRATED CIRCUIT, SYSTEM AND METHOD OF FORMING SAME

PRIORITY CLAIM

This application claims the benefit of U.S. Provisional Application No. 63/106,090, filed Oct. 27, 2020, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are diagrams of corresponding integrated circuits, in accordance with some embodiments.

FIGS. 18A-18F are diagrams of intermediate versions of an integrated circuit, in accordance with some embodiments.

DETAILED DESCRIPTION

Figure 1A:
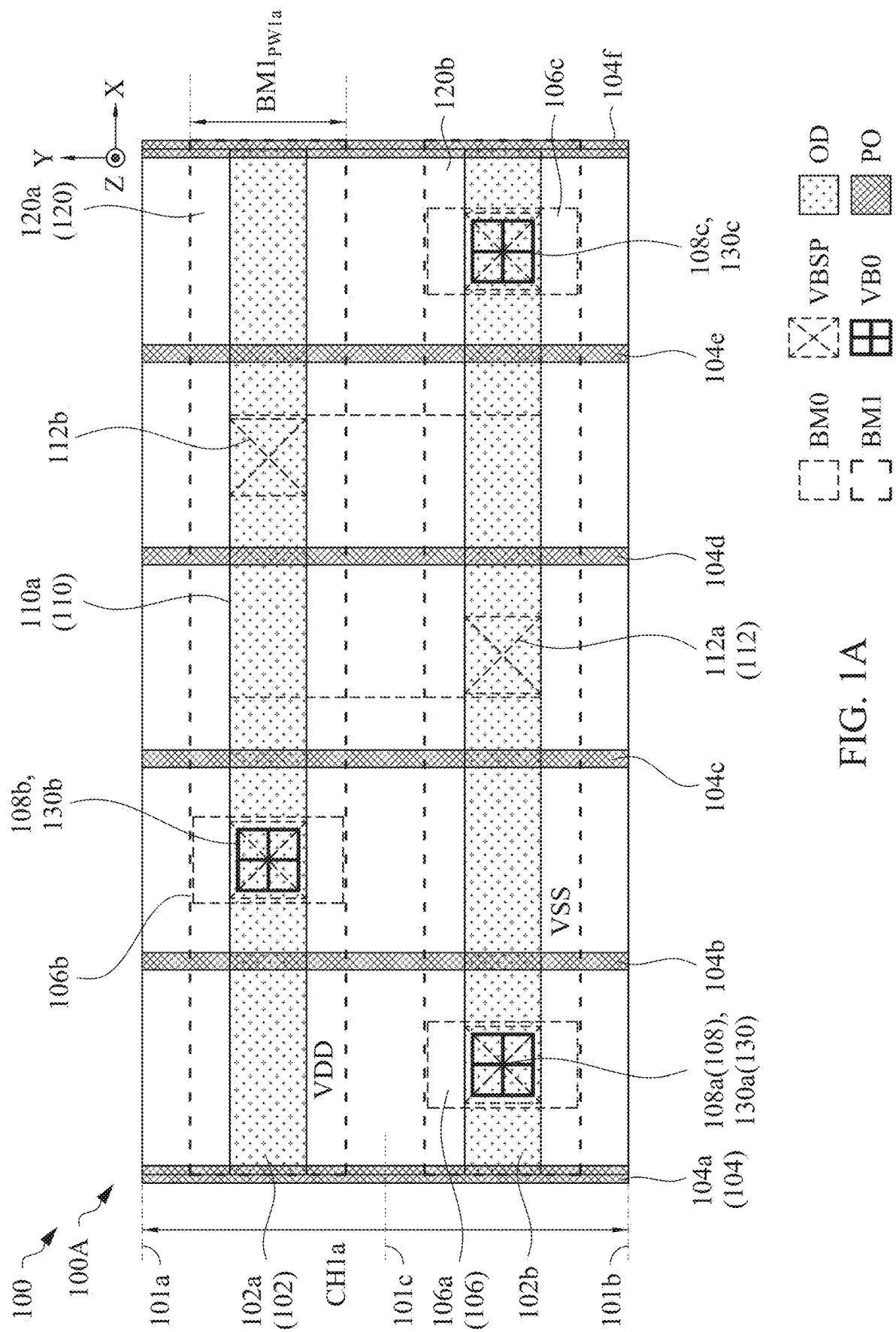
FIGS. 1A-1B are diagrams of a layout design of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first power rail, a second power rail, a first signal line, a first active region, a second active region, and a first conductive line.

In some embodiments, the first power rail and the second power rail extend in a first direction and are on a first level of a back-side of a substrate. In some embodiments, the first power rail is configured to supply a first supply voltage, and the second power rail is configured to supply a second supply voltage different from the first supply voltage.

In some embodiments, the first signal line extends in the first direction and is also on the first level of the back-side of the substrate. In some embodiments, the first signal line is between the first power rail and the second power rail.

In some embodiments, the first active region and the second active region are on a second level of a front-side of the substrate opposite from the back-side.

In some embodiments, the first conductive line extends in the second direction, and is on a third level of the back-side of the substrate. In some embodiments, the first conductive line electrically couples the first active region and the second active region to the first signal line.

In some embodiments, by electrically coupling the first active region and the second active region to the first signal line, the integrated circuit of the present disclosure offers more routing flexibility and more via landing spots, thus increasing routing resources compared to other approaches.

Figure 1B:
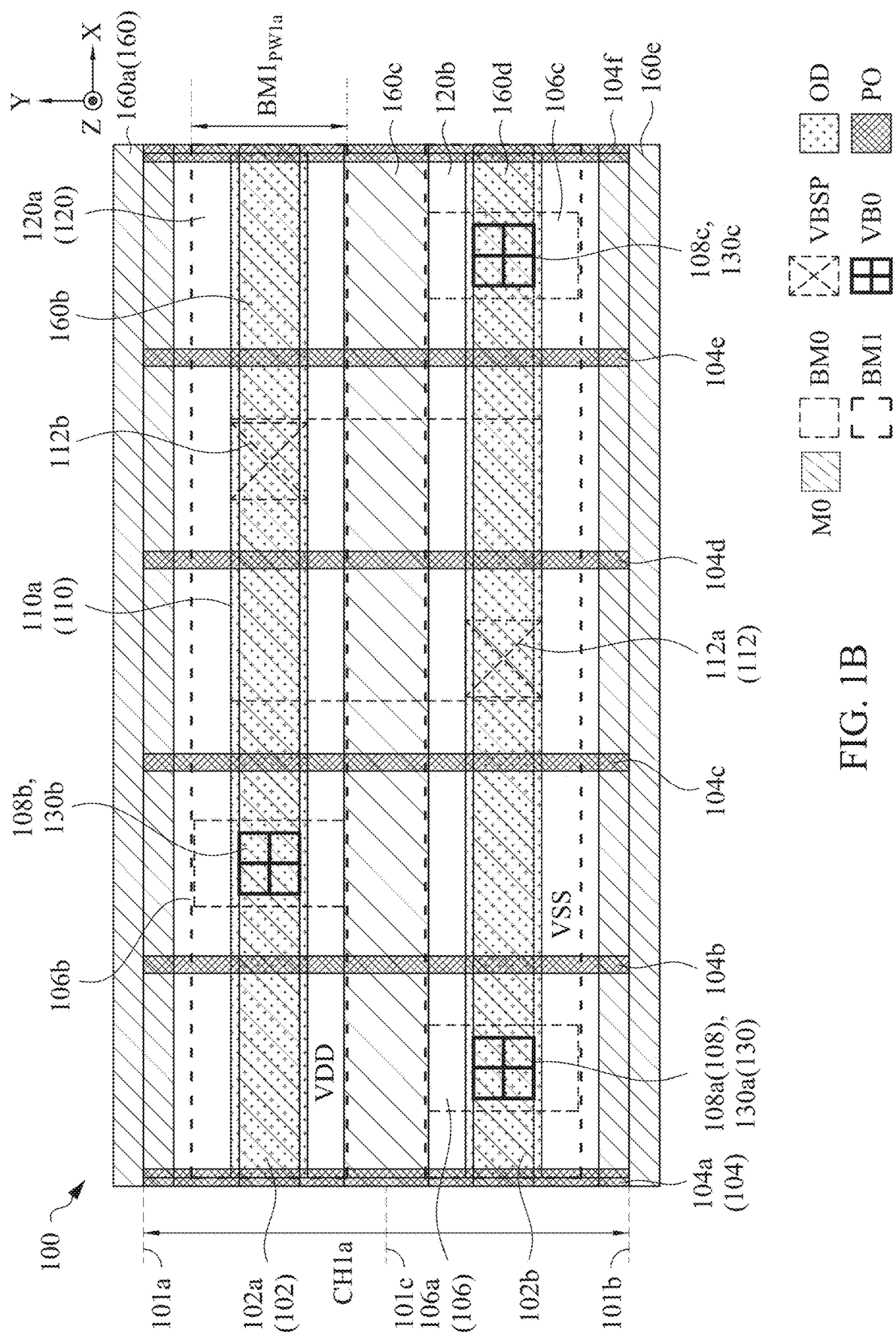

FIGS. 1A-1B are diagrams of a layout design 100 of an integrated circuit, in accordance with some embodiments. Layout design 100 is a layout diagram of integrated circuit 200 of FIGS. 2A-2C.

FIG. 1A is a diagram of a corresponding portion 100A of layout design 100 of FIG. 1B, simplified for ease of illustration. FIG. 1B is a diagram of layout design 100 and includes portion 100A, simplified for ease of illustration.

For ease of illustration, some of the labeled elements of one or more of FIGS. 1A-1B, 2A-2C, 3A-3E, 4A-4B, 5A-5E, 6A-6B, 7A-7C, 8A-8B, 9, 10A-10C, 11, 12A-12C, 13, 14A-14C, 15, 16A-16C and 18A-18F are not labelled in one or more of FIGS. 1A-1B, 2A-2C, 3A-3E, 4A-4B, 5A-5E, 6A-6B, 7A-7C, 8A-8B, 9, 10A-10C, 11, 12A-12C, 13, 14A-14C, 15, 16A-16C and 18A-18F. In some embodiments, layout design 100 includes additional elements not shown in FIGS. 1A-1B.

Portion 100A includes one or more features of layout design 100 of FIG. 1B of the oxide diffusion (OD) level or the active level, the gate (POLY) level, the backside metal 0 (BM0) level, the backside metal 1 (BM1) level, the via backside 0 (VB0) level and the via backside signal/power (VBS/P) level of layout design 100.

Layout design 100 includes one or more features of the OD level, the POLY level, the BM0 level, the BM1 level, the VB0 level, the VBS/P level and the metal 0 (M0) level of layout design 100.

Figure 2A:
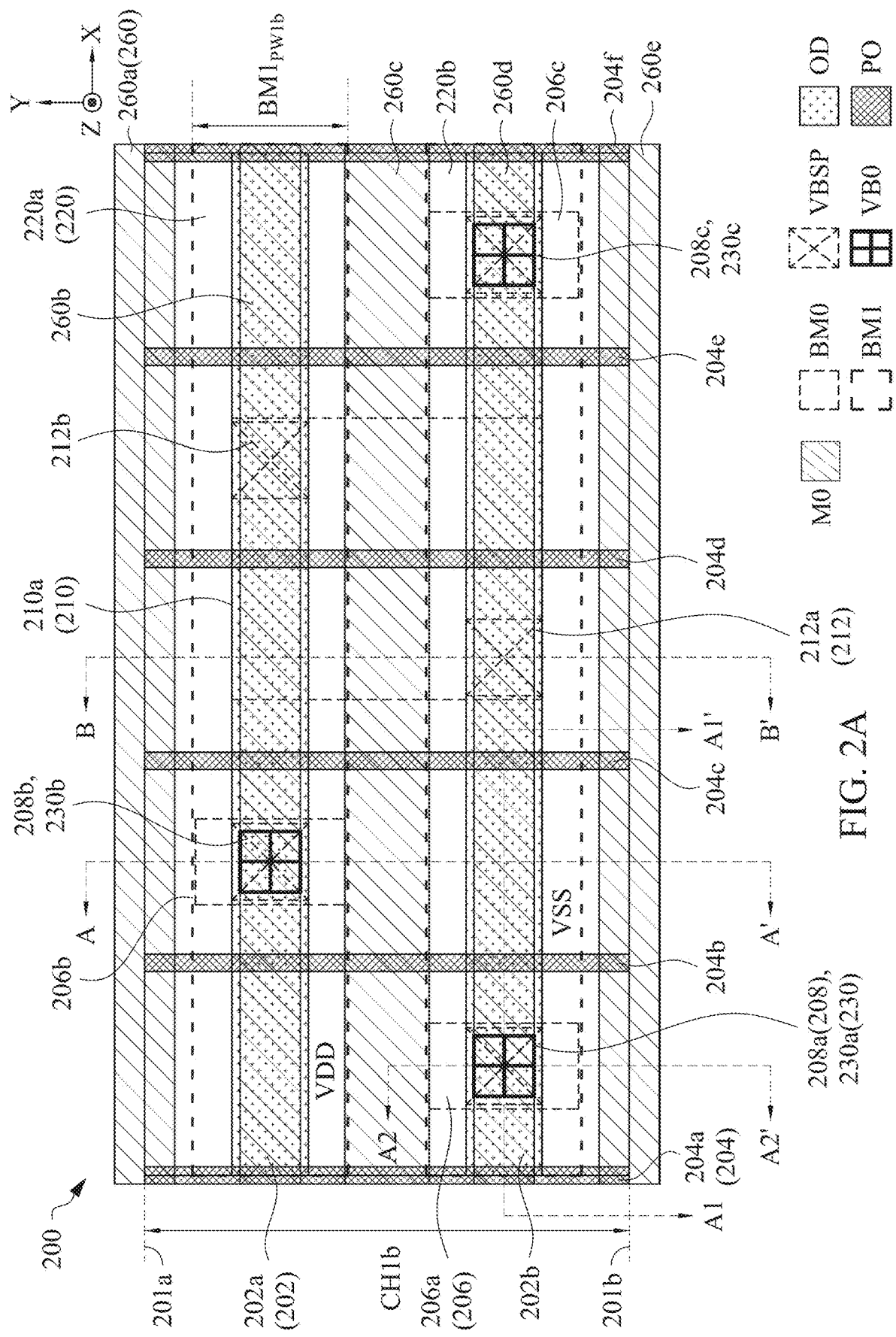
FIGS. 2A-2C are diagrams of an integrated circuit, in accordance with some embodiments.
Figure 2B:
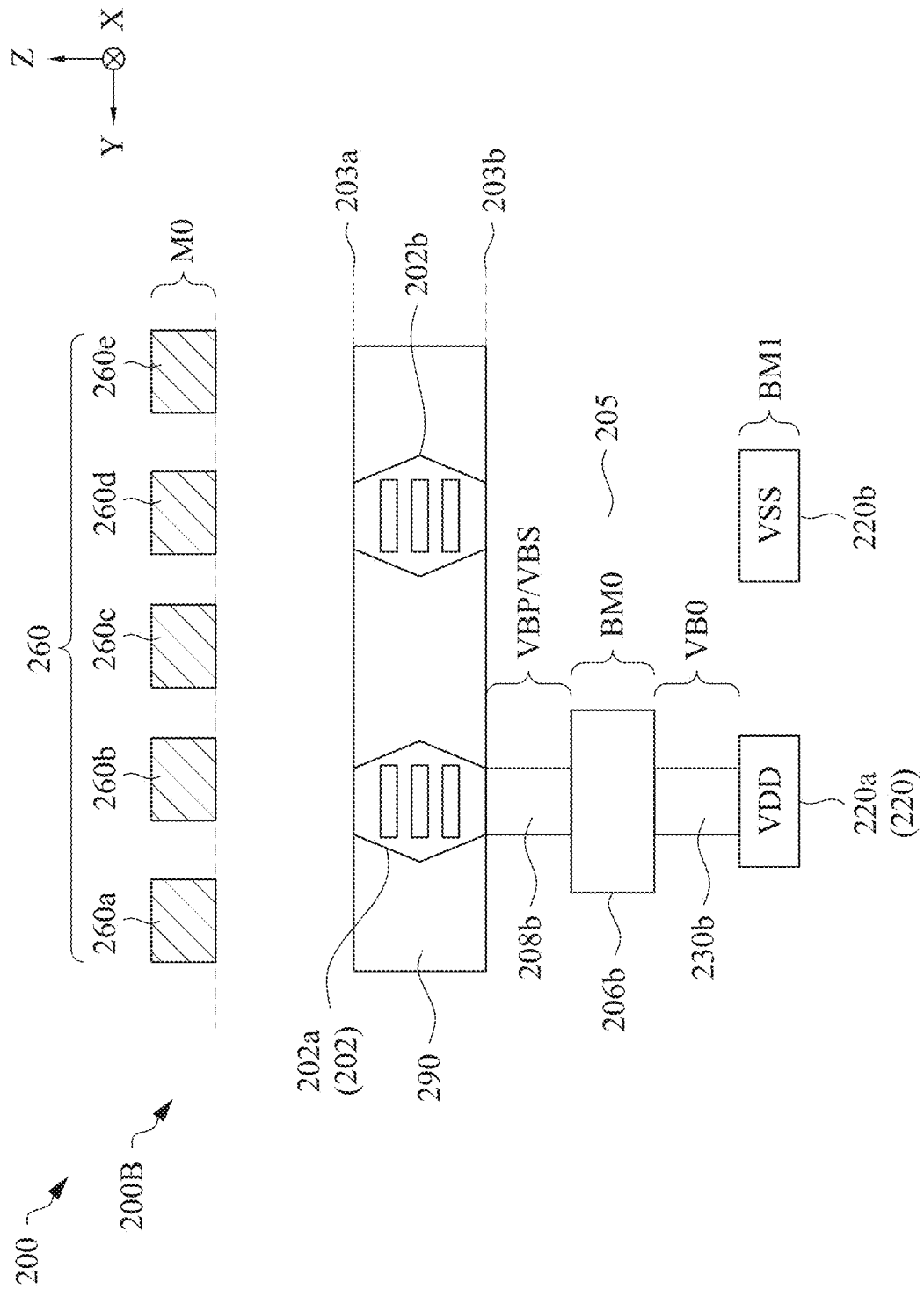
Figure 2C:
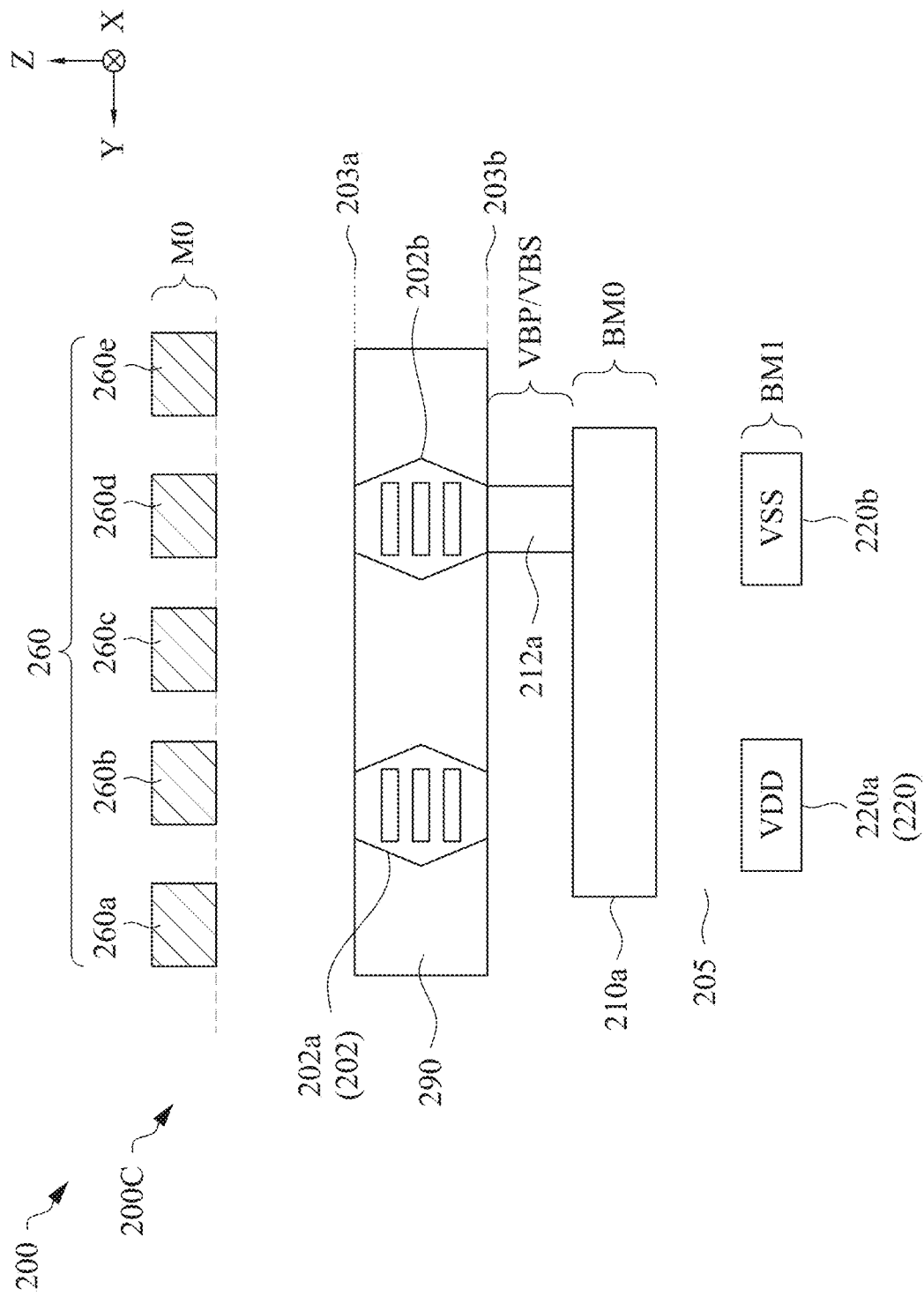

Layout design 100 is usable to manufacture integrated circuit 200 of FIGS. 2A-2C.

Layout design 100 has a cell boundary 101a, a cell boundary 101b and a mid-point 101c that extend in a first direction X. Mid-point 101c is equidistant from cell boundary 101a and a cell boundary 101b. Layout design 100 has a height CH1a in a second direction Y from cell boundary 101b to cell boundary 101a. In some embodiments, the second direction Y is different from the first direction X. In some embodiments, layout design 100 abuts other cell layout designs (not shown) along cell boundaries 101a and 101b, and along cell boundaries (not labelled) that extend in the second direction Y. In some embodiments, layout design 100 is a single height standard cell.

In some embodiments, at least layout design 100, 400 (FIGS. 4A-4B) or 600 (FIGS. 6A-6B) is a standard cell layout design. In some embodiments, one or more of layout design 100, 400 (FIGS. 4A-4B) or 600 (FIGS. 6A-6B) is a layout design of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of layout design 100, 400 (FIGS. 4A-4B) or 600 (FIGS. 6A-6B) is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of layout design 100, 400 (FIGS. 4A-4B) or 600 (FIGS. 6A-6B) includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like, FinFETs, nanosheet transistors, nanowire transistors, complementary FETs (CFETs) and planar MOS transistors with raised source/drain. Examples of passive elements include, but are not limited to, capacitors, inductors, fuses, and resistors.

Layout design 100 includes one or more active region layout patterns 102a or 102b (collectively referred to as a "set of active region patterns 102") extending in the first direction X.

Embodiments of the present disclosure use the term "layout pattern" which is hereinafter also referred to as "patterns" in the remainder of the present disclosure for brevity.

Active region patterns 102a, 102b of the set of active region patterns 102 are separated from one another in the second direction Y. The set of active region patterns 102 is usable to manufacture a corresponding set of active regions 202 or 1602 of integrated circuit 200, 300A-300F, 500, 700, 800, 1000, 1200, 1400, 1600 or 1800 (FIGS. 2A-2C, 3A-3F, 5A-5E, 7A-7C, 8A-8B, 10A-10C, 12A-12C, 14A-14C, 16A-16C or 18A-18F).

In some embodiments, the set of active regions 202 are located on the front-side 203a of integrated circuit 200, 300A-300F, 500, 700, 800, 1000, 1200, 1400, 1600 or 1800. In some embodiments, active region patterns 102a, 102b of the set of active region patterns 102 are usable to manufacture corresponding active regions 202a, 202b of the set of active regions 202 of integrated circuit 200, 300A-300F, 500, 700, 800, 1000, 1200, 1400, 1600 or 1800.

Figure 6A:
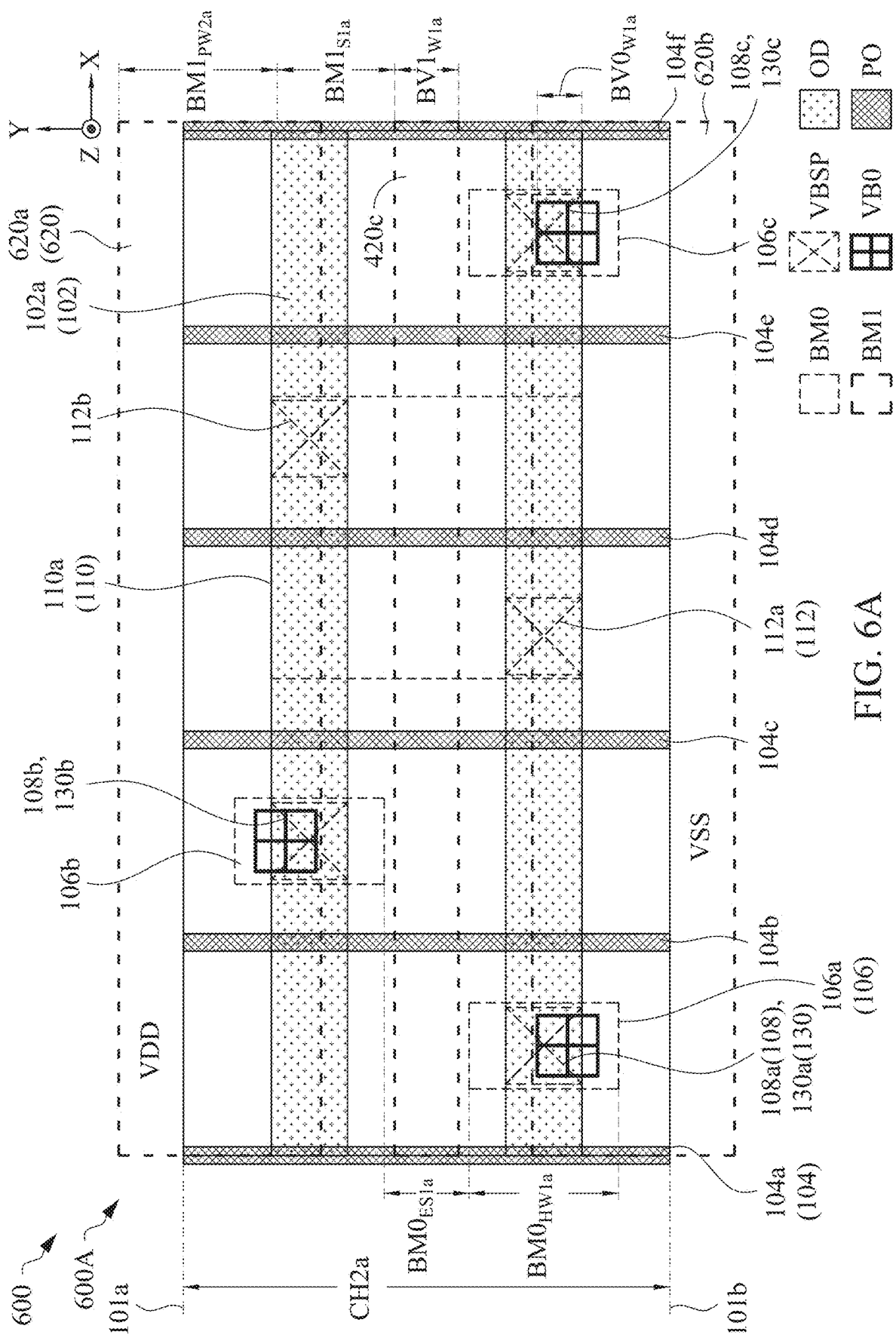
FIGS. 6A-6B are diagrams of a layout design of an integrated circuit, in accordance with some embodiments.
Figure 6B:
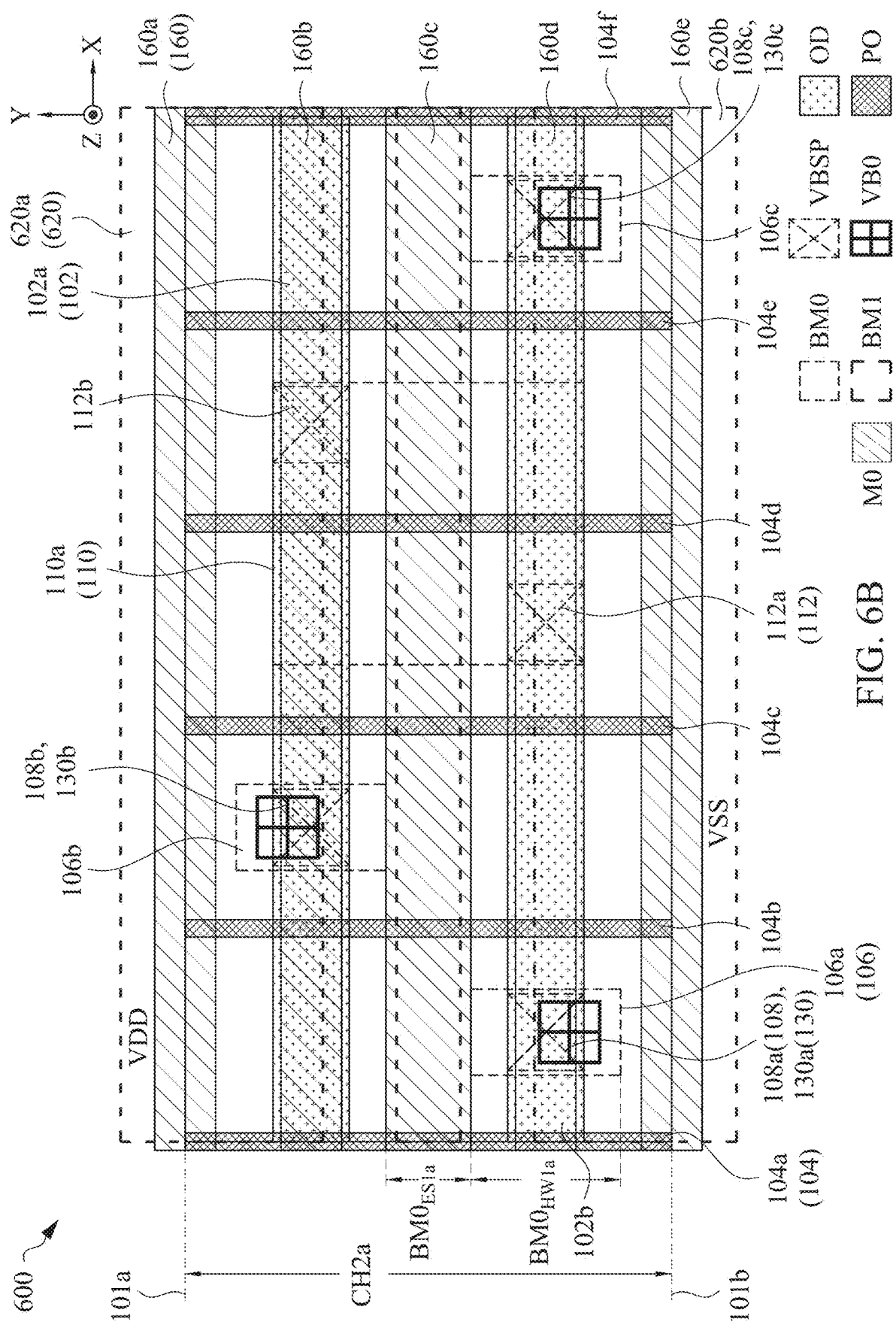

In some embodiments, the set of active region patterns 102 is referred to as an oxide diffusion (OD) region which defines the source or drain diffusion regions of at least integrated circuit 200, 300A-300F, 500, 700, 800, 1000, 1200, 1400, 1600 or 1800 or layout design 100, 400 (FIGS. 4A-4B) or 600 (FIGS. 6A-6B).

In some embodiments, active region pattern 102a of the set of active region patterns 102 is usable to manufacture source and drain regions of n-type metal oxide semiconductor (NMOS) transistors of integrated circuits 200, 300A-300F, 500, 700, 800, 1000, 1200, 1400, 1600 or 1800, and active region pattern 102b of the set of active region patterns 102 is usable to manufacture source and drain regions of p-type metal oxide semiconductor (PMOS) transistors of integrated circuits 200, 300A-300F, 500, 700, 800, 1000, 1200, 1400, 1600 or 1800.

In some embodiments, active region pattern 102a of the set of active region patterns 102 is usable to manufacture source and drain regions of PMOS transistors of integrated circuits 200, 300A-300F, 500, 700, 800, 1000, 1200, 1400, 1600 or 1800, and active region pattern 102b of the set of active region patterns 102 is usable to manufacture source and drain regions of NMOS transistors of integrated circuits 200, 300A-300F, 500, 700, 800, 1000, 1200, 1400, 1600 or 1800.

In some embodiments, the set of active region patterns 102 is located on a first layout level. In some embodiments, the first layout level corresponds to an active level or an OD level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the OD level is above the BM1 level and the BM0 level.

In some embodiments, active region pattern 102a is usable to manufacture source and drain regions of one or more n-type finFET transistors, n-type nanosheet transistors or n-type nanowire transistors, and active region layout pattern 102b is usable to manufacture source and drain regions of one or more p-type finFET transistors, p-type nanosheet transistors or p-type nanowire transistors.

In some embodiments, active region pattern 102a is usable to manufacture source and drain regions of one or more p-type finFET transistors, p-type nanosheet transistors or p-type nanowire transistors, and active region layout pattern 102b is usable to manufacture source and drain regions of one or more n-type finFET transistors, n-type nanosheet transistors or n-type nanowire transistors.

Other widths for the set of active region patterns 102 or other numbers of active region patterns in the set of active region patterns 102 are within the scope of the present disclosure.

Other configurations, arrangements on other layout levels or quantities of patterns in the set of active region patterns 102 are within the scope of the present disclosure.

Layout design 100 further includes one or more gate patterns 104a, 104b, 104c, 104d, 104e or 104f (collectively referred to as a "set of gate patterns 104") extending in the second direction Y. Each of the gate patterns of the set of gate patterns 104 is separated from an adjacent gate pattern of the set of gate patterns 104 in the first direction X by a first pitch (not shown).

The set of gate patterns 104 is usable to manufacture a corresponding set of gates 204 of integrated circuit 200, 300A-300F, 500, 700, 800, 1000, 1200, 1400, 1600 or 1800 (FIGS. 2A-2C, 3A-3F, 5A-5E, 7A-7C, 8A-8B, 10A-10C, 12A-12C, 14A-14C, 16A-16C or 18A-18F).

In some embodiments, gate patterns 104a, 104b, 104c, 104d, 104e, 104f of the set of gate patterns 104 is usable to manufacture corresponding gates 204a, 204b, 204c, 204d, 204e, 204f of the set of gates 204 of integrated circuit 200, 300A-300F, 500, 700, 800, 1000, 1200, 1400, 1600 or 1800 (FIGS. 2A-2C, 3A-3F, 5A-5E, 7A-7C, 8A-8B, 10A-10C, 12A-12C, 14A-14C, 16A-16C or 18A-18F).

In some embodiments, at least a portion of gate pattern 104a, 104b, 104c, 104d, 104e or 104f of the set of gate patterns 104 is usable to manufacture gates of NMOS transistors of integrated circuits 1000, 1200, 1400 or 1600 and integrated circuit 1800, and at least a portion of gate pattern 104a, 104b, 104c, 104d, 104e or 104f of the set of gate patterns 104 is usable to manufacture gates of PMOS transistors of integrated circuits 1000, 1200, 1400 or 1600 and integrated circuit 1800.

The set of gate patterns 104 are above the set of active region patterns 102, a set of conductive feature patterns 106, a set of conductive feature patterns 110 and a set of conductive feature patterns 120. The set of gate patterns 104 is positioned on a second layout level different from the first layout level. In some embodiments, the second layout level is different from the first layout level. In some embodiments, the second layout level corresponds to the POLY level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the POLY level is above the OD level, the BM1 level and the BM0 level.

Other configurations, arrangements on other layout levels or quantities of patterns in the set of gate patterns 104 are within the scope of the present disclosure.

Layout design 100 further includes one or more conductive feature patterns 106a, 106b or 106c (collectively referred to as a "set of conductive feature patterns 106") extending in the second direction Y, and being located on a third layout level. In some embodiments, the third layout level is different from the first layout level and the second layout level.

In some embodiments, the third layout level corresponds to a backside metal 0 (BM0) level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the BM0 level is above the BM1 level, and below the POLY level and the OD level.

The set of conductive feature patterns 106 is usable to manufacture a corresponding set of conductors 206 of integrated circuit 200 (FIGS. 2A-2C) or integrated circuit 300A-300F, 500, 700, 800, 1000, 1200, 1400, 1600 or 1800 (FIGS. 3A-3F, 5A-5E, 7A-7C, 8A-8B, 10A-10C, 12A-12C, 14A-14C, 16A-16C or 18A-18F).

In some embodiments, conductive feature pattern 106a, 106b or 106c is usable to manufacture corresponding conductor 206a, 206b or 206c of the set of conductors 206 (FIGS. 2A-2C) of integrated circuit 200. In some embodiments, the set of conductors 206 are located on the back-side 203b of integrated circuit 200. The set of conductive feature patterns 106 is overlapped by the set of gate patterns 104 and the set of active region patterns 102.

Each of conductive feature patterns 106a, 106b and 106c of the set of conductive feature patterns 106 are separated from each other in the first direction X.

In some embodiments, at least conductive feature pattern 106a, 106b or 106c of the set of conductive feature patterns 106 has a length (not labelled) in the second direction Y that is greater than a width in the second direction Y of the set of active region patterns 102. In some embodiments, at least conductive feature pattern 106a, 106b or 106c of the set of conductive feature patterns 106 has a length (not labelled) in the second direction Y that is the same as a width in the second direction Y of the set of active region patterns 102.

Other lengths or widths for the set of conductive feature patterns 106 or other numbers of conductive feature patterns in the set of conductive feature patterns 106 are within the scope of the present disclosure. In some embodiments, at least one of conductive feature pattern 106a, 106b or 106c has a width different from another of conductive feature pattern 106a, 106b or 106c.

Other configurations, arrangements on other layout levels or quantities of patterns in the set of conductive feature patterns 106 are within the scope of the present disclosure.

Layout design 100 further includes at least conductive feature pattern 110a (collectively referred to as a "set of conductive feature patterns 110") extending in at least the first direction or the second direction Y, and being located on the third layout level.

The set of conductive feature patterns 110 is usable to manufacture a corresponding set of conductors 210 of integrated circuit 200 (FIGS. 2A-2C) or integrated circuit 300A-300F, 500, 700, 800, 1000, 1200, 1400, 1600 or 1800 (FIGS. 3A-3F, 5A-5E, 7A-7C, 8A-8B, 10A-10C, 12A-12C, 14A-14C, 16A-16C or 18A-18F).

In some embodiments, conductive feature pattern 110a is usable to manufacture corresponding conductor 210a of the set of conductors 210 (FIGS. 2A-2C) of integrated circuit 200. In some embodiments, the set of conductors 210 are located on the back-side 203b of integrated circuit 200. The set of conductive feature patterns 110 is overlapped by the set of gate patterns 104 and the set of active region patterns 102.

In some embodiments, at least the set of conductive feature patterns 110 has a width (not labelled) in the first direction X or a length in the second direction Y that is greater than a length (in the second direction Y) or a width (in the first direction X) of the set of conductive feature patterns 106.

Other widths for the set of conductive feature patterns 110 or other numbers of conductive feature patterns in the set of conductive feature patterns 110 are within the scope of the present disclosure.

Other configurations, arrangements on other layout levels or quantities of patterns in the set of conductive feature patterns 110 are within the scope of the present disclosure.

Layout design 100 further includes one or more via patterns 108a, 108b or 108c (collectively referred to as a "set of via patterns 108") or one or more via patterns 112a or 112b (collectively referred to as a "set of via patterns 112").

The set of via patterns 108 is usable to manufacture a corresponding set of vias 208 (FIGS. 2A-2C). In some embodiments, via patterns 108a, 108b or 108c of the set of via patterns 108 are usable to manufacture corresponding vias 208a, 208b or 208c of the set of vias 208 (FIGS. 2A-2C).

The set of via patterns 112 is usable to manufacture a corresponding set of vias 212 (FIGS. 2A-2C). In some embodiments, via patterns 112a or 112b of the set of via patterns 112 are usable to manufacture corresponding vias 212a or 212b of the set of vias 212 (FIGS. 2A-2C).

In some embodiments, the set of via patterns 108 are between the set of active region patterns 102 and the set of conductive feature patterns 106.

In some embodiments, the set of via patterns 112 are between the set of active region patterns 102 and the set of conductive feature patterns 110.

At least the set of via patterns 108 or the set of via patterns 112 is positioned at a via backside signal/power (VBS/P) level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the VB0 level is between the BM0 level and the OD level. In some embodiments, the VB0 level is between the first layout level and the third layout level. Other layout levels are within the scope of the present disclosure.

At least via pattern 108a or 108c is between active region pattern 102b and corresponding conductive feature pattern 106a or 106c. Via pattern 108b is between active region pattern 102a and conductive feature pattern 106b. In some embodiments, each via pattern of the set of via patterns 108 is positioned where a corresponding source or drain region of an NMOS or PMOS transistor manufactured by layout design 100 is positioned.

Via pattern 112a is between active region pattern 102b and conductive feature pattern 110a. Via pattern 112b is between active region pattern 102a and conductive feature pattern 110a. In some embodiments, each via pattern of the set of via patterns 108 is positioned where a corresponding source or drain region of an NMOS or PMOS transistor manufactured by layout design 100 is positioned.

In some embodiments, at least via pattern 108a, 108c or 112a is overlapped by active region pattern 102b. In some embodiments, at least via pattern 108b or 112b is overlapped by active region pattern 102b.

In some embodiments, each via pattern of the set of via patterns 108 is separated from an adjacent via pattern of the set of via patterns 108 in the first direction X by a pitch (not labelled). In some embodiments, each via pattern of the set of via patterns 112 is separated from an adjacent via pattern of the set of via patterns 112 in the first direction X by pitch (not labelled).

Other configurations, arrangements on other layout levels or quantities of patterns in at least set of via patterns 108 or 112 are within the scope of the present disclosure.

Layout design 100 includes one or more conductive feature layout patterns 120a or 120b (collectively referred to as a "set of conductive feature patterns 120") extending in the first direction X, and being located on a fourth layout level. In some embodiments, the fourth layout level is different from the first layout level, second layout level and the third layout level.

In some embodiments, the fourth layout level corresponds to a backside metal 1 (BM1) level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the BM1 level is below the BM0 level, the POLY level and the OD level.

In some embodiments, the set of conductive feature patterns 120 are referred to as a "set of power rail patterns 120." In some embodiments, conductive feature pattern 120a or 120b are referred to as corresponding power rail pattern 120a or 120b.

The set of conductive feature patterns 120 is usable to manufacture a corresponding set of conductive features 220 of integrated circuit 200 (FIGS. 2A-2C). In some embodiments, the set of conductive features 220 are located on the back-side 203b of integrated circuit 200. In some embodiments, conductive feature patterns 120a, 120b of the set of conductive feature patterns 120 are usable to manufacture corresponding conductive features 220a, 220b of the set of conductive features 220 (FIGS. 2A-2C) of integrated circuit 200.

Conductive feature patterns 120a and 120b of the set of conductive feature patterns 120 are separated from each another in the second direction Y.

In some embodiments, when viewed from the bottom/backside (e.g., in the positive Z-direction) of layout design 100, conductive feature patterns 120a and 120b of the set of conductive feature patterns 120 overlap corresponding active region patterns 102a and 102b of layout design 100, and are thus referred to as an "inbound power rail" design.

In some embodiments, a center of conductive feature patterns 120a and 120b in the first direction X is aligned with a corresponding center in the first direction X of corresponding active region patterns 102a and 102b in the first direction X.

At least conductive feature pattern 120a or 120b has a width $BM1_{PW1a}$ in the second direction Y. In some embodiments, width $BM1_{PW1a}$ is the same as a width (not labelled) in the second direction Y of the set of conductive feature patterns 106. In some embodiments, width $BM1_{PW1a}$ is different from a width (not labelled) in the second direction Y of the set of conductive feature patterns 106.

Other widths for the set of conductive feature patterns 120 or other numbers of conductive feature patterns in the set of conductive feature patterns 120 are within the scope of the present disclosure. In some embodiments, at least conductive feature pattern 120a has a width different from conductive feature pattern 120b.

Other configurations, arrangements on other layout levels or quantities of patterns in the set of conductive feature patterns 120 are within the scope of the present disclosure.

Layout design 100 further includes one or more via patterns 130a, 130b or 130c (collectively referred to as a "set of via patterns 130").

The set of via patterns 130 is usable to manufacture a corresponding set of vias 230 (FIGS. 2A-2C). In some embodiments, via patterns 130a, 130b or 130c of the set of via patterns 130 are usable to manufacture corresponding vias 230a, 230b or 230c of the set of vias 230 (FIGS. 2A-2C).

At least the set of via patterns 130 is positioned at a via backside metal 0 (VB0) level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the VB0 level is between the BM0 level and the BM1 level. In some embodiments, the VB0 level is between the third layout level and the fourth layout level. Other layout levels are within the scope of the present disclosure.

In some embodiments, the set of via patterns 130 are between the set of conductive feature patterns 106 and the set of conductive feature patterns 120. In some embodiments, at least via pattern 130a, 130b or 130c is overlapped by corresponding conductive feature pattern 106a, 106b or 106c.

At least via pattern 130a or 130c is between corresponding conductive feature pattern 106a or 106c and conductive feature pattern 120b. Via pattern 130b is between conductive feature pattern 106b and conductive feature pattern 120a. In some embodiments, each via pattern of the set of via patterns 130 is positioned where a corresponding source or drain region of an NMOS or PMOS transistor manufactured by layout design 100 is positioned.

In some embodiments, each via pattern of the set of via patterns 130 is separated from an adjacent via pattern of the set of via patterns 130 in the first direction X by a pitch (not labelled).

Other configurations, arrangements on other layout levels or quantities of patterns in at least set of via patterns 130 are within the scope of the present disclosure.

Layout design 100 further includes one or more conductive feature patterns 160a, 160b, 160c, 160d or 160e (collectively referred to as a "set of conductive feature patterns 160") extending in the first direction X, and being located on a fifth layout level. In some embodiments, the fifth layout level is different from the first layout level, the second layout level, the third layout level and the fourth layout level. In some embodiments, the fifth layout level corresponds to a metal 0 (M0) level of one or more of layout designs 100, 400 or 600 (FIGS. 1A-1B, 4A-4B or 6A-6B) or integrated circuits 200, 300A-300F, 500, 700, 800, 1000, 1200, 1400, 1600 or 1800. In some embodiments, the M0 level is above the OD level, the POLY level, the MD level, the VG level, the VD level, the BM1 level and the BM0 level.

The set of conductive feature patterns 160 is usable to manufacture a corresponding set of conductive structures 260 (FIGS. 2A-2C) of integrated circuit 200. Conductive feature patterns 160a, 160b, 160c, 160d, 160e are usable to manufacture corresponding conductive structures 260a, 260b, 260c, 260d, 260e (FIGS. 2A-2B, 5A-5C, 7A-7C, 10A, 12A, 14A and 16A).

While each of conductive feature patterns 160a, 160b, 160c, 160d or 160e are shown as one continuous pattern, in some embodiments, one or more of conductive feature patterns 160a, 160b, 160c, 160d or 160e are divided into one or more discontinuous patterns.

The set of conductive feature patterns 160 overlaps at least the set of gate patterns 104, the set of active region patterns 102, the set of conductive feature patterns 106, the set of conductive feature patterns 110 or the set of conductive feature patterns 120. In some embodiments, the set of conductive feature patterns 160 overlaps other underlying patterns (not shown for ease of illustration) of other layout levels of layout design 100. For example, layout design does not show via patterns (e.g., via over diffusion (VD) or via over gate (VG)) located between the set of conductive feature patterns 160 and a set of contact patterns (not labelled) for ease of illustration, but VD, VG and MD are shown in FIGS. 10A-10B, 12A-12B, 14A-14B and 16A-16B.

At least pattern 160a, 160b, 160c, 160d or 160e of the set of conductive feature patterns 160 has a width (not labelled) in the second direction Y. Other widths for the set of conductive feature patterns 160 are within the scope of the present disclosure. In some embodiments, at least one conductive feature pattern of the set of conductive feature patterns 160 has a width in the second direction Y different from another width of at least another conductive feature pattern of the set of conductive feature patterns 160.

In some embodiments, conductive feature patterns 160a, 160b, 160c, 160d, 160e of the set of conductive feature patterns 160 correspond to 5 M0 routing tracks in layout design 100. Other numbers of M0 routing tracks are within the scope of the present disclosure.

Other configurations, arrangements on other layout levels or quantities of patterns in the set of conductive feature patterns 160 are within the scope of the present disclosure.

FIGS. 2A-2C are diagrams of an integrated circuit 200, in accordance with some embodiments.

FIG. 2A is a top view of integrated circuit 200, in accordance with some embodiments. FIG. 2B is a diagram of a corresponding portion 200B of integrated circuit 200 of FIG. 2A, simplified for ease of illustration. FIG. 2A is a diagram of integrated circuit 200 and includes portion 200B, simplified for ease of illustration.

FIGS. 2B-2C are corresponding cross-sectional views of integrated circuit 200, in accordance with some embodiments. FIG. 2B is a cross-sectional view of integrated circuit 200 as intersected by plane A-A', in accordance with some embodiments. FIG. 2C is a cross-sectional view of integrated circuit 200 as intersected by plane B-B', in accordance with some embodiments. Components that are the same or similar to those in one or more of FIGS. 2A-2C, 3A-3E, 4A-4B, 5A-5E, 6A-6B, 7A-7C, 8A-8B, 9, 10A-10C, 11, 12A-12C, 13, 14A-14C, 15, 16A-16C, and 18A-18F (shown below) are given the same reference numbers, and detailed description thereof is thus omitted.

Integrated circuit 200 is manufactured by layout design 100. Structural relationships including alignment, lengths and widths, as well as configurations and layers of integrated circuit 200 are similar to the structural relationships and configurations and layers of layout design 100 of FIGS. 1A-1B, and similar detailed description will not be described in at least FIGS. 2A-2C, for brevity. For example, in some embodiments, at least width $BM1_{PW1a}$ or cell height $CH1a$ of layout design 100 is similar to corresponding width $BM1_{PW1b}$ or cell height $CH1b$ of integrated circuit 200, and similar detailed description is omitted for brevity. For example, in some embodiments, at least one or more widths, lengths or pitches of layout design 100 is similar to corresponding widths, lengths or pitches of integrated circuit 200, and similar detailed description is omitted for brevity. For example, in some embodiments, at least cell boundary 101a or 101b or mid-point 101c of layout design 100 is similar to at least corresponding cell boundary 201a or 201b or mid-point 201c of integrated circuit 200, and similar detailed description is omitted for brevity.

Integrated circuit 200 includes at least the set of active regions 202, the set of gates 204, an insulating region 205, the set of conductors 206, the set of conductors 210, the set of vias 208, the set of vias 212, the set of conductors 220 (also referred to as a set of power rails 220), the set of vias 230, and a set of conductors 260.

The set of active regions 202 include one or more of active regions 202a or 202b embedded in a substrate 290.

Substrate has a front-side 203a and a back-side 203b opposite from the front-side 203a. In some embodiments, at least the set of active regions 202, the set of gates 204 or the set of conductors 260 are formed in the front-side 203a of substrate 290.

In some embodiments, the set of active regions 202 corresponds to nanosheet structures (not labelled) of nanosheet transistors. In some embodiments, the set of active regions 202 include drain regions and source regions grown by an epitaxial growth process. In some embodiments, the set of active regions 202 include drain regions and source regions that are grown with an epitaxial material at the corresponding drain regions and source regions.

Other transistor types are within the scope of the present disclosure. For example, in some embodiments, the set of active regions 202 corresponds to nanowire structures (not shown) of nanowire transistors. In some embodiments, the set of active regions 202 corresponds to planar structures (not shown) of planar transistors. In some embodiments, the set of active regions 202 corresponds to fin structures (not shown) of finFETs.

In some embodiments, active region 202a corresponds to source and drain regions of NMOS transistors of integrated circuit 200, 300A-300F, 500, 700, 800, 1000, 1200, 1400, 1600 or 1800, and active region 202b corresponds to source and drain regions of PMOS transistors of integrated circuit 200, 300A-300F, 500, 700, 800, 1000, 1200, 1400, 1600 or 1800.

In some embodiments, active region 202a corresponds to source and drain regions of PMOS transistors of integrated circuit 200, 300A-300F, 500, 700, 800, 1000, 1200, 1400, 1600 or 1800, and active region 202b corresponds to source and drain regions of NMOS transistors of integrated circuit 200, 300A-300F, 500, 700, 800, 1000, 1200, 1400, 1600 or 1800.

In some embodiments, at least active region 202a is an N-type doped S/D region, and active region 202b is a P-type doped S/D region embedded in a dielectric material of substrate 290. In some embodiments, at least active region 202a is a P-type doped S/D region, and active region 202b is an N-type doped S/D region embedded in a dielectric material of substrate 290.

Other configurations, arrangements on other layout levels or quantities of structures in the set of active regions 202 are within the scope of the present disclosure.

The set of gates 204 include one or more of gates 204a, 204b, 204c, 204d, 204e or 204f. In some embodiments, at least a portion of gate 204a, 204b, 204c, 204d, 204e or 204f is a gate of NMOS transistors of integrated circuits 1000, 1200, 1400 or 1600 and integrated circuit 1800, and at least a portion of gate 204a, 204b, 204c, 204d, 204e or 204f is a gate of PMOS transistors of integrated circuits 1000, 1200, 1400 or 1600 and integrated circuit 1800.

In some embodiments, at least gate 204a or 204b corresponds to a dummy gate. In some embodiments, a dummy gate is a gate of a non-functional transistor. In some embodiments, at least gate 204a or 204b corresponds to a continuous poly on OD edge (CPODE) region or a poly on OD edge (PODE) region.

Other configurations, arrangements on other layout levels or quantities of gates in the set of gates 204 are within the scope of the present disclosure.

Figure 17A:
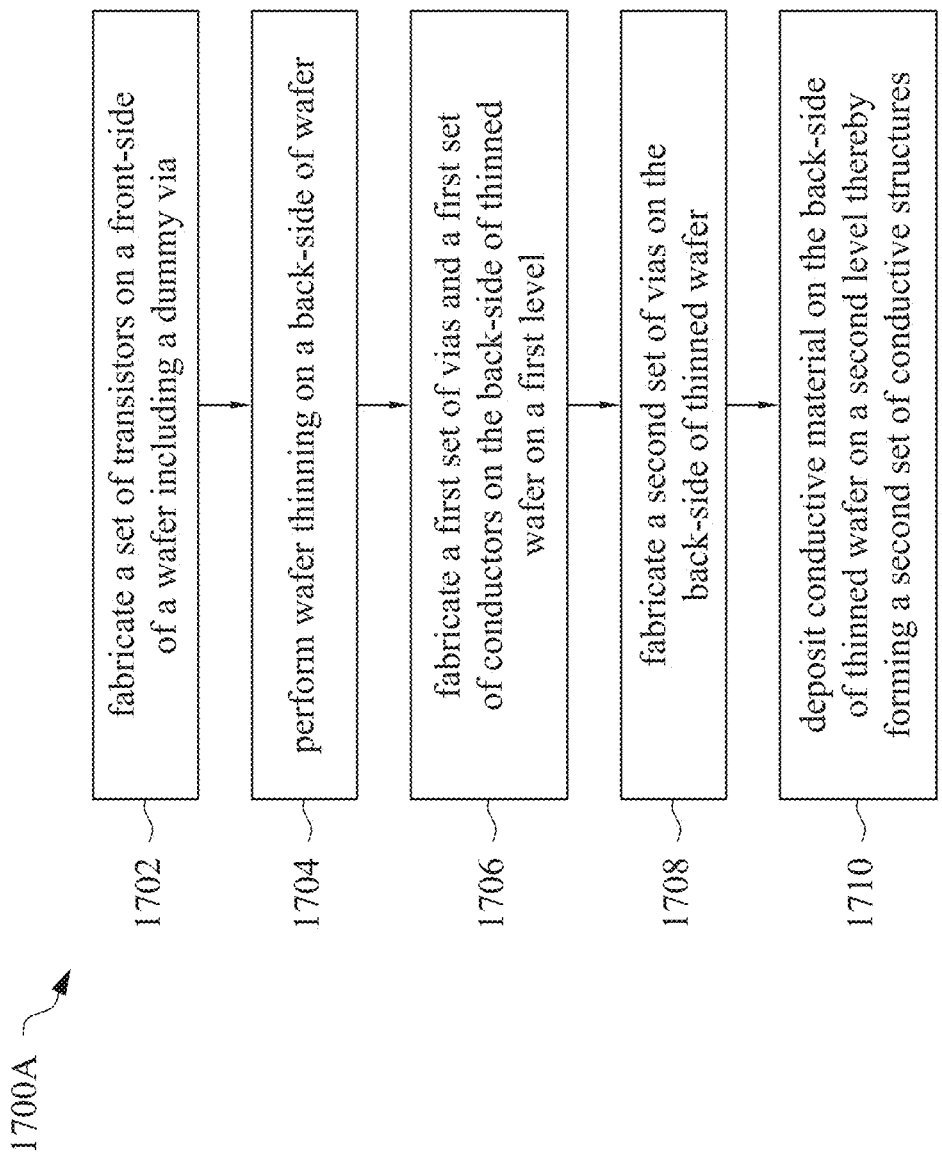
FIG. 17A is a flow chart of a method of forming or manufacturing an integrated circuit in accordance with some embodiments.
Figure 17B:
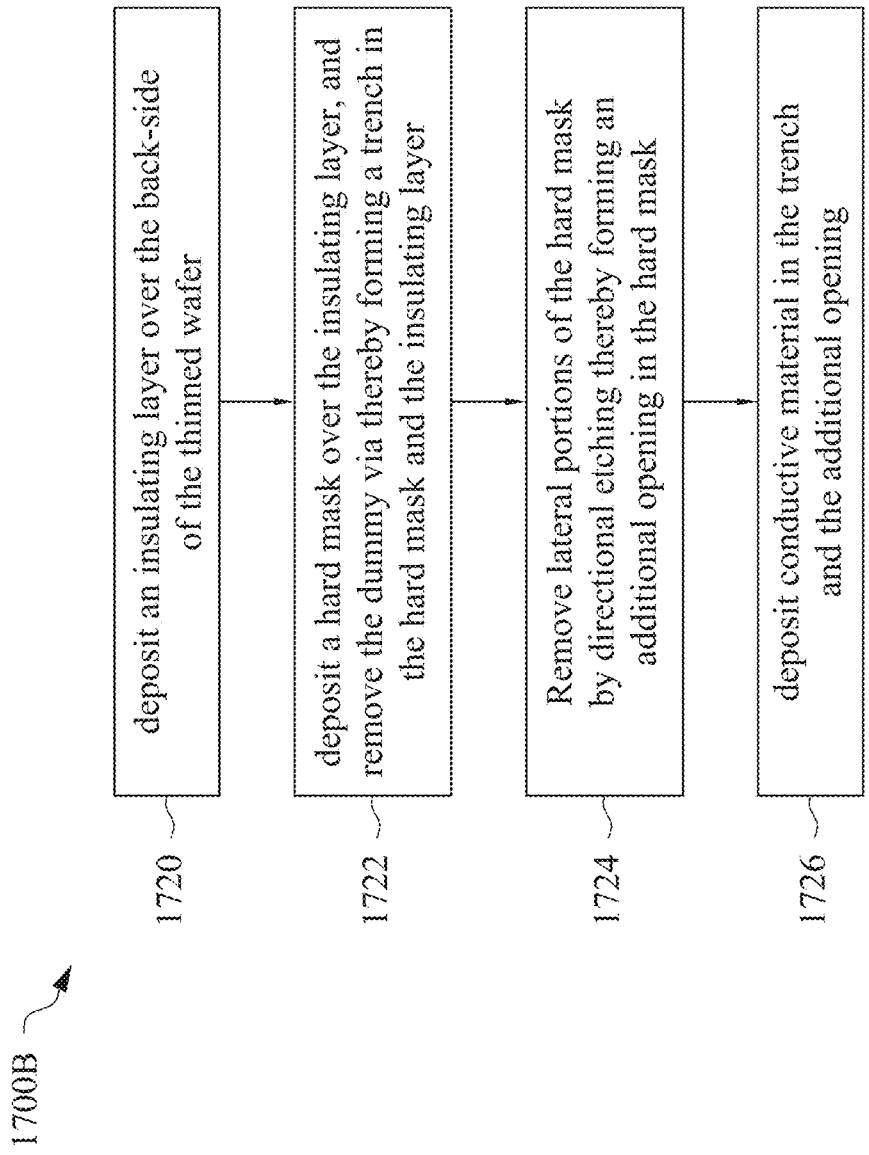
FIG. 17B is a flow chart of a method of fabricating the backside routing tracks and backside via connectors, in accordance with some embodiments.

Insulating region 205 is configured to electrically isolate one or more elements of the set of active regions 202, the set of gates 204, the set of conductors 206, the set of conductors 210, the set of vias 208, the set of vias 212, the set of conductors 220, the set of vias 230, or the set of conductors 260 from one another. In some embodiments, insulating region 205 includes multiple insulating regions deposited at different times from each other during methods 1700A-1700B (FIGS. 17A-17B). In some embodiments, insulating region is a dielectric material. In some embodiments, the dielectric material includes silicon dioxide, silicon oxynitride, or the like.

Other configurations, arrangements on other layout levels or other numbers of portions in insulating region 205 are within the scope of the present disclosure.

The set of conductors 206 include one or more of conductor 206a, 206b or 206c. The set of conductors 206 are located on the back-side 203b of integrated circuit 200.

In some embodiments, when viewed from the top/front-side 203a (e.g., in the positive Z-direction) of integrated circuit 200, the set of conductors 206 is overlapped by the set of gates 204 and the set of active regions 202. In some embodiments, when viewed from the bottom/backside 203b (e.g., in the positive Z-direction) of integrated circuit 200, conductors 206a and 206c overlap active region 202b, and conductor 206b overlaps active region 202a.

Other lengths or widths for the set of conductors 206 are within the scope of the present disclosure. Other configurations, arrangements on other layout levels or quantities of conductors in the set of conductors 206 are within the scope of the present disclosure.

The set of vias 208 include one or more of vias 208a, 208b or 208c. In some embodiments, the set of vias 208 are between the set of active regions 202 and the set of conductors 206. The set of vias 208 is embedded in insulating region 205. The set of vias 208 is located where the set of active regions 202 overlap the set of conductors 206.

At least via 208a or 208c is configured to electrically couple active region 202b and corresponding conductor 206a or 206c together. Via 208b is configured to electrically couple active region 202a and conductor 206b together.

In some embodiments, the set of vias 208 are configured to electrically couple a corresponding source or drain region of the set of active regions 202 to the set of conductors 206.

Other configurations, arrangements on other layout levels or quantities of vias in the set of vias 208 are within the scope of the present disclosure.

The set of conductors 210 includes conductor 210a. The set of conductors 210 is embedded in insulating region 205. Other quantities of structures in the set of conductors 210 are within the scope of the present disclosure.

The set of conductors 210 is configured to provide routing of signals between lower layers. For example, in some embodiments, the set of conductors 210 are configured to provide signal routing between active regions of the set of active regions 202.

In some embodiments, conductor 210a is configured to electrically couple a drain or source of a PMOS or NMOS transistor and a drain or source of another PMOS or NMOS transistor together.

In some embodiments, the set of conductors 210 and the set of vias 212 are configured to electrically couple the set of active regions 202 of integrated circuit 200, resulting in additional routing resources compared to other approaches. In some embodiments, the set of conductors 210 is configured to electrically couple the set of gates 204 of integrated circuit 200, resulting in additional routing resources compared to other approaches. In some embodiments, the set of conductors 210 is configured to electrically couple the set of active regions 202 and the set of gates 204 to each other, resulting in additional routing resources compared to other approaches.

In some embodiments, the set of conductors 210 corresponds to a set of conductive structures. In some embodiments, when viewed from the top/front-side 203a (e.g., in the positive Z-direction) of integrated circuit 200, the set of conductors 210 is overlapped by the set of gates 204 and the set of active regions 202. In some embodiments, when viewed from the bottom/backside 203b (e.g., in the positive Z-direction) of integrated circuit 200, the set of conductors 210 overlap the set of active regions 202 and at least one gate of the set of gates 204. The set of conductors 210 is between a pair of gates of the set of gates 204.

In some embodiments, a bottom surface of conductor 210a is above a top surface of the set of conductors 230. In some embodiments, a top surface of conductor 210a is below a bottom surface of at least the set of active regions 202 or the back-side 203b of substrate 290.

Other configurations, arrangements on other layout levels or quantities of conductors in the set of conductors 210 are within the scope of the present disclosure.

The set of vias 212 include one or more of vias 212a or 212b. The set of vias 212 is embedded in insulating region 205. In some embodiments, the set of vias 212 are between the set of active regions 202 and the set of conductors 210. In some embodiments, the set of vias 212 are configured to electrically couple a corresponding source or drain region of the set of active regions 202 to the set of conductors 210. The set of vias 212 is located where the set of active regions 202 overlap the set of conductors 210.

Via 212a is configured to electrically couple active region 202b and conductor 210a. Via 212b is configured to electrically couple active region 202a and conductor 210a.

In some embodiments, active region 202b (e.g., a drain/source of an NMOS/PMOS transistor) is electrically coupled with conductor 210a by via 212a, and conductor 210a is electrically coupled with active region 202a (e.g., a drain/source of a PMOS/NMOS transistor) by via 212b.

Other lengths or widths for the set of vias 212 are within the scope of the present disclosure. Other configurations, arrangements on other layout levels or quantities of vias in the set of vias 212 are within the scope of the present disclosure.

The set of conductors 220 (also referred to as "power rails 220") include one or more of conductors (also referred to as "power rails") 220a or 220b. At least conductor 220a or 220b has a width $BM1_{PW1b}$ in the second direction Y. In some embodiments, the set of conductors 220 corresponds to a set of conductive structures. The set of conductors 220 is embedded in insulating region 205.

In some embodiments, when viewed from the bottom/backside (e.g., in the positive Z-direction) of integrated circuit 200, conductors 220a and 220b overlap corresponding active regions 202a and 202b, and are thus referred to as "inbound power rails.

In some embodiments, the set of conductors 220 are configured to provide power to the set of active regions 202 from the back-side 203b of integrated circuit 200. In some embodiments, the set of conductors 220 is configured to provide a first supply voltage of a voltage supply VDD or a second supply voltage of a reference voltage supply VSS to the integrated circuit, such as integrated circuit 200. In some embodiments, the first supply voltage is different from the second supply voltage.

In some embodiments, at least conductor 220b is configured to provide the second supply voltage of reference voltage supply VSS to corresponding active region 202b, and conductor 220a is configured to provide the first supply voltage of voltage supply VDD to active region 202a.

In some embodiments, at least conductor 220b is configured to provide the first supply voltage of voltage supply VDD to corresponding active region 202b, and conductor 220a is configured to provide the second supply voltage of reference voltage supply VSS to active region 202a.

The set of conductors 220 is configured to deliver power from the back-side 203b of integrated circuit 200 to one or more devices formed on the front-side 203a of integrated circuit 200. In some embodiments, the set of conductors 220 is electrically coupled to the set of active regions 202 of integrated circuit 200, thereby delivering power to the set of active regions 202 from the back-side 203b of integrated circuit 200 thereby freeing up resources on the front-side 203a of integrated circuit 200 resulting in more routing flexibility and additional routing resources compared to other approaches.

In some embodiments, conductor 220b is electrically coupled to conductors 206a and 206c by corresponding vias 230a and 230c, and conductors 206a and 206c are further electrically coupled to active region 202b by corresponding vias 208a and 208c, thereby providing the first supply voltage of voltage supply VDD or the second supply voltage of reference voltage supply VSS to the sources or drains of the corresponding active region 202b.

In some embodiments, conductor 220a is electrically coupled to conductor 206b by via 230b, and conductor 206b is further electrically coupled to active region 202a by via 208b, thereby providing the first supply voltage of voltage supply VDD or the second supply voltage of reference voltage supply VSS to the sources or drains of the corresponding active region 202a.

Other configurations, arrangements on other layout levels or quantities of conductors in the set of conductors 220 are within the scope of the present disclosure.

The set of vias 230 include one or more of vias 230a, 230b or 230c. In some embodiments, the set of vias 230 are between the set of conductors 206 and the set of conductors 220. The set of vias 230 is located where the set of conductors 206 overlap the set of conductors 220.

In some embodiments, the set of vias 230 are configured to electrically couple the set of conductors 206 and the set of conductors 220 together.

In some embodiments, at least one via of the set of vias 230 is configured to electrically couple a corresponding conductor of the set of conductors 206 to a corresponding conductor of the set of conductors 220.

Via 230a or 230c is configured to electrically couple conductor 220b and corresponding conductor 206a or 206c together. Via 230b is configured to electrically couple conductor 220a and conductor 206b together.

In some embodiments, one or more vias of set of vias 208, 212 or 230 have a square shape, a rectangular shape, a circular shape or a polygonal shape. Other lengths, widths and shapes for one or more vias of set of vias 208, 212 or 230 are in the scope of the present disclosure.

Other configurations, arrangements on other layout levels or quantities of vias in the set of vias 230 are within the scope of the present disclosure.

The set of conductive features 260 includes one or more of conductive features 260a, 260b, 260c, 260d or 260e. The set of conductive features 260 overlap at least one gate of the set of gates 204 or at least one active region of the set of active regions 202.

In some embodiments, the set of conductive features 260 overlaps other underlying features (not shown for ease of illustration) of other layout levels of integrated circuit 200, 300A-300F, 500, 700, 800, 1000, 1200, 1400, 1600 or 1800. For example, integrated circuit 200 does not show vias (e.g., VD or VG) located between the set of conductive features 260 and at least the set of gates 204 or a set of contacts (not shown) for ease of illustration.

Other configurations, arrangements on other layout levels or quantities of conductive features in the set of conductive features 260 are within the scope of the present disclosure.

In some embodiments, at least one gate region of the set of gates 204 are formed using a doped or non-doped polycrystalline silicon (or polysilicon). In some embodiments, at least one gate region of the set of gates 204 include a metal, such as Al, Cu, W, Ti, Ta, TiN, TaN, NiSi, CoSi, other suitable conductive materials, or combinations thereof.

In some embodiments, at least one conductor of the set of conductors 206, at least one conductor of the set of conductors 210, at least one conductor of the set of conductors 220, at least one via of the set of vias 208, at least one via of the set of vias 212, at least one via of the set of vias 230, or at least one conductor of the set of conductors 260 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, the set of conductors 206, the set of conductors 210, the set of conductors 220, and the set of vias 208, 212 and 230 are located on the back-side 203b of a substrate 290 of integrated circuit 200.

In some embodiments, the set of active regions 202, the set of gates 204 and the set of conductors 260 are located on a front-side 203a of the substrate 290 of integrated circuit 200, 300A-300F, 500, 700, 800, 1000, 1200, 1400, 1600 or 1800. The front-side 203a of integrated circuit 200 is opposite from the back-side 203b of integrated circuit 200, 300A-300F, 500, 700, 800, 1000, 1200, 1400, 1600 or 1800 in the second direction Y. In some embodiments, by positioning the set of conductors 206, the set of conductors 210, the set of conductors 220, and the set of vias 208, 212 and 230 on the back-side 203b of integrated circuit 200, 300A-300F, 500, 700, 800, 1000, 1200, 1400, 1600 or 1800, results in integrated circuits 200, 300A-300F, 500, 700, 800, 1000, 1200, 1400, 1600 or 1800 occupying less area than other approaches.

FIGS. 3A-3F are corresponding top views of corresponding integrated circuits 300A-300F, in accordance with some embodiments.

Figure 3A:
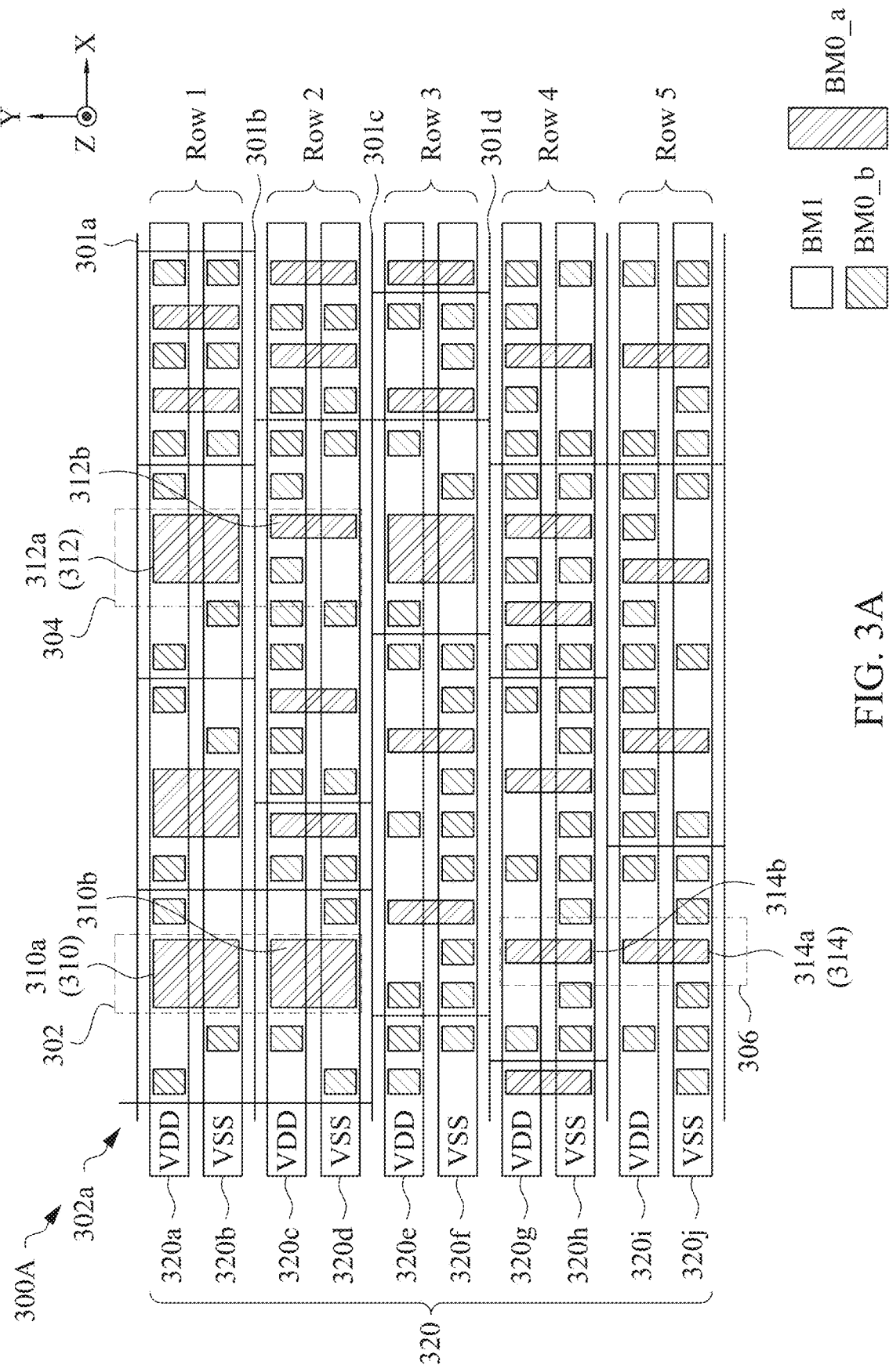
Figure 3B:
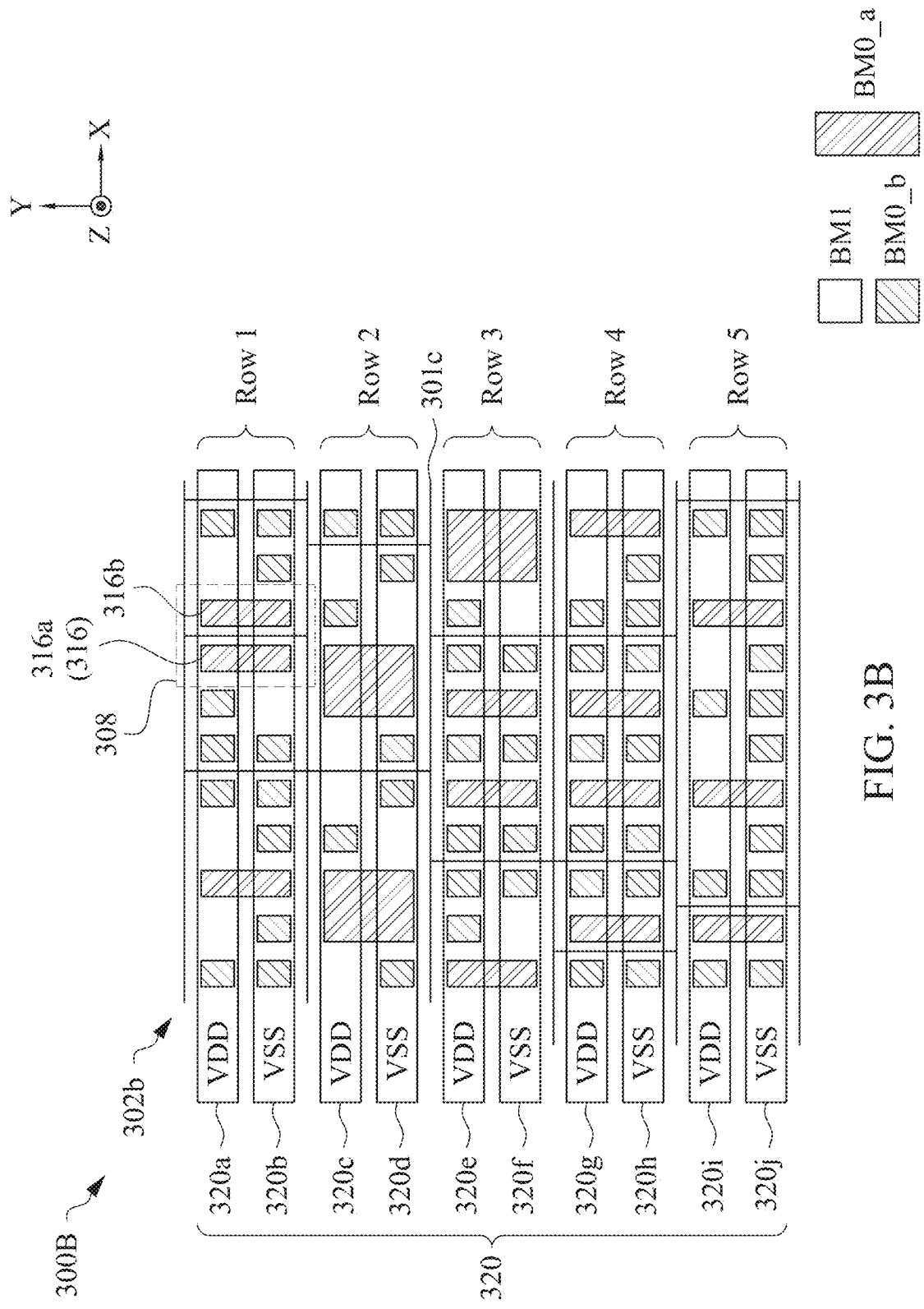
Figure 3D:
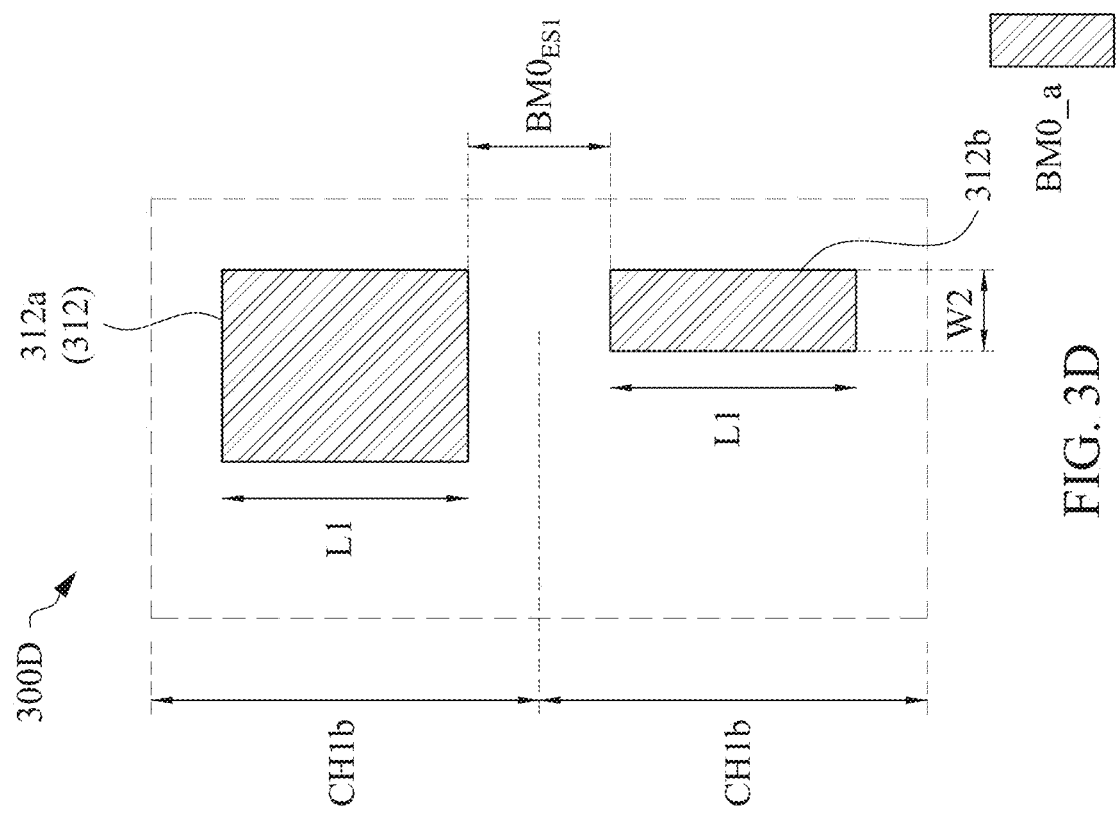
Figure 3C:
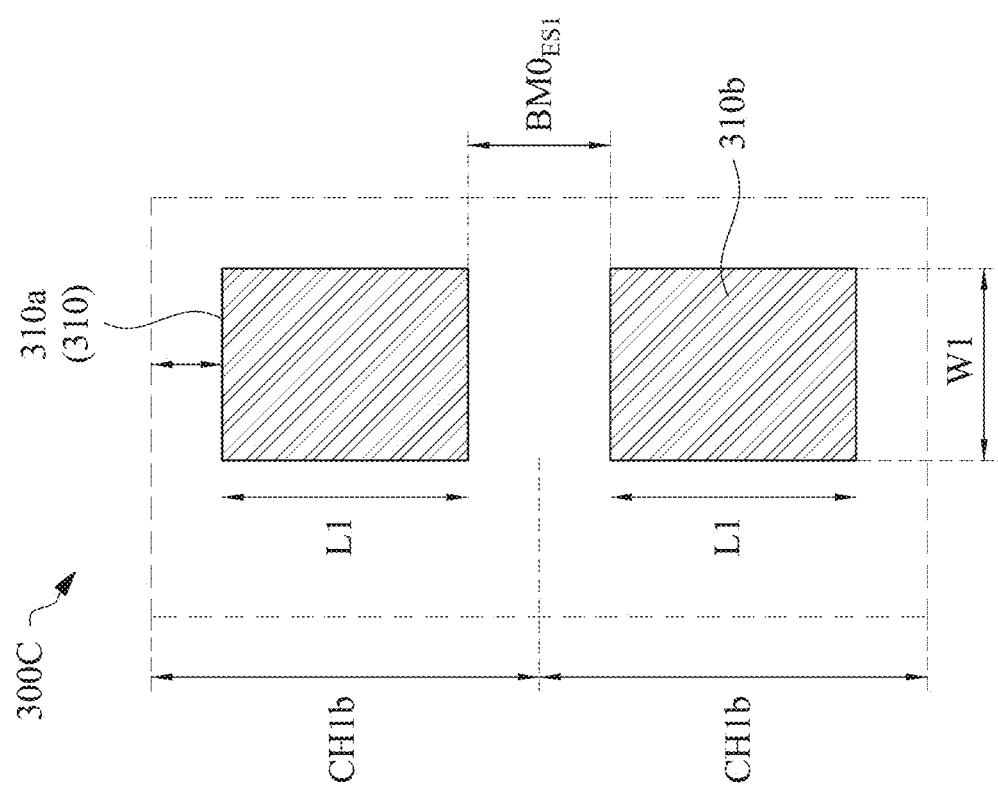

FIG. 3C is a top-view of a zoomed in portion 300C of the set of conductors 310 of integrated circuit 300A, in accordance with some embodiments.

FIG. 3D is a top-view of a zoomed in portion 300D of the set of conductors 312 of integrated circuit 300A, in accordance with some embodiments.

FIG. 3E is a top-view of a zoomed in portion 300E of the set of conductors 314 of integrated circuit 300A, in accordance with some embodiments.

FIG. 3F is a top-view of a zoomed in portion 300F of the set of conductors 316 of integrated circuit 300B, in accordance with some embodiments.

Integrated circuit 300A includes an array of cells 302a arranged in 5 rows and at least 3 columns. Other row numbers and column numbers are within the scope of the present disclosure. In some embodiments, each cell of the array of cells 302a corresponds to a cell manufactured by layout design 100. In some embodiments, each cell of the array of cells 302a and array of cells 302b (FIG. 3B) corresponds to a portion of integrated circuit 200, simplified for ease of illustration. For example, the VB0 level, the VBS/P level, the OD level, the POLY level and the M0 level are not shown in FIGS. 3A-3E for ease of illustration.

Integrated circuits 300A-300B further include a set of conductors 320. In some embodiments, set of conductors 320 in integrated circuits 300A-300B are similar to the set of conductors 220 of integrated circuit 200, and similar detailed description is omitted for brevity.

The set of conductors 320 include one or more of conductors 320a, 320b, . . . , 320i or 320j. The set of conductors 320 overlap the array of cells 302a and are inbound power rails. A pair of conductors of the set of conductors 320 overlap each row of array of cells 302a, and are configured to supply power to the corresponding overlapped row. For example, in some embodiments, conductors 320a and 320b overlap row 1 of array of cells 302a, and provide power (VDD/VSS) to cells in row 1, but do not provide power (VDD/VSS) to cells in rows 2-5. Similarly, in some embodiments, conductors 320c and 320d overlap row 2 of array of cells 302a, and provide power (VDD/VSS) to cells in row 2, but do not provide power (VDD/VSS) to cells in row 1 and rows 3-5.

Integrated circuit 300A further includes a region 302, a region 304 and a region 306.

Region 302 includes conductors 310a and 310b (collectively referred to as a "set of conductors 310") and other conductors (not labelled, but identified in key as part of BM0_b). Conductors 310a and 310b are adjacent to each other. In some embodiments, adjacent elements are elements located directly next to each other. Conductors 310a and 310b are separated from each other in the second direction Y from one cell to another.

Conductors 310a and 310b have a length L1 in the second direction Y. Conductors 310a and 310b have a width W1 in the first direction X. Conductors 310a and 310b are separated from each other in the second direction Y by a distance $BM0_{ES1}$.

Region 304 includes conductors 312a and 312b (collectively referred to as a "set of conductors 312") and other conductors (not labelled, but shown as part of BM0_b). Conductors 312a and 312b are adjacent to each other. Conductors 312a and 312b are separated from each other in the second direction Y from one cell to another.

Conductors 312a and 312b have a length L1 in the second direction Y. Conductor 312a has a width W1 in the first direction X. Conductor 312b has a width W2 in the first direction X. Conductors 312a and 312b are separated from each other in the second direction Y by distance $BM0_{ES1}$.

Region 306 includes conductors 314a and 314b (collectively referred to as a "set of conductors 314") and other conductors (not labelled, but shown as part of BM0_b). Conductors 314a and 314b are adjacent to each other. Conductors 314a and 314b are separated from each other in the second direction Y from one cell to another.

Conductors 314a and 314b have a length L1 in the second direction Y. Conductors 314a and 314b have a width W2 in the first direction X. Conductors 314a and 314b are separated from each other in the second direction Y by distance $BM0_{ES1}$.

In some embodiments, each conductor of the set of conductors 310, 312 or 314 is similar to the set of conductors 210 of integrated circuit 200, and similar detailed description is omitted. In some embodiments, each conductor of the set of conductors 310, 312 or 314 is configured to carry a signal for one or more transistors.

In some embodiments, the BM0_b conductors are similar to the set of conductors 206 of integrated circuit 200, and similar detailed description is omitted. In some embodiments, the set of conductors 320 are electrically coupled to and configured to deliver power to the BM0_b conductors. Other configurations, arrangements on other layout levels or quantities of conductors in the BM0_b conductors are within the scope of the present disclosure.

In some embodiments, conductors 310a, 310b and 312a have a same shape.

In some embodiments, conductors 312a and 312b have a different shape. For example, conductor 312b has a reduced width in the first direction X when compared with conductor 312a.

In some embodiments, at least two of conductors 312b, 314a and 314b have a same shape. In some embodiments, at least conductors 312b, 314a and 314b are similar, and similar detailed description is omitted.

Other configurations, arrangements on other layout levels or quantities of conductors in the set of conductors 310, 312, 314, 316 or 320 are within the scope of the present disclosure.

FIG. 3B is top view of integrated circuit 300B, in accordance with some embodiments.

Integrated circuit 300B includes an array of cells 302b, the set of conductors 320 and a region 308. Array of cells 302b is arranged in 5 rows and at least 2 columns. Other row numbers and column numbers are within the scope of the present disclosure. In some embodiments, array of cells 302b in FIG. 3B is similar to the array of cells 302a of FIG. 3A, and similar detailed description is omitted for brevity.

Region 308 includes conductors 316a and 316b (collectively referred to as a "set of conductors 316") and other conductors (not labelled, but identified in key as part of BM0_b). Conductors 316a and 316b are adjacent to each other. Conductors 316a and 316b are separated from each other in the first direction X from one cell to another. In some embodiments, each conductor of the set of conductors 316 is similar to the set of conductors 210, 310, 312 or 314, and similar detailed description is omitted.

In some embodiments, at least conductor 316a or 316b is similar to at least conductor 312b, 314a or 314b, and similar detailed description is omitted. In some embodiments, conductors 316a and 316b have a same shape as each other. In some embodiments, at least conductor 316a or 316b has a same shape as at least conductor 312b, 314a or 314b.

Conductors 316a and 316b have a length L1 in the second direction Y. Conductors 316a and 316b have a width W2 in the first direction X. Conductors 316a and 316b are separated from each other in the first direction X by a distance $BM0_{S1}$.

Other configurations, arrangements on other layout levels or quantities of conductors in the BM0_b conductors are within the scope of the present disclosure.

Other configurations, arrangements on other layout levels or quantities of conductors in the set of conductors 316 are within the scope of the present disclosure.

Figure 4A:
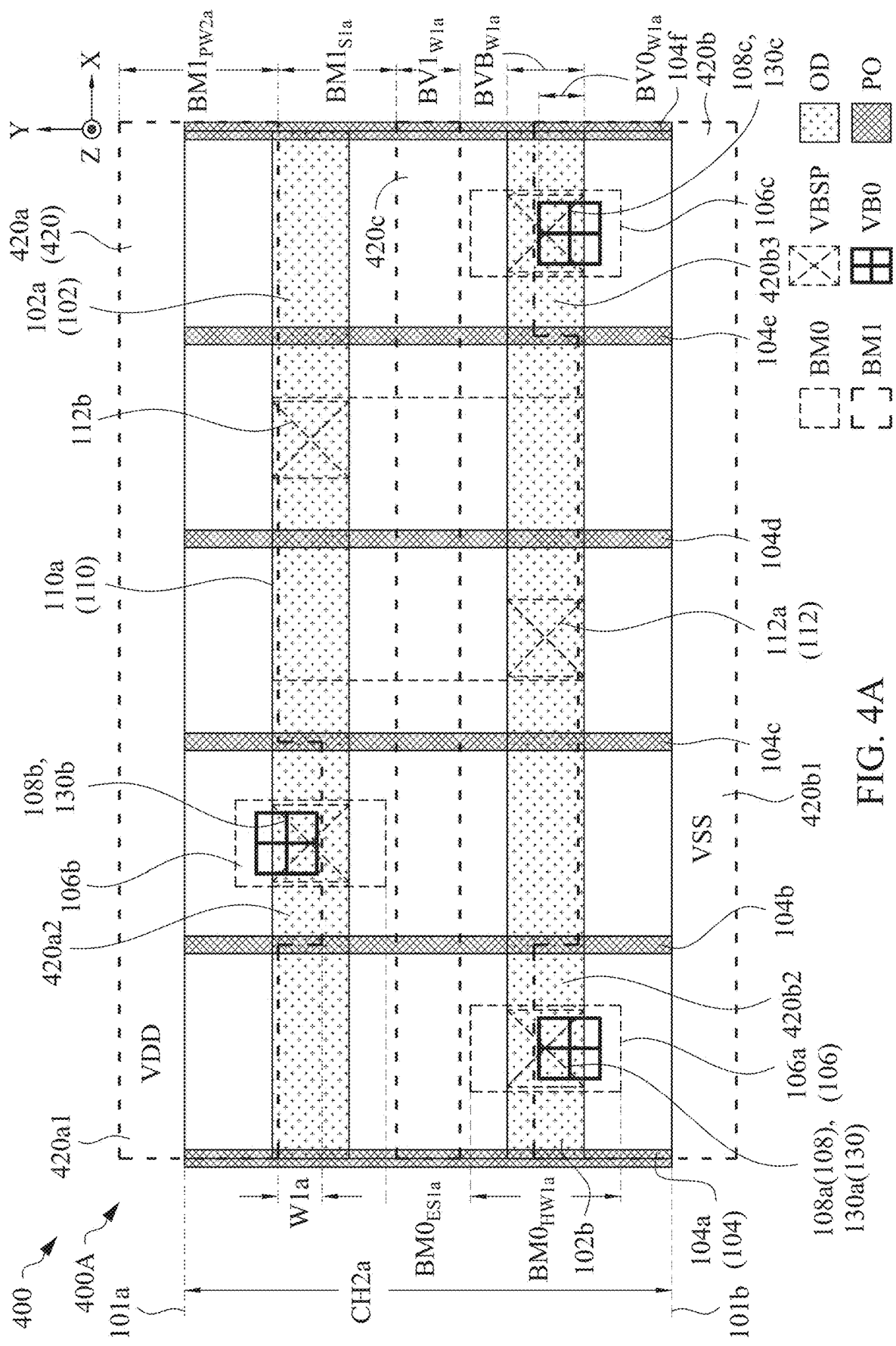
FIGS. 4A-4B are diagrams of a layout design of an integrated circuit, in accordance with some embodiments.
Figure 4B:
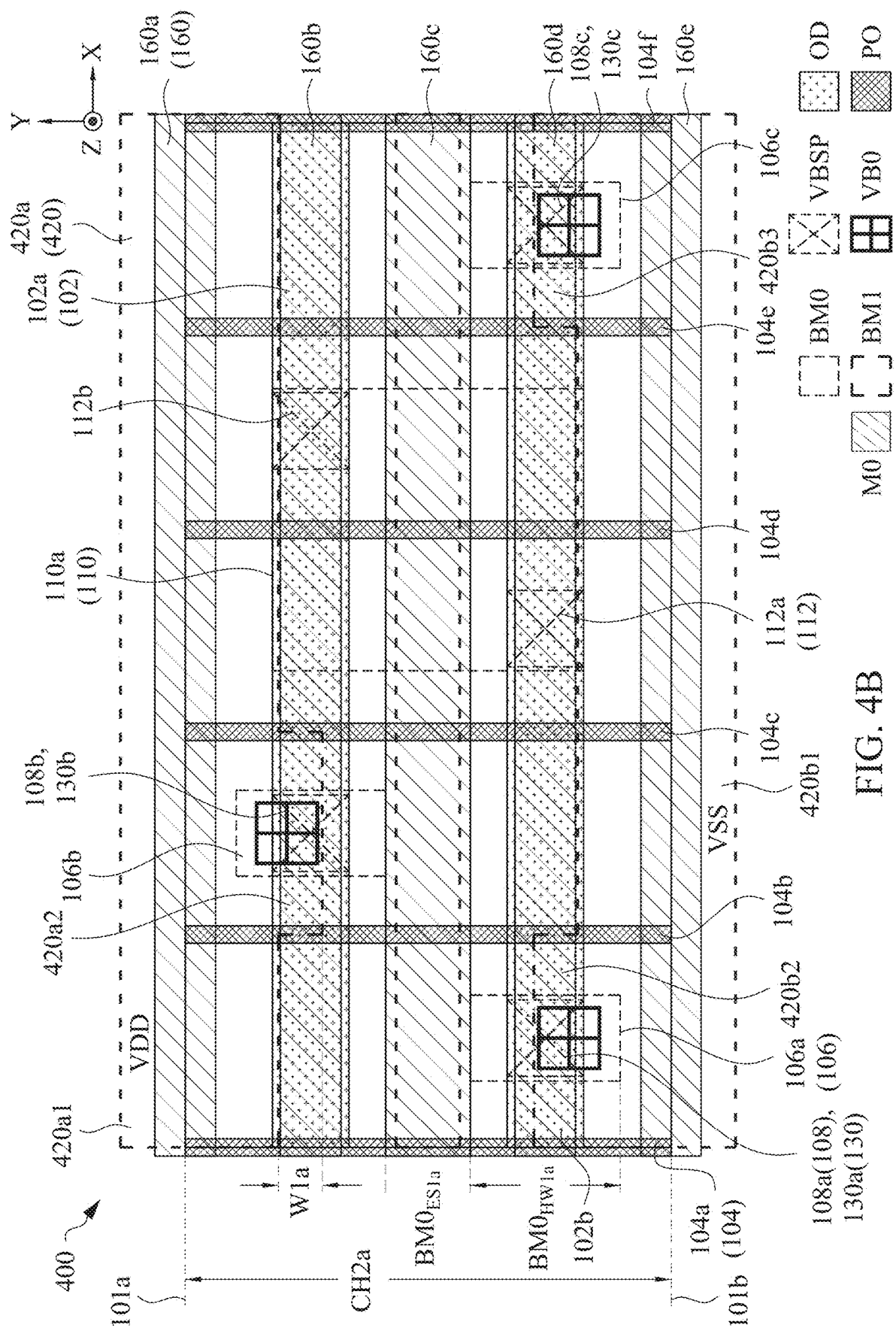

FIGS. 4A-4B are diagrams of a layout design 400 of an integrated circuit, in accordance with some embodiments. Layout design 400 is a layout diagram of integrated circuit 500 of FIGS. 5A-5E.

FIG. 4A is a diagram of a corresponding portion 400A of layout design 400 of FIG. 4B, simplified for ease of illustration. Portion 400A is a variation of portion 100A of FIG. 1A, and similar detailed description is therefore omitted.

FIG. 4B is a diagram of layout design 400 and includes portion 400A, simplified for ease of illustration. In some embodiments, layout design 400 includes additional elements not shown in FIGS. 4A-4B. Layout design 400 includes portion 400A and the M0 level.

Layout design 400 is usable to manufacture integrated circuit 500 of FIGS. 5A-5E.

Layout design 400 is a variation of layout design 100 (FIGS. 1A-1B). For example, layout design 400 illustrates an example of where the set of conductive feature patterns 420 are used for extra routing resources to electrically couple at least a pair of active regions manufactured by the set of active region patterns 102.

In comparison with layout design 100 of FIGS. 1A-1B, set of conductive feature patterns 420 of layout design 400 replaces the set of conductive feature patterns 120, and similar detailed description is therefore omitted.

Layout design 400 includes the set of active region patterns 102, the set of gate patterns 104, the set of conductive feature patterns 106, the set of via patterns 108, the set of conductive feature patterns 110, the set of via patterns 112, the set of conductive feature patterns 420 and the set of via patterns 130.

The set of conductive feature patterns 420 includes one or more conductive feature patterns 420a, 420b or 420c.

In comparison with layout design 100 of FIGS. 1A-1B, conductive feature patterns 420a and 420b of layout design 400 replace corresponding conductive feature patterns 120a and 120b, and similar detailed description is therefore omitted. In comparison with layout design 100 of FIGS. 1A-1B, conductive feature pattern 420c of layout design 400 is similar to conductive feature patterns 120a and 120b, and similar detailed description is therefore omitted.

The set of conductive feature patterns 420 is usable to manufacture a corresponding set of conductors 520 of integrated circuit 500 (FIGS. 5A-5E). In some embodiments, the set of conductors 520 are located on the back-side 203b of integrated circuit 500. In some embodiments, conductive feature patterns 420a, 420b, 420c of the set of conductive feature patterns 420 are usable to manufacture corresponding conductors 520a, 520b, 520c of the set of conductors 520 (FIGS. 5A-5E) of integrated circuit 500.

Conductive feature pattern 420c extends in the first direction X, and is positioned between conductive feature patterns 420a and 420b. In some embodiments, conductive feature pattern 420c is also referred to as a "signal line pattern 420c." For example, in some embodiments, conductive feature pattern 420c is useable to manufacture conductor 520c, and conductor 520c is useable to route one or more signals for NMOS or PMOS transistors of the set of active regions 202.

Each of conductive feature patterns 420a, 420b and 420c of the set of conductive feature patterns 420 are separated from one another in the second direction Y.

In some embodiments, when viewed from the bottom/backside (e.g., in the positive Z-direction) of layout design 400, conductive feature patterns 420a and 420b overlap corresponding cell boundaries 101a and 101b of layout design 400, and conductive feature pattern 420c overlaps mid-point 101c of layout design 400.

Conductive feature patterns 420a and 420b have a sawtooth shape or a staggered orientation relative to each other. For example, conductive feature pattern 420a includes conductive feature patterns 420a1 and 420a2 that are coupled together, and conductive feature pattern 420a includes conductive feature patterns 420b1, 420b2 and 420b3 that are coupled together.

Conductive feature pattern 420a2 is coupled to and corresponds to an extended region of conductive feature pattern 420a1, and conductive feature patterns 420b2 and 420b3 are coupled to and correspond to extended regions of conductive feature pattern 420b1.

Conductive feature pattern 420a2 is offset or staggered in the first direction X from at least conductive feature pattern 420b2 or 420b3, and vice versa.

In some embodiments, when viewed from the bottom/backside (e.g., in the positive Z-direction) of layout design 400, by having conductive feature pattern 420a2 be an extended region of conductive feature pattern 420a, and conductive feature patterns 420b2 and 420b3 be corresponding extended regions of conductive feature pattern 420b, results in more overlap by conductive feature patterns 420a2, 420b2 and 420b3 of the underlying patterns (e.g., set of via patterns 108 and set of conductive feature patterns 110), thereby increasing the via landing spots for the set of via patterns 130.

In some embodiments, a center of conductive feature patterns 420a1 and 420b1 in the first direction X is aligned with corresponding cell boundaries 101a and 101b in the first direction X. In some embodiments, a center of conductive feature pattern 420c in the first direction X is aligned with mid-point 101c in the first direction X.

At least conductive feature pattern 420a1 or 420b1 has a width $BM1_{PW2a}$ in the second direction Y. At least conductive feature pattern 420a2, 420b2 or 420b3 has a width W1a in the second direction Y. In some embodiments, width $BM1_{PW2a}$ is different from width W1a.

At least conductive feature pattern 420c has a width $BM1_{W1a}$ in the second direction Y. Each conductive feature pattern of the set of conductive feature patterns 106 has a width $BM0_{HW1a}$ in the second direction Y that is similar to length L1 of FIGS. 3C-3F. Each via pattern of the set of via patterns 130 has a width $BV0_{W1a}$ in the second direction Y.

Each conductive feature pattern of the set of conductive feature patterns 106 is separated from each other in the second direction Y by a distance $BM0_{ES1a}$. Each conductive feature pattern 420a1 or 420b1 is separated from conductive feature pattern 420c in the second direction Y by distance $BM1_{S1a}$.

Layout design 400 has a cell height CH2a in the second direction. In some embodiments, cell height CH2a is different from cell height CH1a. In some embodiments, cell height CH2a is the same as cell height CH1a.

In some embodiments, layout design 400 does not satisfy a first set of design rules based on a formula 2 (shown below). For example, in some embodiments, a staggered power delivery layout similar to the set of conductive feature patterns 420 is used when layout design 400 does not satisfy the first set of design rules. In some embodiments, the first set of design rules is related to the cell height CH2a of layout design 400.

In some embodiments, the cell height CH2a of layout design 400 is determined according to formula 1, and is expressed as:

$$CH2a = BM1_{PW2a} + 2*BM1_{S1a} + BM1_{W1a} = 2*BM0_{HW1a} + 2*BM0_{ES1a} \quad (1)$$

where $BM1_{PW2a}$ is the width of at least conductive feature pattern 420a1 or 420b1, $BM1_{S1a}$ is the distance or spacing between conductive feature pattern 420c and at least conductive feature pattern 420a1 or 420b1 in the second direction Y, $BM1_{W1a}$ is the width of conductive feature pattern 420c in the second direction Y, $BM0_{HW1a}$ is the width of each conductive feature pattern in the set of conductive feature patterns 106 in the second direction Y, and $BM0_{ES1a}$ is the distance each conductive feature pattern of the set of conductive feature patterns 106 is separated from each other by in the second direction Y.

In some embodiments, the first set of design rules includes whether the width $BV0_{W1a}$ of each via pattern of the set of via patterns 130 of layout design 400 satisfies formula 2.

For example, formula 2, is expressed as:

$$BV0_{W1a} < 0.5*BM1P_{W2a} - 0.5*BM0_{ES1a} \quad (2)$$

In some embodiments, the staggered power delivery network layout to the set of conductive feature patterns 420 is used when the width $BV0_{W1a}$ of each via pattern of the set of via patterns 130 of layout design 400 is less than formula 2. In some embodiments, the staggered power delivery network layout to the set of conductive feature patterns 420 is not used when the width $BV0_{W1a}$ of each via pattern of the set of via patterns 130 of layout design 400 is greater than or equal to formula 2. In some embodiments, if the staggered power delivery network layout to the set of conductive feature patterns 420 is not used, then a power delivery network layout similar to the set of conductive feature patterns 620 (FIGS. 6A-6B) is used.

Other widths for the set of conductive feature patterns 420 or other numbers of conductive feature patterns in the set of conductive feature patterns 420 are within the scope of the present disclosure. In some embodiments, at least conductive feature pattern 420a has a width different from conductive feature pattern 420b.

Other configurations, arrangements on other layout levels or quantities of patterns in the set of conductive feature patterns 420 are within the scope of the present disclosure.

In some embodiments, moving at least a signal line pattern and a power rail of the set of conductive feature patterns 103 from the front-side of layout design 400 or 600 to the back-side of layout design 400 or 600, results in layout design 400 or 600 using at least one less upper metal layer track in the set of conductive feature patterns 160, resulting in a layout design with a smaller height, smaller area, more routing flexibility and additional routing resources compared to other approaches.

FIGS. 5A-5E are diagrams of an integrated circuit 500, in accordance with some embodiments.

Figure 5A:
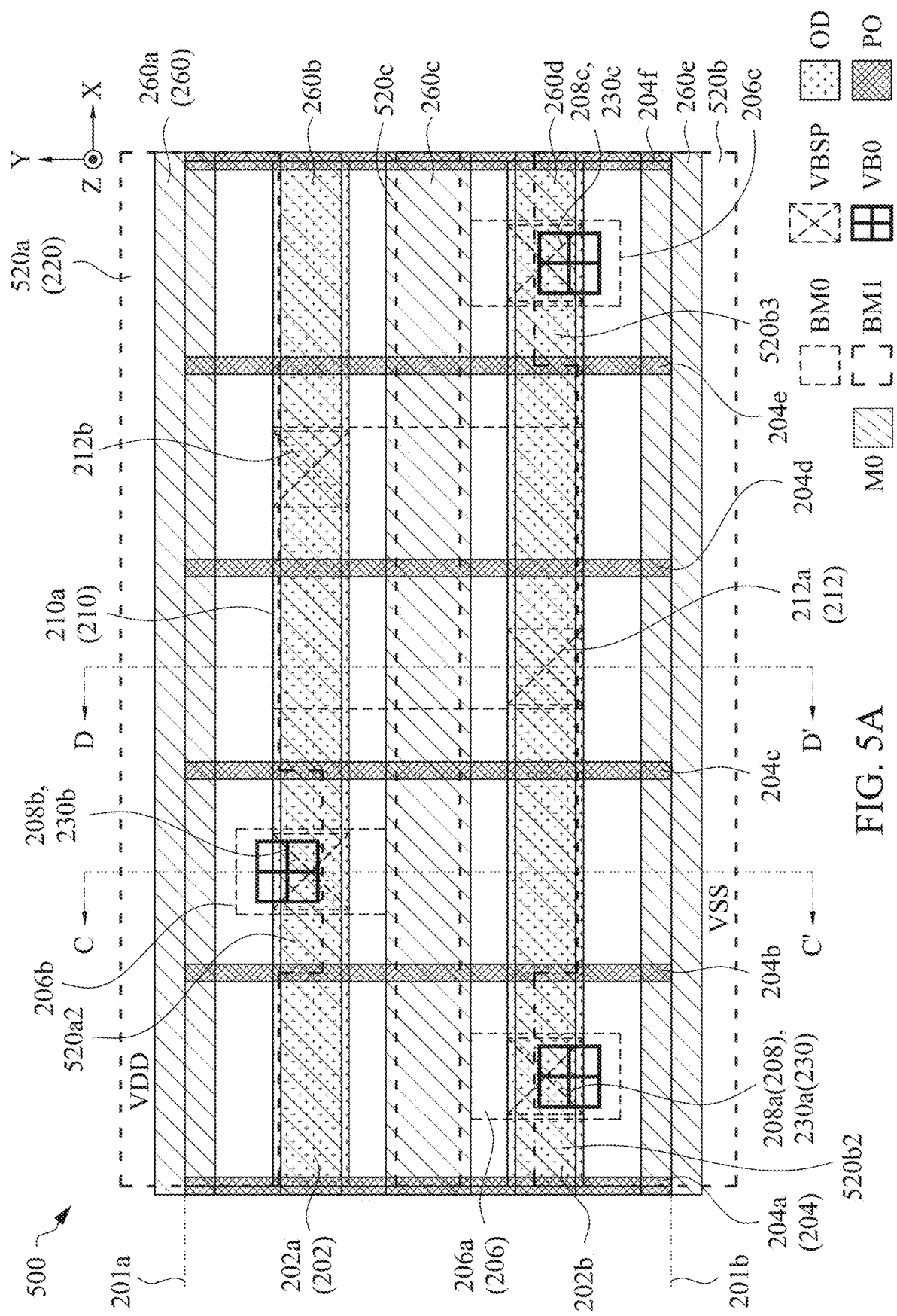
FIGS. 5A-5E are diagrams of an integrated circuit, in accordance with some embodiments.
Figure 5B:
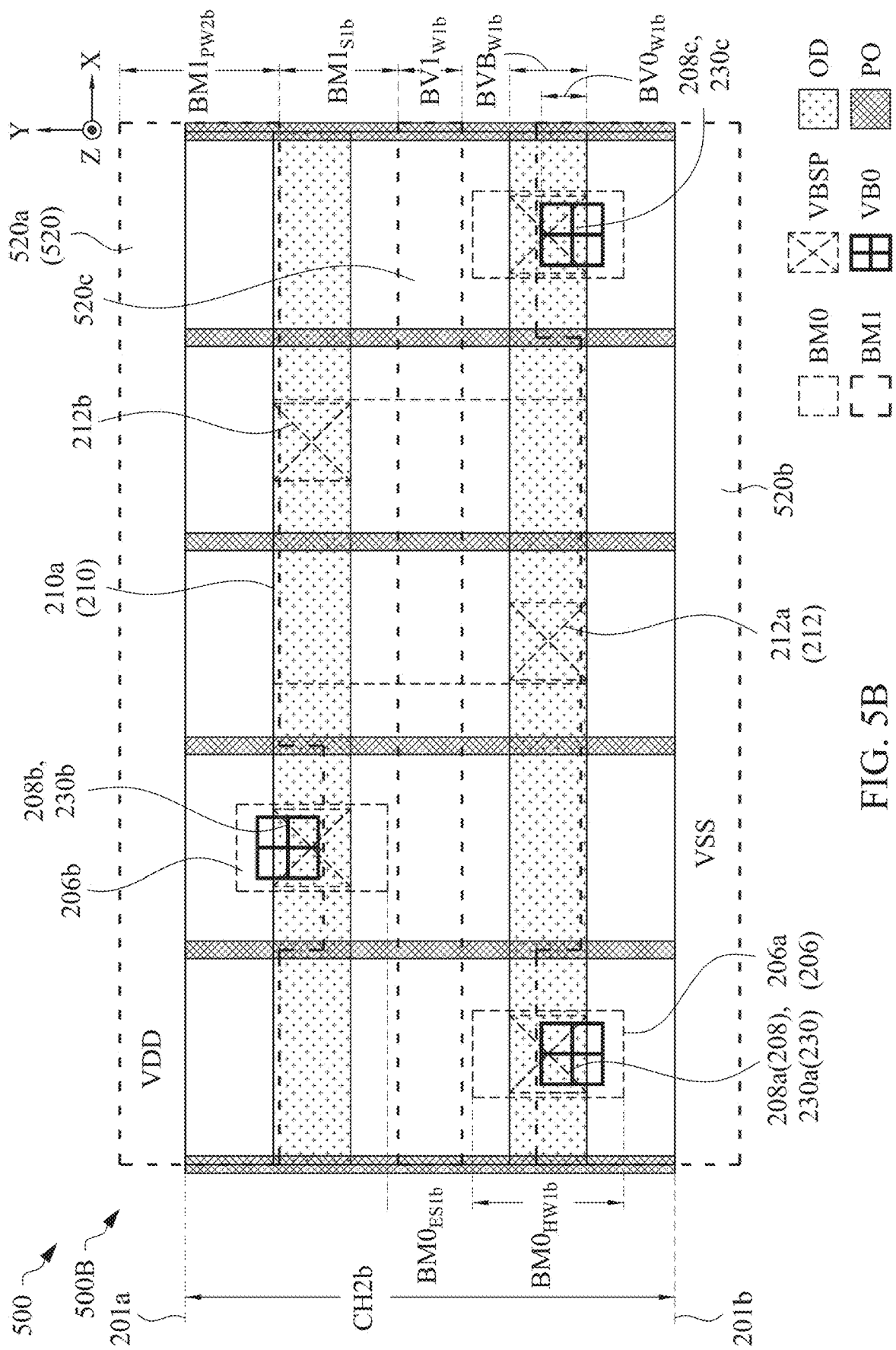

FIG. 5A is a top view of integrated circuit 500, in accordance with some embodiments. FIG. 5B is a top view of a corresponding portion 500B of integrated circuit 500 of FIG. 5A, simplified for ease of illustration. FIG. 5B is a diagram of integrated circuit 500 and includes portion 500B, simplified for ease of illustration. Integrated circuit 500 includes portion 500B and the M0 level.

Figure 5C:
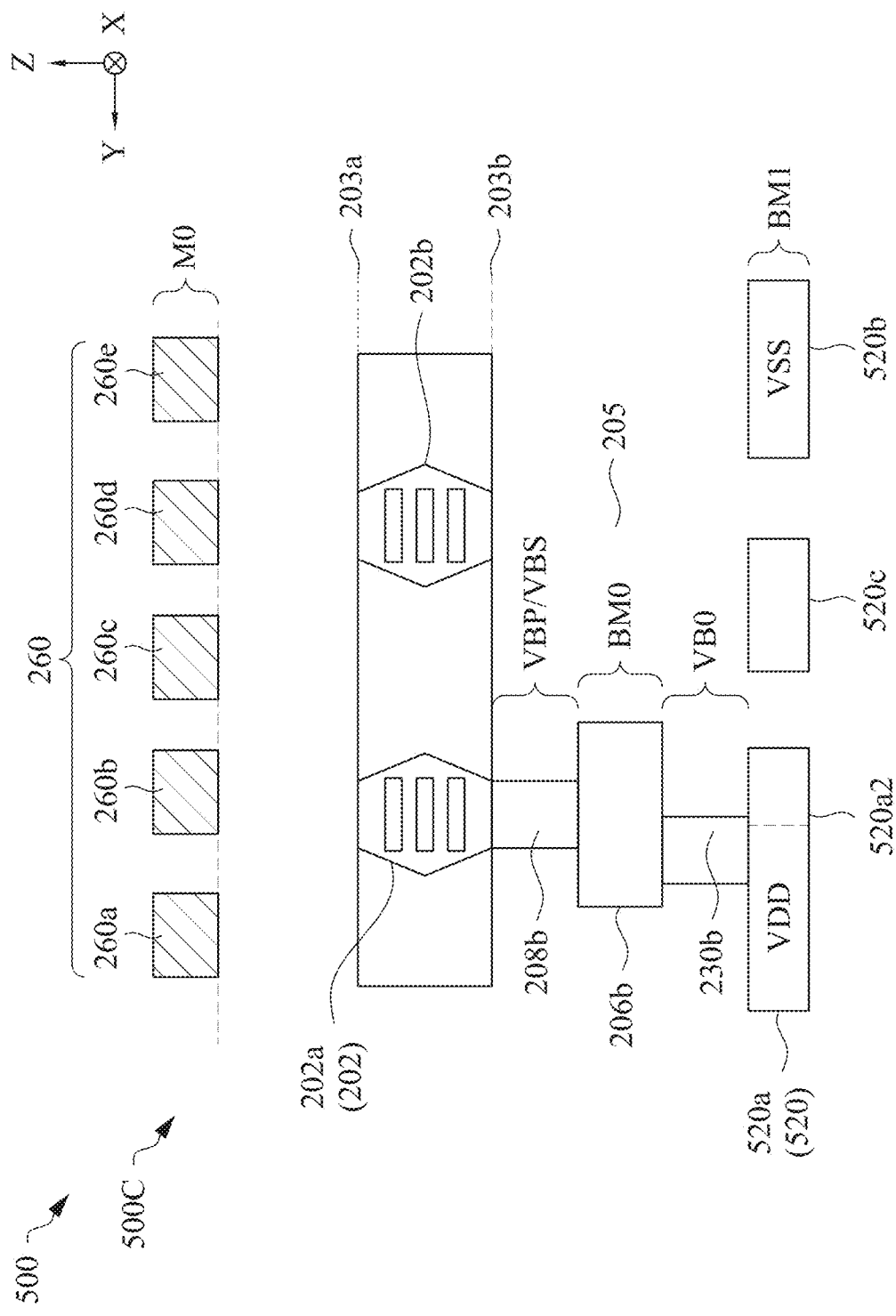
Figure 5D:
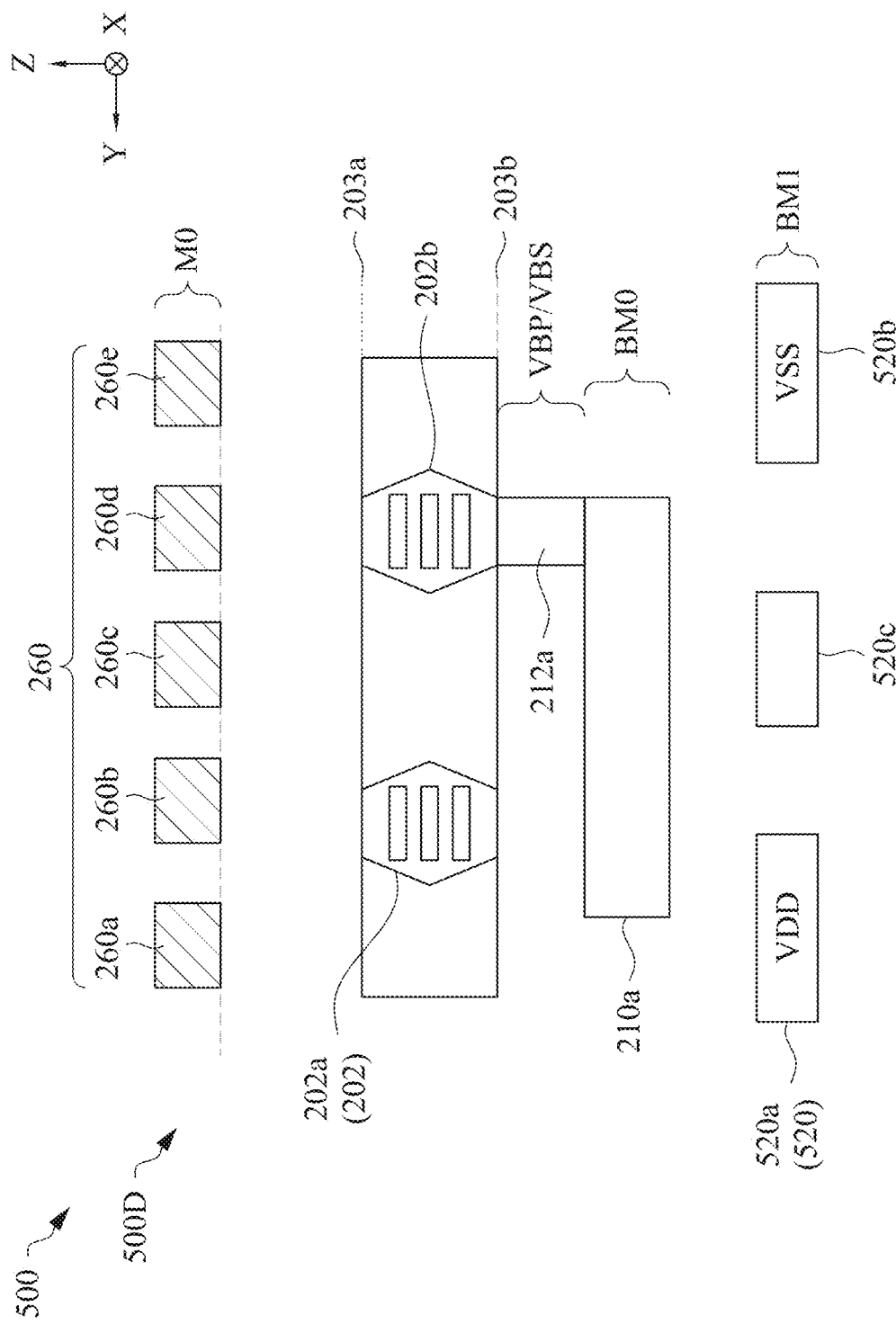
Figure 5E:
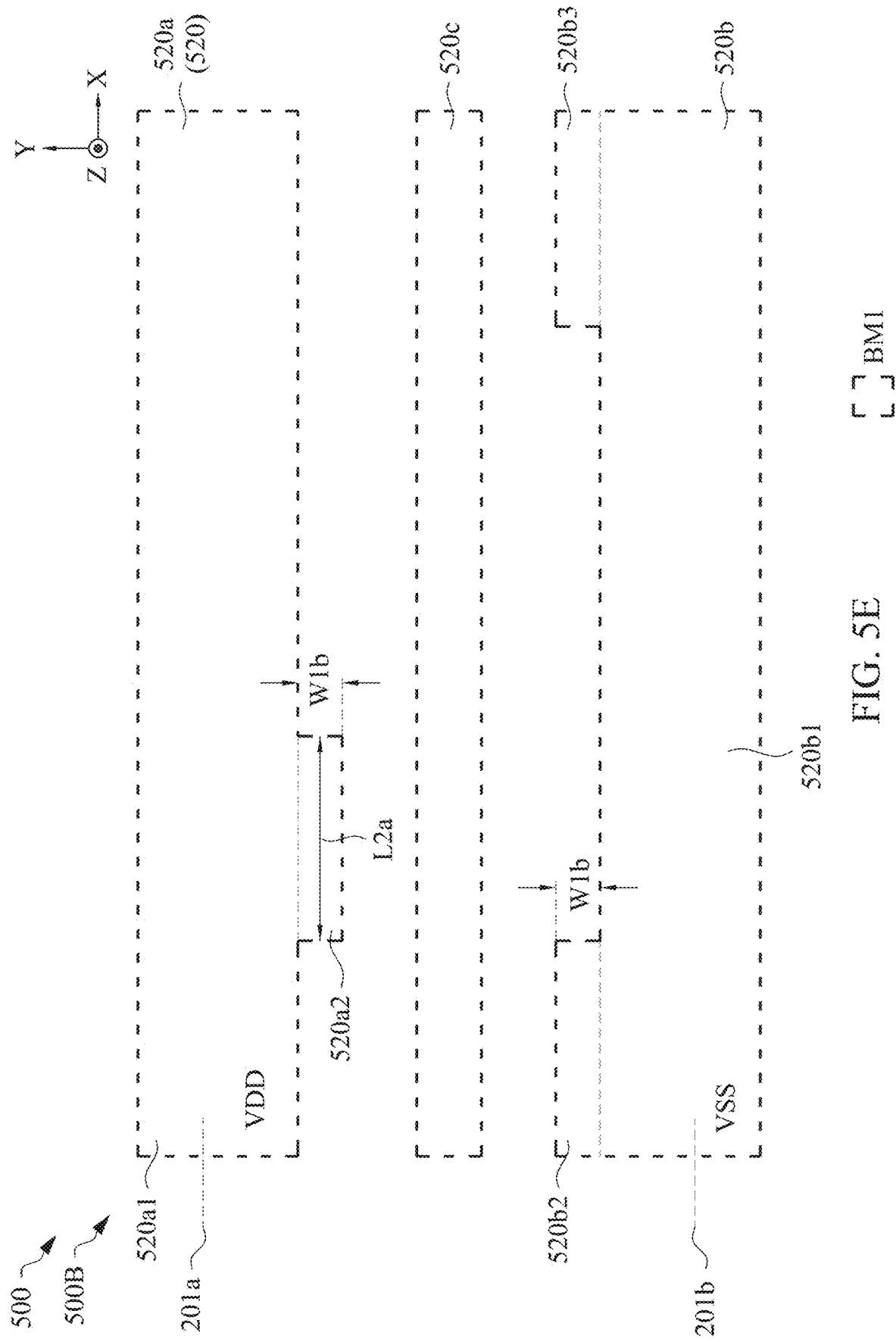

FIGS. 5C-5D are corresponding cross-sectional views of integrated circuit 500, in accordance with some embodiments. FIG. 5C is a cross-sectional view of integrated circuit 500 as intersected by plane C-C', in accordance with some embodiments. FIG. 5D is a cross-sectional view of integrated circuit 500 as intersected by plane D-D', in accordance with some embodiments.

Integrated circuit 500 is manufactured by layout design 400. Structural relationships including alignment, lengths and widths, as well as configurations and layers of integrated circuit 500 are similar to the structural relationships and configurations and layers of layout design 400 of FIGS. 4A-4B, and similar detailed description will not be described in at least FIGS. 5A-5E, for brevity.

Integrated circuit 500 is a variation of integrated circuit 200 (FIGS. 2A-2C). For example, integrated circuit 500 illustrates an example of where the set of conductors 520 are used for extra routing resources to electrically couple at least a pair of active regions manufactured by the set of active regions 202.

In comparison with integrated circuit 200 of FIGS. 2A-2C, set of conductors 520 of integrated circuit 500 replaces the set of conductors 220, and similar detailed description is therefore omitted.

Integrated circuit 500 includes at least the set of active regions 202, the set of gates 204, an insulating region 205, the set of conductors 206, the set of conductors 210, the set of vias 208, the set of vias 212, the set of conductors 520 (also referred to as a set of power rails 520), the set of vias 230, and a set of conductors 260.

The set of conductors 520 includes at least conductor 520a, 520b or 520c. In some embodiments, the set of conductors 520 are located on the back-side 203b of integrated circuit 500.

Conductor 520c extends in the first direction X, and is positioned between conductors 520a and 520b. In some embodiments, conductor 520c is also referred to as a "signal line 520c." For example, in some embodiments, conductor 520c is useable to route one or more signals for NMOS or PMOS transistors of the set of active regions 202. In some embodiments, by including conductor 520c between conductors 520a and 520b, causes conductors 520a and 520b to be shifted away from each other in the second direction Y when compared with conductors 220a and 220b to accommodate conductor 520c. Thus, in some embodiments, when viewed from the bottom/backside (e.g., in the positive Z-direction) of integrated circuit 500, conductors 520a and 520b overlap corresponding cell boundaries 201a and 201b of integrated circuit 500, and conductor 520c overlaps mid-point 201c of integrated circuit 500.

In some embodiments, a center of conductors 520a1 and 520b1 in the first direction X is aligned with corresponding cell boundaries 201a and 201b in the first direction X. In some embodiments, a center of conductor 520c in the first direction X is aligned with mid-point 201c in the first direction X.

Conductors 520a and 520b have a saw-tooth shape or a staggered orientation relative to each other. For example, conductor 520a includes conductors 520a1 and 520a2 that are coupled together, and conductor 520b includes conductors 520b1, 520b2 and 520b3 that are coupled together. Conductor 520a2 is offset or staggered in the first direction X from at least conductor 520b2 or 520b3, and vice versa.

Conductor 520a2 is coupled to and corresponds to an extended region of conductor 520a1, and conductors 520b2 and 520b3 are coupled to and correspond to extended regions of conductor 520b1.

In some embodiments, when viewed from the bottom/backside (e.g., in the positive Z-direction) of integrated circuit 500, by having conductor 520a2 be an extended region of conductor 520a, and conductors 520b2 and 520b3 be corresponding extended regions of conductor 520b, results in more overlap by conductors 520a2, 520b2 and 520b3 of the underlying structures (e.g., set of vias 208 and set of conductors 210), thereby increasing the via landing spots for the set of vias 230 even though conductors 520a and 520b have been shifted away from each other in comparison with conductors 220a and 220b of FIGS. 2A-2C.

At least conductor 520a1 or 520b1 has a width $BM1_{PW2b}$ in the second direction Y. At least conductor 520a2, 520b2 or 520b3 has a width $W1b$ in the second direction Y. In some embodiments, width $BM1_{PW2b}$ is different from width $W1b$. At least conductor 520a2, 520b2 or 520b3 has a length $L2a$ in the first direction X.

At least conductor 520c has a width $BM1_{W1b}$ in the second direction Y. Each conductor of the set of conductors 206 has a width $BM0_{HW1b}$ in the second direction Y that corresponds to length L1 of FIGS. 3C-3F. Each via of the set of vias 230 has a width $BV0_{W1b}$ in the second direction Y.

Each conductor of the set of conductors 206 is separated from each other in the second direction Y by distance $BM0_{ES1b}$. Each conductor 520a1 or 520b1 is separated from conductor 520c in the second direction Y by distance $BM1_{S1b}$.

Integrated circuit 500 has a cell height CH2a in the second direction.

In some embodiments, integrated circuit 500 does not satisfy a second set of design rules based on a formula 4 (shown below). For example, in some embodiments, a staggered power delivery network similar to the set of conductors 520 is used when integrated circuit 500 does not satisfy the second set of design rules. In some embodiments, the second set of design rules is related to the cell height CH2b of integrated circuit 500.

In some embodiments, the cell height CH2b of integrated circuit 500 is determined according to formula 3, and is expressed as:

$$CH2b = BM1P_{W2b} + 2*BM1_{S1b} + BM1_{W1b} = 2*BM0_{HW1b} + 2*BM0_{ES1b} \quad (3)$$

where $BM1_{PW2b}$ is the width of at least conductor 520a1 or 520b1, $BM1_{S1b}$ is the distance or spacing between conductor 520c and at least conductor 520a1 or 520b1 in the second direction Y, $BM1_{W1b}$ is the width of conductor 520c in the second direction Y, $BM0_{HW1b}$ is the width of each conductor in the set of conductors 206 in the second direction Y, and $BM0_{ES1b}$ is the distance each conductor of the set of conductors 206 is separated from each other in the second direction Y.

In some embodiments, the second set of design rules includes whether the width $BV0_{W1b}$ of each via of the set of vias 230 of integrated circuit 500 satisfies formula 4.

For example, formula 4, is expressed as:

$$BV0_{W1b} < 0.5*BM1_{PW2b} - 0.5*BM0_{ES1b} \quad (4)$$

In some embodiments, the staggered power delivery network similar to the set of conductors 520 is used when the width $BV0_{W1b}$ of each via of the set of vias 230 of integrated circuit 500 is less than formula 4. In some embodiments, the staggered power delivery network to the set of conductors 520 is not used when the width $BV0_{W1b}$ of each via of the set of vias 230 of integrated circuit 500 is greater than or equal to formula 4. In some embodiments, if the staggered power delivery network to the set of conductors 520 is not used, then a power delivery network similar to the set of conductors 720 (FIGS. 7A-7C) is used.

Other widths or lengths for the set of conductors 520 or other numbers of conductors in the set of conductors 520 are within the scope of the present disclosure. In some embodiments, at least conductor 520a has a width different from conductor 520b.

Other configurations, arrangements on other levels or quantities of conductors in the set of conductors 520 are within the scope of the present disclosure.

In some embodiments, conductor 520b is electrically coupled to conductors 206a and 206c by corresponding vias 230a and 230c, and conductors 206a and 206c are further electrically coupled to active region 202b by corresponding vias 208a and 208c, thereby providing the first supply voltage of voltage supply VDD or the second supply voltage of reference voltage supply VSS to the sources or drains of the corresponding active region 202b.

In some embodiments, conductor 520a is electrically coupled to conductor 206b by via 230b, and conductor 206b is further electrically coupled to active region 202a by via 208b, thereby providing the first supply voltage of voltage supply VDD or the second supply voltage of reference voltage supply VSS to the sources or drains of the corresponding active region 202a.

In some embodiments, by moving at least a signal line and a power rail of the set of conductors 520 from the front-side 203a of integrated circuit 500 or 700 to the back-side 203b of integrated circuit 500 or 700, results in integrated circuit 500 or 700 using at least one less upper metal layer track in the set of conductors 260, resulting in an integrated circuit with a smaller height, smaller area, more routing flexibility and additional routing resources compared to other approaches.

FIGS. 6A-6B are diagrams of a layout design 600 of an integrated circuit, in accordance with some embodiments. Layout design 600 is a layout diagram of integrated circuit 700 of FIGS. 7A-7C.

FIG. 6A is a diagram of a corresponding portion 600A of layout design 600 of FIG. 6B, simplified for ease of illustration.

FIG. 6B is a diagram of layout design 600 and includes portion 600A, simplified for ease of illustration. For example, layout design 600 in FIG. 6B further includes M0. Stated differently, portion 600A of FIG. 6A does not include M0 for ease of illustration. In some embodiments, layout design 600 includes additional elements not shown in FIGS. 6A-6B. Layout design 600 includes portion 600A and the M0 level.

Figure 7A:
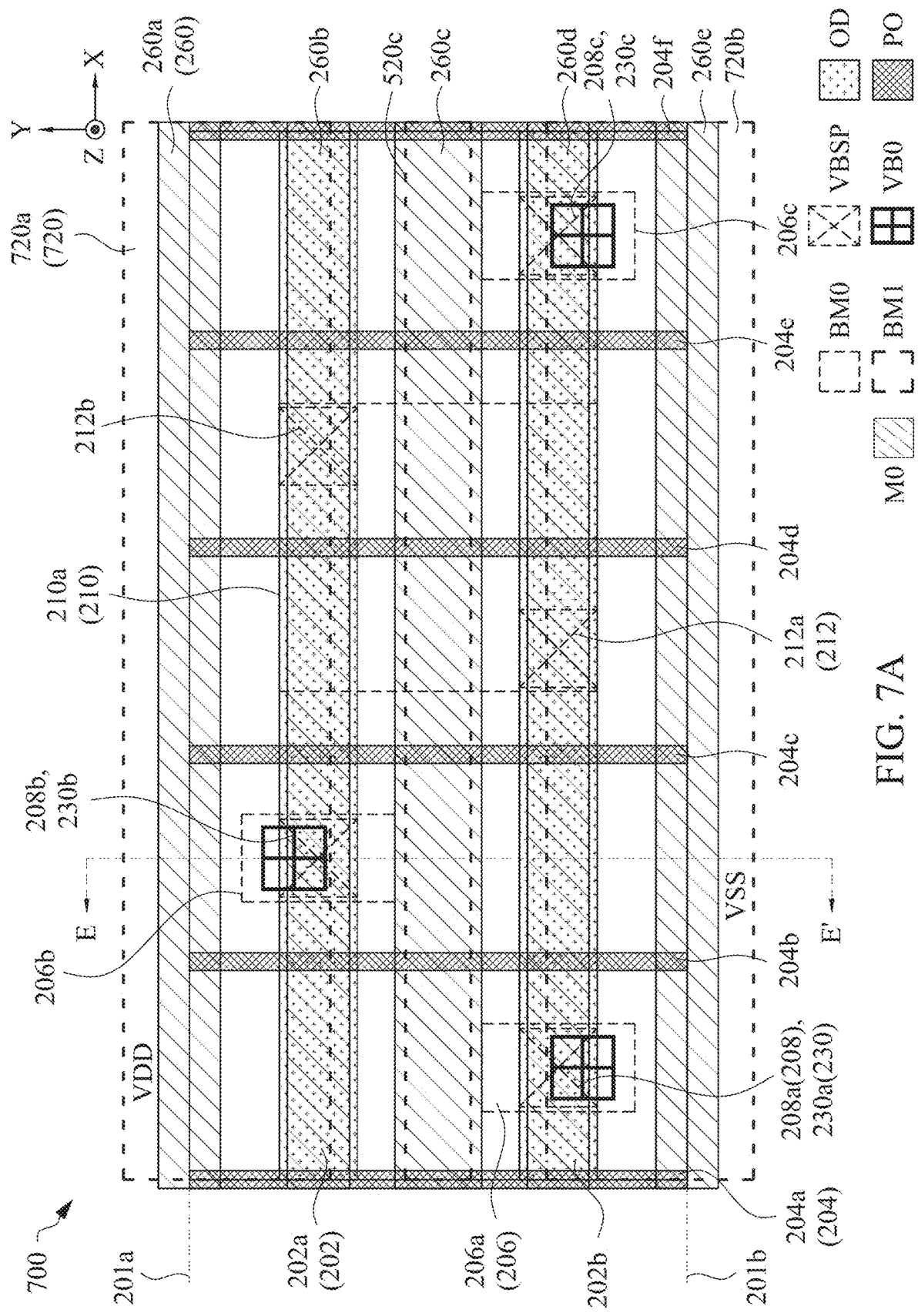
FIGS. 7A-7C are diagrams of an integrated circuit, in accordance with some embodiments.
Figure 7B:
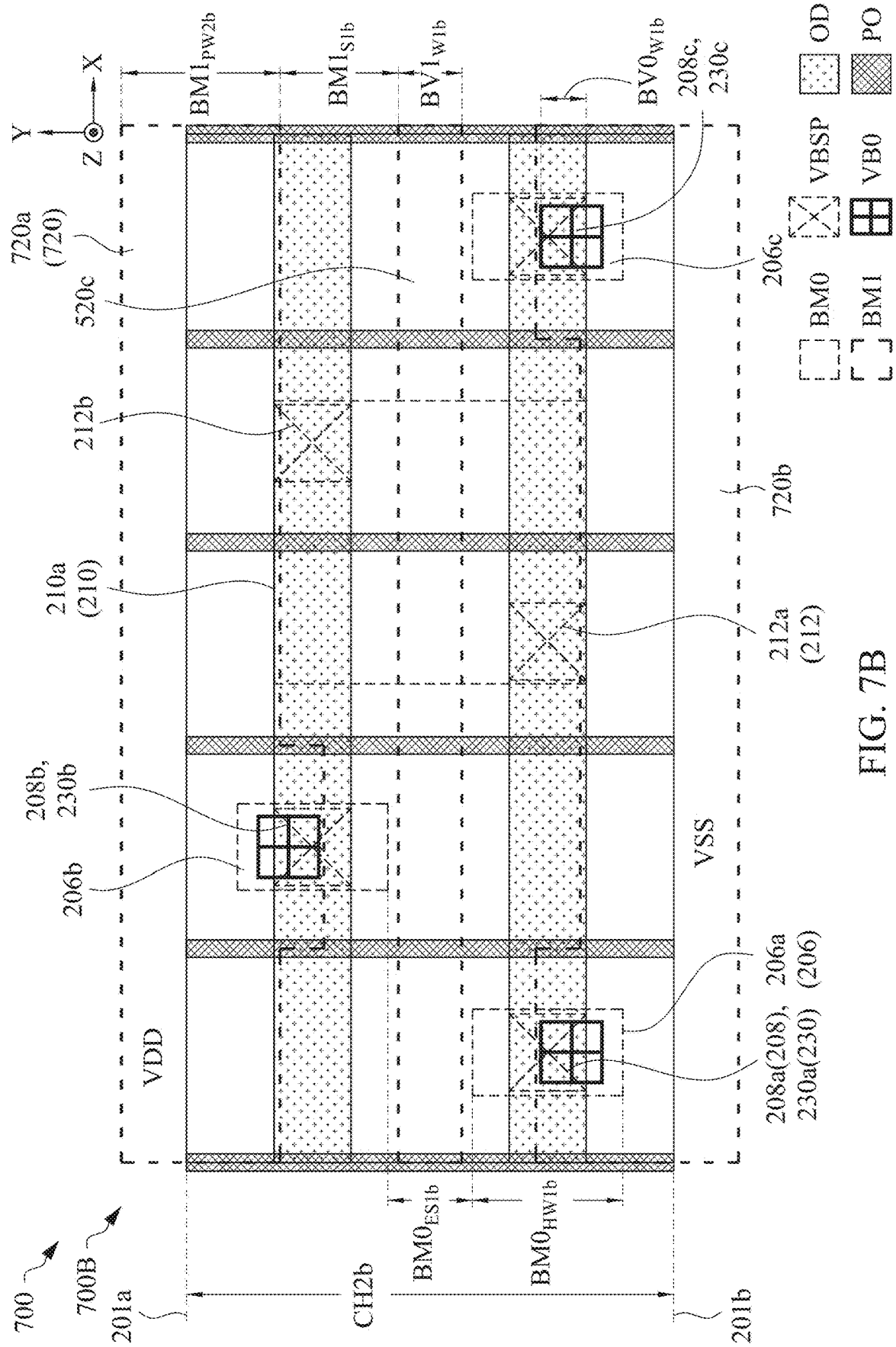
Figure 7C:
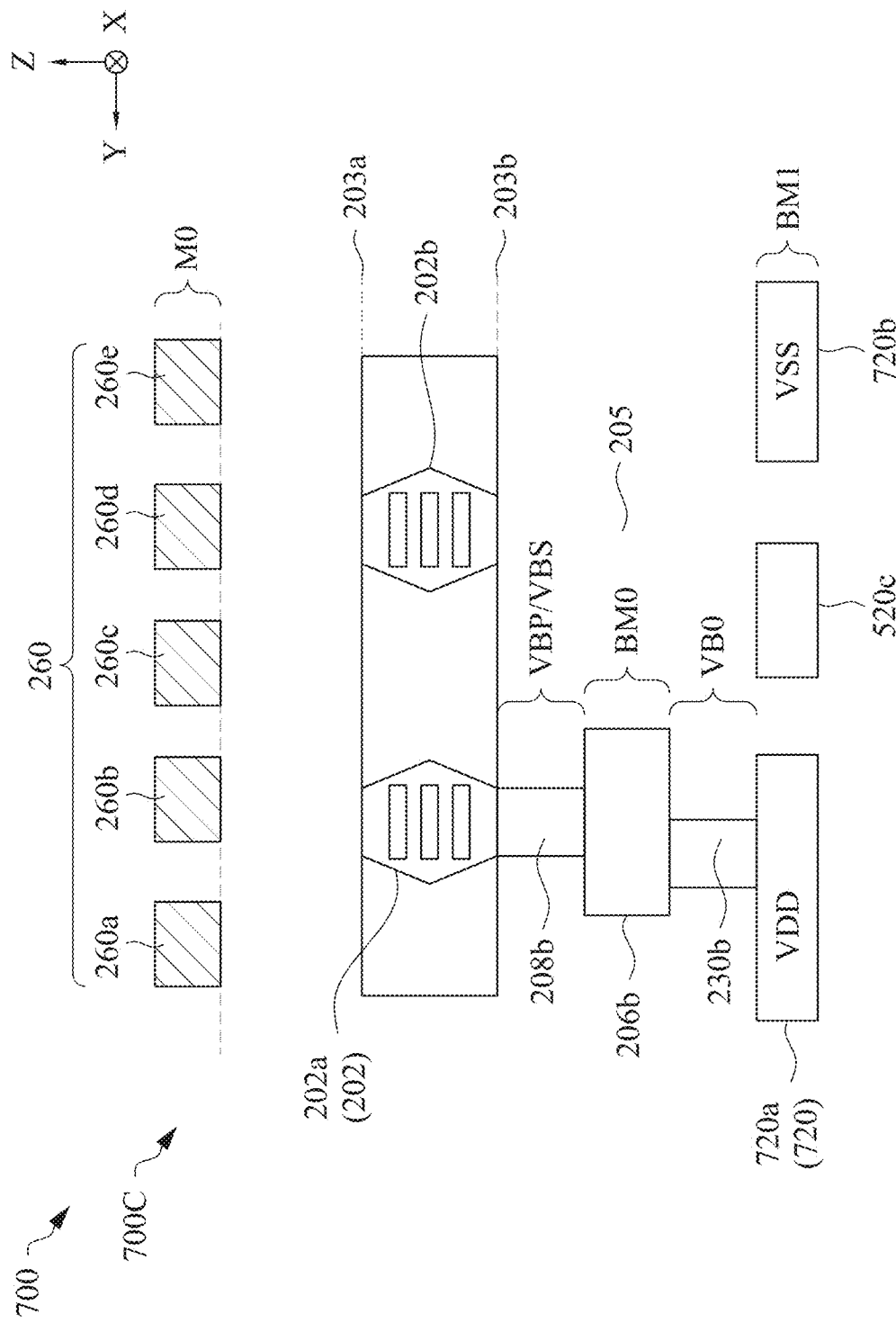

Layout design 600 is usable to manufacture integrated circuit 700 of FIGS. 7A-7C.

Layout design 600 is a variation of layout design 400 (FIGS. 4A-4B). Portion 600A is a variation of portion 400A of FIG. 4A, and similar detailed description is therefore omitted. For example, layout design 600 illustrates an example of where the set of conductive feature patterns 620 does not have a saw-tooth shape. Stated differently, the set of conductive feature patterns 620 does not include extended regions 520a2, 520b2 or 520b3 in a staggered orientation relative to each other.

In comparison with layout design 100 of FIGS. 1A-1B, set of conductive feature patterns 620 of layout design 600 replaces the set of conductive feature patterns 120, and similar detailed description is therefore omitted.

Layout design 600 includes the set of active region patterns 102, the set of gate patterns 104, the set of conductive feature patterns 106, the set of via patterns 108, the set of conductive feature patterns 110, the set of via patterns 112, the set of conductive feature patterns 620 and the set of via patterns 130. The set of conductive feature patterns 620 includes one or more conductive feature patterns 620a, 620b or 420c.

In comparison with layout design 400 of FIGS. 4A-4B, conductive feature patterns 620a and 620b of layout design 600 replace corresponding conductive feature patterns 420a and 420b, and similar detailed description is therefore omitted.

The set of conductive feature patterns 620 is usable to manufacture a corresponding set of conductors 720 of integrated circuit 700 (FIGS. 7A-7C). In some embodiments, conductive feature patterns 620a, 620b, 420c of the set of conductive feature patterns 620 are usable to manufacture corresponding conductors 720a, 720b, 520c of the set of conductive features 720 (FIGS. 7A-7C) of integrated circuit 700.

In comparison with conductive feature patterns 420a and 420b of FIGS. 4A-B, conductive feature patterns 620a and 620b do not have a saw-tooth shape or a staggered orientation relative to each other. For example, conductive feature pattern 620a does not include conductive feature patterns 420a2, and conductive feature pattern 620b does not include conductive feature patterns 420b2 and 420b3.

At least conductive feature pattern 620a or 620b has width $BM1_{PW2a}$ in the second direction Y. Each conductive feature pattern 620a or 620b is separated from conductive feature pattern 420c in the second direction Y by distance $BM1_{S1a}$. Layout design 600 has cell height CH2a in the second direction. In some embodiments, the cell height of layout design 600 is greater than the cell height of layout design 400, and therefore the spacing $BM1_{SW1b}$ between conductive feature pattern 420c and conductive feature patterns 620a and 620b is sufficient to not use the sawtooth shape.

In some embodiments, layout design 600 satisfies the first set of design rules. For example, in some embodiments, the non-staggered power delivery layout similar to the set of conductive feature patterns 620 is used when a layout design (e.g., layout design 600) satisfies the first set of design rules. In some embodiments, the first set of design rules is related to the cell height CH2a of layout design 600.

In some embodiments, the cell height CH2a of layout design 600 is determined according to formula 1 (described above). In some embodiments, the first set of design rules includes whether the width $BV0_{W1a}$ of each via pattern of the set of via patterns 130 of layout design 600 satisfies formula 2 (described above).

In some embodiments, the non-staggered power delivery network layout to the set of conductive feature patterns 620 is used when the width $BV0_{W1a}$ of each via pattern of the set of via patterns 130 of layout design 600 is greater than or equal to formula 2. In other words, if the width $BV0_{W1a}$ of each via pattern of the set of via patterns 130 of the layout design (e.g., layout design 600) is equal to or greater than the values of formula 2, then the first set of design rules are satisfied, and formula 2 is not satisfied. In some embodiments, if formula 2 is not satisfied, then a power delivery network layout similar to the set of conductive feature patterns 420 (FIGS. 4A-4B) is used.

Other widths for the set of conductive feature patterns 620 or other numbers of conductive feature patterns in the set of conductive feature patterns 620 are within the scope of the present disclosure. In some embodiments, at least conductive feature pattern 620a has a width different from conductive feature pattern 620b.

Other configurations, arrangements on other layout levels or quantities of patterns in the set of conductive feature patterns 620 are within the scope of the present disclosure.

In some embodiments, by layout design 600 including the set of conductive feature patterns 620, layout design 600 achieves one or more of the benefits discussed above in FIGS. 1A-5E.

FIGS. 7A-7C are diagrams of an integrated circuit 700, in accordance with some embodiments.

FIG. 7A is a top view of integrated circuit 700, in accordance with some embodiments. FIG. 7B is a top view of a corresponding portion 700B of integrated circuit 700 of FIG. 7A, simplified for ease of illustration. FIG. 7B is a diagram of integrated circuit 700 and includes portion 700B, simplified for ease of illustration. Integrated circuit 700 includes portion 700B and the M0 level.

FIG. 7C is a cross-sectional view of integrated circuit 700 as intersected by plane E-E', in accordance with some embodiments.

Integrated circuit 700 is manufactured by layout design 600. Structural relationships including alignment, lengths and widths, as well as configurations and layers of integrated circuit 700 are similar to the structural relationships and configurations and layers of layout design 600 of FIGS. 6A-6B, and similar detailed description will not be described in at least FIGS. 7A-7C, for brevity.

Integrated circuit 700 is a variation of integrated circuit 500 (FIGS. 5A-5C), and similar detailed description is therefore omitted. For example, integrated circuit 700 illustrates an example of where the set of conductors 720 does not have a saw-tooth shape. Stated differently, the set of conductors 720 does not include extended regions 720a2, 720b2 or 720b3 in a staggered orientation relative to each other.

In comparison with integrated circuit 500 of FIGS. 5A-5B, set of conductors 720 of integrated circuit 700 replaces the set of conductors 520, and similar detailed description is therefore omitted.

Integrated circuit 700 includes at least the set of active regions 202, the set of gates 204, an insulating region 205, the set of conductors 206, the set of conductors 210, the set of vias 208, the set of vias 212, the set of conductors 720 (also referred to as a set of power rails 720), the set of vias 230, and a set of conductors 260.

The set of conductors 720 includes one or more conductors 720a, 720b or 520c.

In comparison with integrated circuit 500 of FIGS. 5A-5B, conductors 720a and 720b of integrated circuit 700 replace corresponding conductors 520a and 520b, and similar detailed description is therefore omitted.

The set of conductive features 620 is usable to manufacture a corresponding set of conductors 720 of integrated circuit 700 (FIGS. 7A-7C). In some embodiments, conductive features 620a, 620b, 420c of the set of conductive features 620 are usable to manufacture corresponding conductors 720a, 720b, 520c of the set of conductors 720 (FIGS. 7A-7C) of integrated circuit 700.

In comparison with conductors 520a and 520b of FIGS. 5A-5C, conductors 720a and 720b do not have a saw-tooth shape or a staggered orientation relative to each other. For example, conductor 720a does not include conductors 520a2, and conductor 720b does not include conductors 720b2 and 720b3.

At least conductor 720a or 720b has width $BM1_{PW2b}$ in the second direction Y. Each conductor 720a or 720b is separated from conductor 520c in the second direction Y by distance $BM1_{S1b}$. Integrated circuit 700 has cell height CH2b in the second direction Y. In some embodiments, the cell height of integrated circuit 700 is greater than the cell height of integrated circuit 500, and therefore the spacing $BM1_{S1b}$ between conductor 520c and conductors 720a and 720b is sufficient to not use the saw-tooth shape.

In some embodiments, integrated circuit 700 satisfies the second set of design rules. For example, in some embodiments, the non-staggered power delivery similar to the set of conductors 720 is used when an integrated circuit (e.g., integrated circuit 700) satisfies the second set of design rules. In some embodiments, the second set of design rules is related to the cell height CH2b of integrated circuit 700.

In some embodiments, the cell height CH2b of integrated circuit 700 is determined according to formula 1 (described above). In some embodiments, the second set of design rules includes whether the width $BV0_{W1b}$ of each via of the set of vias 230 of integrated circuit 700 satisfies formula 2 (described above).

In some embodiments, the non-staggered power delivery network to the set of conductors 720 is used when the width $BV0_{W1b}$ of each via of the set of vias 230 of integrated circuit 500 is greater than or equal to formula 2. In other words, if the width $BV0_{W1b}$ of each via of the set of vias 230 of the integrated circuit (e.g., integrated circuit 700) is equal to or greater than the values of formula 2, then the second set of design rules are satisfied, and formula 2 is not satisfied. In some embodiments, if formula 2 is not satisfied, then a power delivery network similar to the set of conductors 520 (FIGS. 5A-5B) is used.

Other widths for the set of conductors 720 or other numbers of conductors in the set of conductors 720 are within the scope of the present disclosure. In some embodiments, at least conductor 720a has a width different from conductor 720b.

Other configurations, arrangements on other levels or quantities of conductors in the set of conductors 720 are within the scope of the present disclosure.

In some embodiments, by integrated circuit 700 including the set of conductors 720, integrated circuit 700 achieves one or more of the benefits discussed above in FIGS. 1A-5E.

Figure 8A:
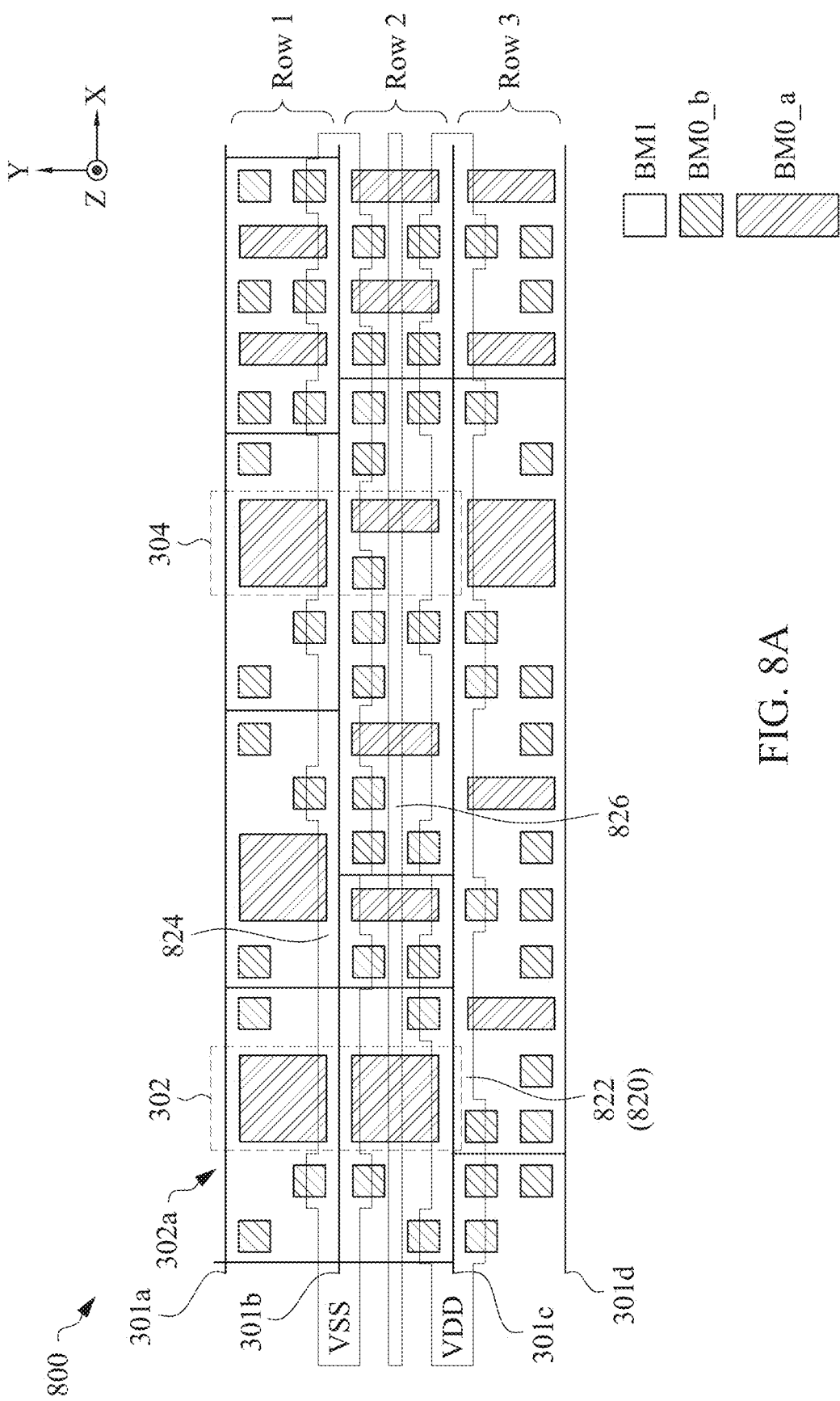
FIGS. 8A-8B are diagrams of corresponding integrated circuits, in accordance with some embodiments.
Figure 8B:
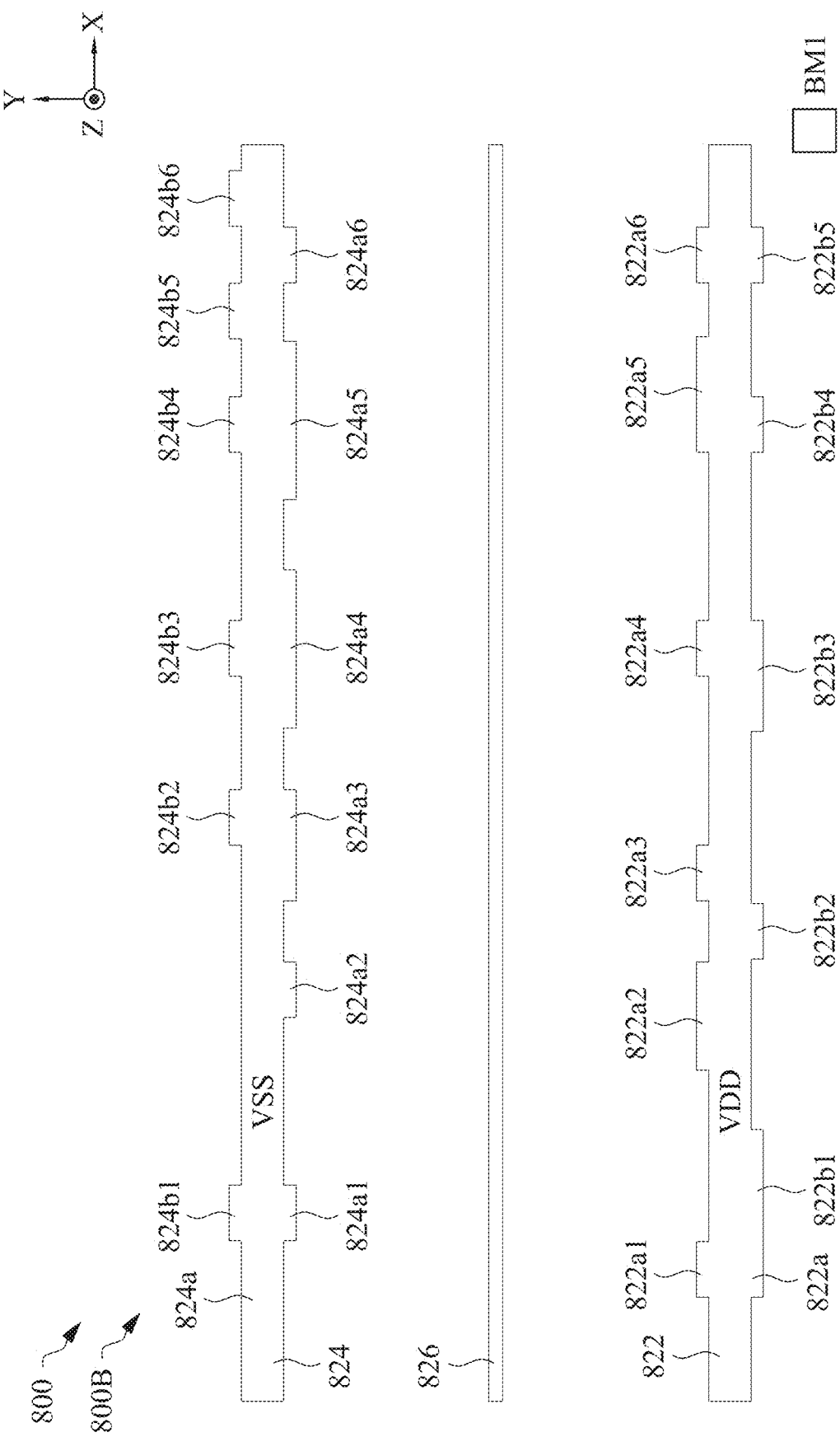

FIGS. 8A-8B are diagrams of integrated circuit 800, in accordance with some embodiments.

FIG. 8A is a top view of integrated circuit 800, in accordance with some embodiments.

FIG. 8B is a top-view of a portion 800B of the set of conductors 820 of integrated circuit 800, in accordance with some embodiments.

Integrated circuit 800 is a variation of integrated circuit 300A (FIG. 3A), and similar detailed description is therefore omitted. For example, integrated circuit 800 illustrates an example of where the set of conductors 820 replaces the set of conductors 320 of FIG. 3A, and similar detailed description is therefore omitted. Stated differently, the set of conductors 820 has a saw-tooth shape, and further includes a signal line (e.g., conductor 826).

Integrated circuit 800 includes array of cells 302a of FIG. 3A arranged in 3 rows and at least 2 columns. Other row numbers and column numbers are within the scope of the present disclosure. In some embodiments, each cell of the array of cells 302a corresponds to a cell manufactured by layout design 400. In some embodiments, each cell of the array of cells 302a corresponds to a portion of integrated circuit 500, simplified for ease of illustration.

The set of conductors 820 includes one or more of conductors 822, 824 or 826. In some embodiments, the set of conductors 820 includes more conductors than conductors 822, 824 and 826 (similar to FIGS. 3A-3B), but is simplified for ease of illustration. In some embodiments, each row of cells is overlapped by 3 conductors similar to each of conductors 822, 824 or 826.

In some embodiments, set of conductors 820 in integrated circuit 800 are similar to the set of conductors 520 of integrated circuit 500, and similar detailed description is omitted for brevity.

In some embodiments, conductors 822 and 824 are not inbound power rails. In some embodiments, each cell in array of cells shares a VSS power rail (e.g., conductor 824) with an adjacent row of cells, and shares a VDD power rail (e.g., conductor 822) with another adjacent rows of cells. For example, in some embodiments, cell 302 shares a VSS power rail (e.g., conductor 824) with cells in row 1, and shares a VDD power rail (e.g., conductor 822) with cells in row 3.

Conductor 822 overlaps rows 2-3 of array of cells 302a, and provides voltage VDD to cells in rows 2-3. Conductor 824 overlaps rows 1-2 of array of cells 302a, and provides reference voltage VSS to cells in rows 1-2.

Conductor 822 includes conductor 822a coupled to extended conductor portions 822a1, 822a2, . . . , 822a6 and extended conductor portions 822b1, 822b2, . . . , 822b5. Conductor 822a and extended conductor portions 822a1, 822a2, . . . , 822a6 and extended conductor portions 822b1, 822b2, . . . , 822b5 are similar to conductors 520a1 and 520a2 and conductors 520b1, 520b2 and 520b3, and similar detailed description is omitted.

Conductor 824 includes conductor 824a coupled to extended conductor portions 824a1, 824a2, . . . , 824a6 and extended conductor portions 824b1, 824b2, . . . , 824b6. Conductor 824a and extended conductor portions 824a1, 824a2, . . . , 824a6 and extended conductor portions 824b1, 824b2, . . . , 824b6 are similar to conductors 520a1 and 520a2 and conductors 520b1, 520b2 and 520b3, and similar detailed description is omitted.

In some embodiments, when viewed from the bottom/backside (e.g., in the positive Z-direction) of integrated circuit 800, each extended conductor portions 822a1, 822a2, . . . , 822a6, each extended conductor portions 822b1, 822b2, . . . , 822b5, each extended conductor portion 824a1, 824a2, . . . , 824a6, and each extended conductor portion 824b1, 824b2, . . . , 824b6 overlaps BM0_b conductors to provide power (VDD/VSS) by vias in the VB0 layer.

In some embodiments, by integrated circuit 800 including the set of conductors 820, integrated circuit 800 achieves one or more of the benefits discussed above in FIGS. 1A-5E.

Other configurations, arrangements on other levels or quantities of conductors in integrated circuit 800 are within the scope of the present disclosure.

Figure 9:
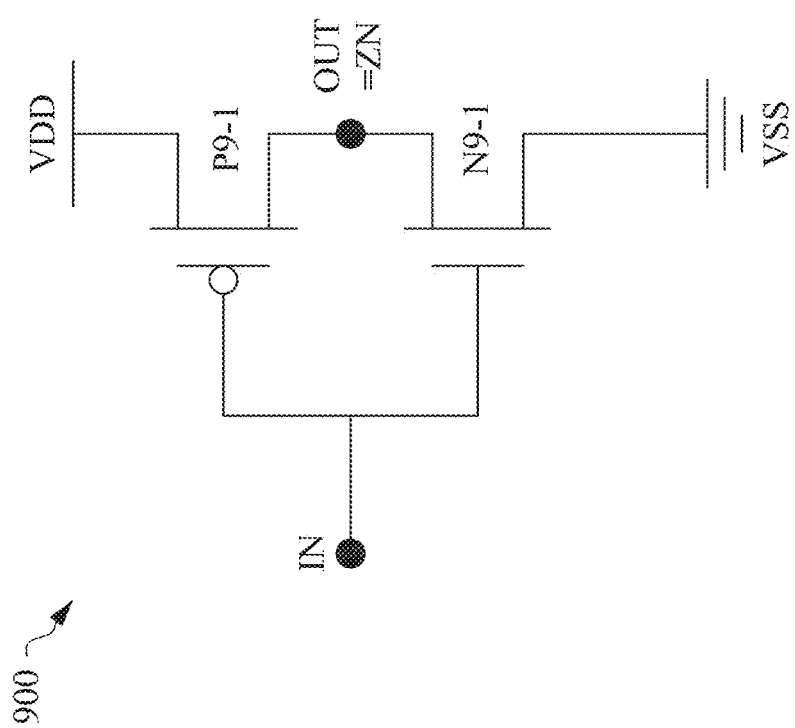
FIG. 9 is a circuit diagram of an integrated circuit, in accordance with some embodiments.

FIG. 9 is a circuit diagram of an integrated circuit 900, in accordance with some embodiments. In some embodiments, integrated circuit 900 is a complementary metal oxide semiconductor (CMOS) inverter circuit. A CMOS inverter circuit is used for illustration, other types of circuits are within the scope of the present disclosure.

Integrated circuit 900 includes a P-type metal oxide semiconductor (PMOS) transistor P9-1 coupled to an N-type metal oxide semiconductor (NMOS) transistor N9-1.

A gate terminal of PMOS transistor P9-1 and a gate terminal of NMOS transistor N9-1 are coupled together, and are configured as an input node IN. A drain terminal of PMOS transistor P9-1 and a drain terminal of NMOS transistor N9-1 are coupled together, and are configured as an output node OUT. A source terminal of PMOS transistor P9-1 is coupled to a voltage supply VDD. A source terminal of NMOS transistor N9-1 is coupled to a reference voltage supply VSS.

Figure 10A:
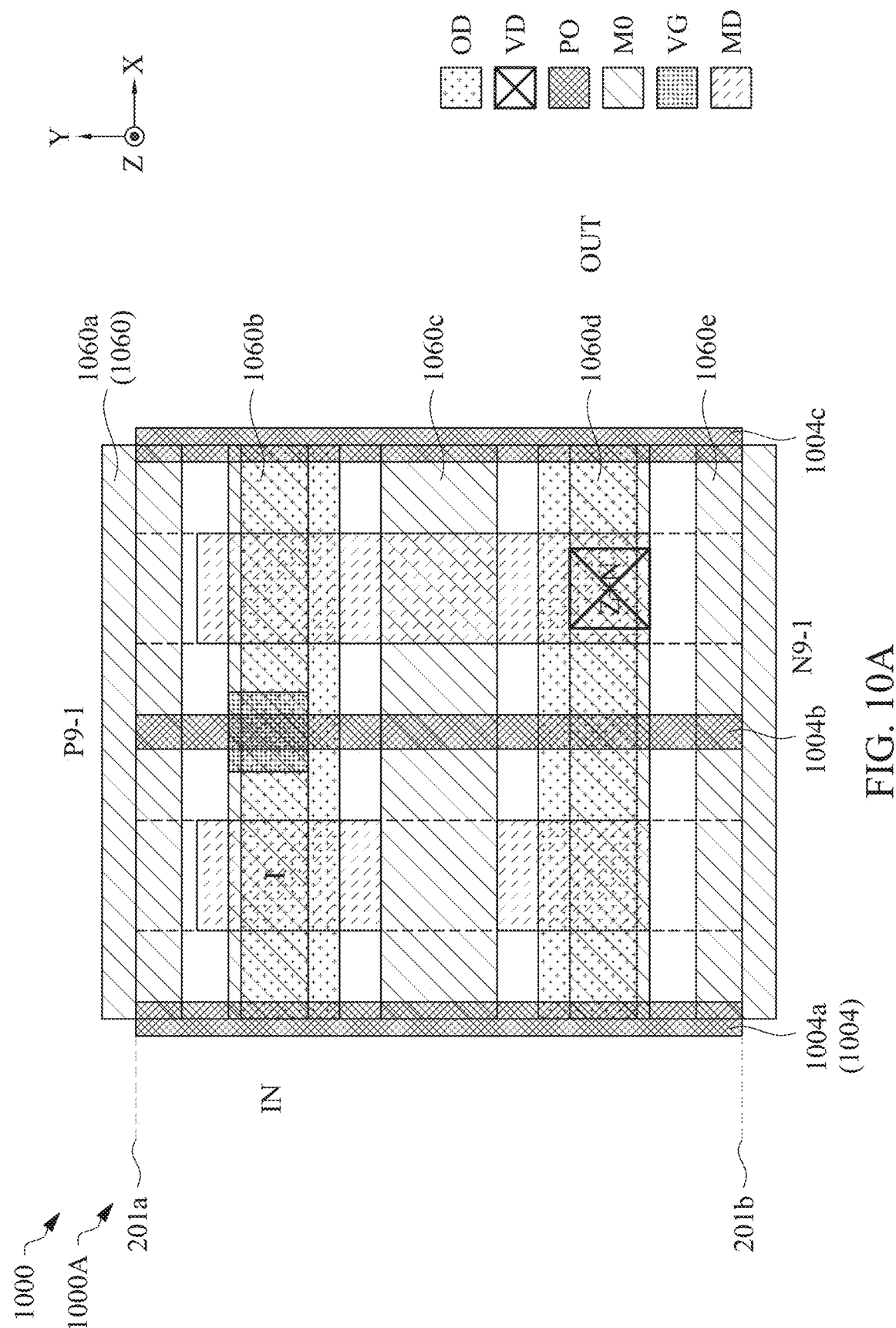
FIGS. 10A-10C are top views of corresponding portions of an integrated circuit, in accordance with some embodiments.
Figure 10B:
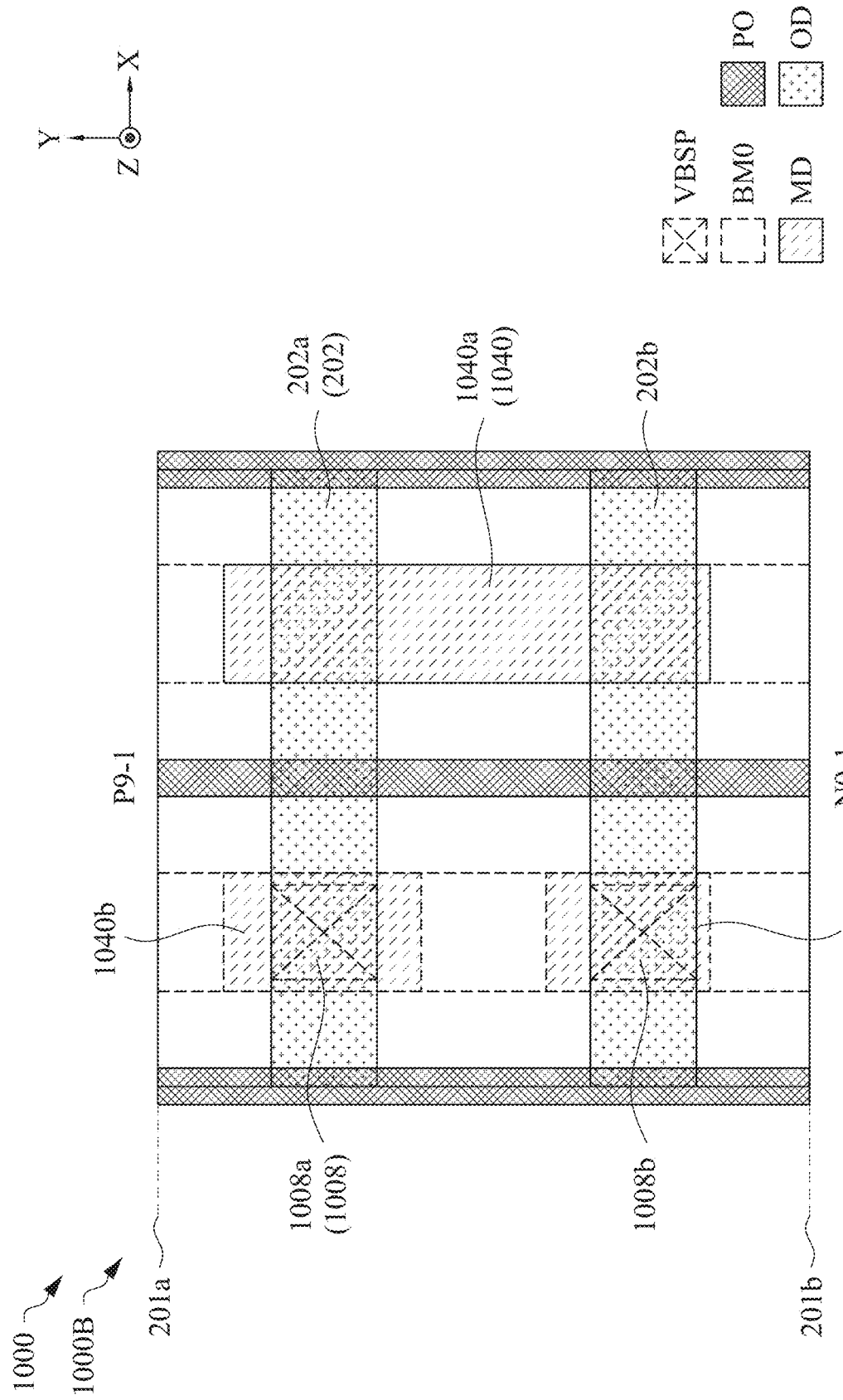
Figure 10C:
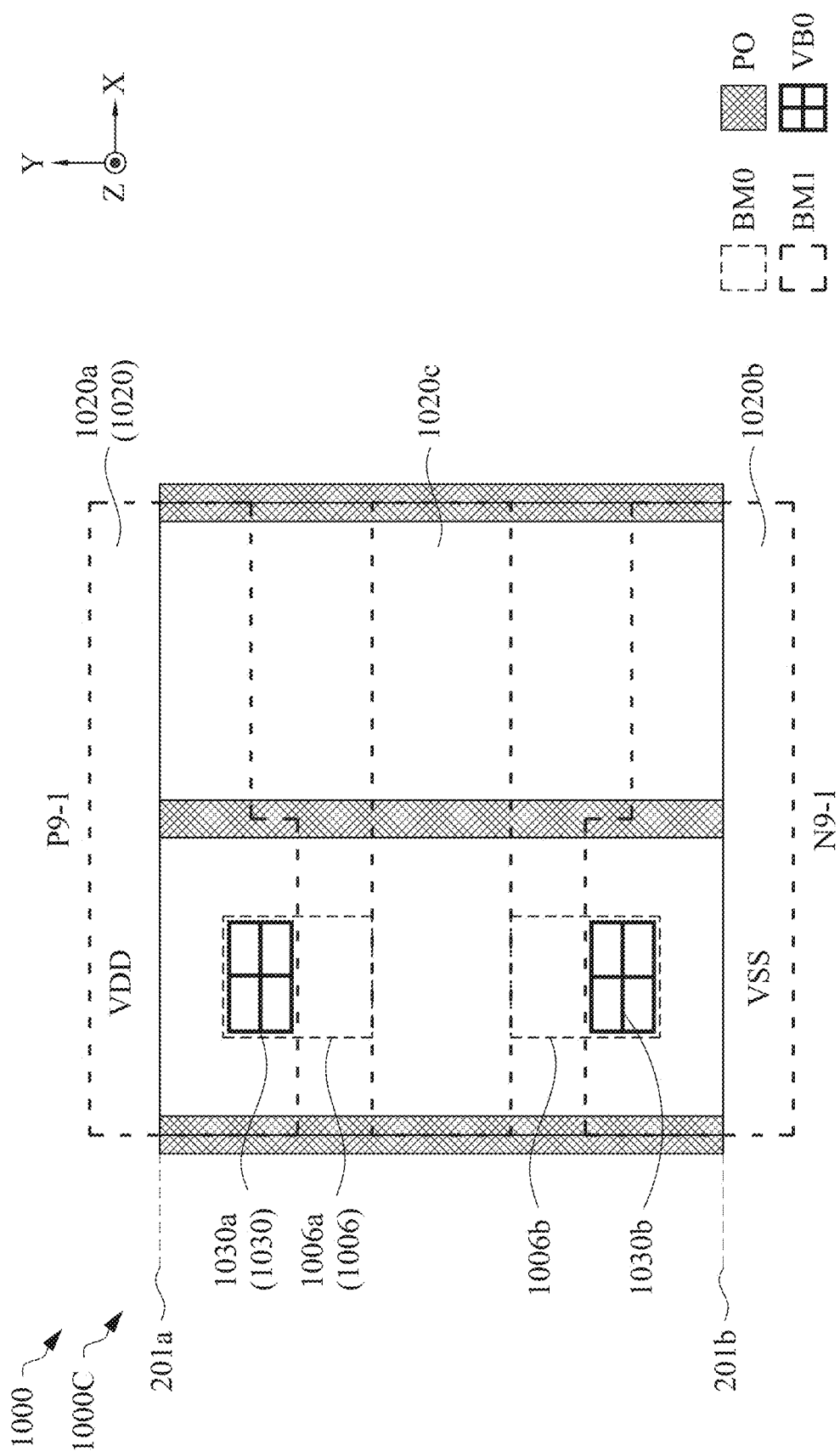

FIGS. 10A-10C are top views of corresponding portions 1000A-1000C of an integrated circuit 1000, in accordance with some embodiments.

Integrated circuit 1000 is manufactured by a corresponding layout design similar to integrated circuit 1000. For brevity FIGS. 10A-10C, 1200A-1200C, 1400A-1400C and 1600A-1600C are described as a corresponding integrated circuit 1000, 1200, 1400 and 1600, but in some embodiments, FIGS. 10A-10C, 12A-12C, 14A-14C and 16A-16C also correspond to layout designs similar to layout designs 100, 400, and 600, structural elements of integrated circuit 1000, 1200, 1400 and 1600 also correspond to layout patterns, and structural relationships including alignment, lengths and widths, as well as configurations and layers of a corresponding layout design of integrated circuit 1000, 1200, 1400 and 1600 are similar to the structural relationships and configurations and layers of integrated circuit 1000, 1200, 1400 and 1600, and similar detailed description will not be described for brevity.

Integrated circuit 1000 is an embodiment of integrated circuit 900.

FIG. 10A is a top view of a portion 1000A of integrated circuit 1000, simplified for ease of illustration. Portion 1000A includes one or more features of integrated circuit 1000 of the OD level, the POLY level, the metal over diffusion (MD) level, the M0 level, the via over gate (VG) level and the via over diffusion (VD) level of integrated circuit 1000.

FIG. 10B is a top view of a portion 1000B of integrated circuit 1000, simplified for ease of illustration. Portion 1000B includes one or more features of integrated circuit 1000 of the OD level, the POLY level, the MD level, the BM0 level and the VBS/P level of integrated circuit 1000.

FIG. 10C is a top view of a portion 1000C of integrated circuit 1000, simplified for ease of illustration. Portion 1000C includes one or more features of integrated circuit 1000 of the POLY level, the BM0 level, the BM1 level and the VB0 level of integrated circuit 1000.

In some embodiments, integrated circuit 1000, 1200, 1400 and 1600 includes additional elements not shown in FIGS. 10A-10C, 12A-12C, 14A-14C and 16A-16C.

Integrated circuit 1000 is a variation of integrated circuit 500 (FIGS. 5A-5E), and similar detailed description is therefore omitted. For example, integrated circuit 1000 illustrates an example of the CMOS inverter of integrated circuit 900 of FIG. 9 implemented with the details of integrated circuit 500 of FIGS. 5A-5E.

Integrated circuit 1000 includes at least the set of active regions 202, a set of gates 1004, a set of conductors 1006, a set of vias 1008, a set of conductors 1020, a set of vias 1030, a set of contacts 1040, a set of conductors 1060 and vias in the VG layer and vias in the VD layer. In some embodiments, vias in the VD layer between the set of contacts 1040 and the set of conductors 1060, and vias in the via VG layer between the set of gates 1004 and the set of conductors 1060 are not described for brevity, but are shown in FIGS. 10A-10C.

In comparison with integrated circuit 500 of FIGS. 5A-5E, the set of gates 1004 replaces the set of gates 204, the set of conductors 1006 replaces the set of conductors 206, the set of vias 1008 replaces the set of vias 208, the set of conductors 1020 replaces the set of conductors 520, the set of vias 1030 replaces the set of vias 230, and the set of conductors 1060 replaces the set of conductors 260, and similar detailed description of each set and each individual member within each corresponding set are therefore omitted.

In FIGS. 10A-10C, active region 202*a* corresponds to the active region (e.g., source/drain) of PMOS transistor P9-1, and active region 202*b* corresponds to the active region (e.g., source/drain) of NMOS transistor N9-1.

The set of gates 1004 includes at least gate 1004*a*, 1004*b* or 1004*c*. In FIGS. 10A-10C, gate 1004*b* corresponds to the gates of PMOS transistor P9-1 and NMOS transistor N9-1. In some embodiments, gates 1004*a* and 1004*c* are dummy gates.

The set of contacts 1040 includes one or more contacts 1040*a*, 1040*b* or 1040*c*. In some embodiments, the set of contacts are located on the MD level of integrated circuit 1000. In some embodiments, the MD level is between the OD level and the M0 level.

In some embodiments, contact 1040*a* corresponds to drain terminals of PMOS transistor P9-1 and NMOS transistor N9-1, and electrically couples the drains of PMOS transistor P9-1 and NMOS transistor N9-1 together. In some embodiments, contact 1040*b* corresponds to a source terminal of PMOS transistor P9-1 and is electrically coupled to the source of PMOS transistor P9-1. In some embodiments, contact 1040*c* corresponds to a source terminal of NMOS transistor N9-1 and is electrically coupled to the source of NMOS transistor N9-1.

The set of conductors 1006 includes at least conductor 1006*a* or 1006*b*.

The set of vias 1008 includes at least via 1008*a* or 1008*b*.

The set of conductors 1020 includes at least conductor 1020*a*, 1020*b* or 1020*c*. Conductor 1020*a* is the VDD power rail, and conductor 1020*b* is the VSS power rail.

The set of vias 1030 includes at least via 1030*a* or 1030*b*.

Conductor 1020*a* is electrically coupled to and configured to provide voltage VDD to the source of PMOS transistor P9-1. For example, conductor 1020*a* is electrically coupled to conductor 1006*a* by via 1030*a*, and conductor 1006*a* is electrically coupled to the source of PMOS transistor P9-1 by via 1008*a*.

Conductor 1020*b* is electrically coupled to and configured to provide reference voltage VSS to the source of NMOS transistor N9-1. For example, conductor 1020*b* is electrically coupled to conductor 1006*b* by via 1030*b*, and conductor 1006*b* is electrically coupled to the source of NMOS transistor N9-1 by via 1008*b*.

The set of conductors 1060 includes at least conductor 1060*a*, 1060*b*, 1060*c*, 1060*d* or 1060*e*. In some embodiments, the set of conductors 1060 are configured as the input node IN and the output node OUT of integrated circuit 900. For example, in some embodiments, conductor 1060*b* is the input node IN, and conductor 1060*d* is the output node OUT. In some embodiments, integrated circuit 1000 achieves one or more of the benefits discussed above in FIGS. 1A-5E. In some embodiments, one or more of drains or sources are flipped with the other.

Other configurations, arrangements on other levels or quantities of conductors in integrated circuit 1000 are within the scope of the present disclosure.

Figure 11:
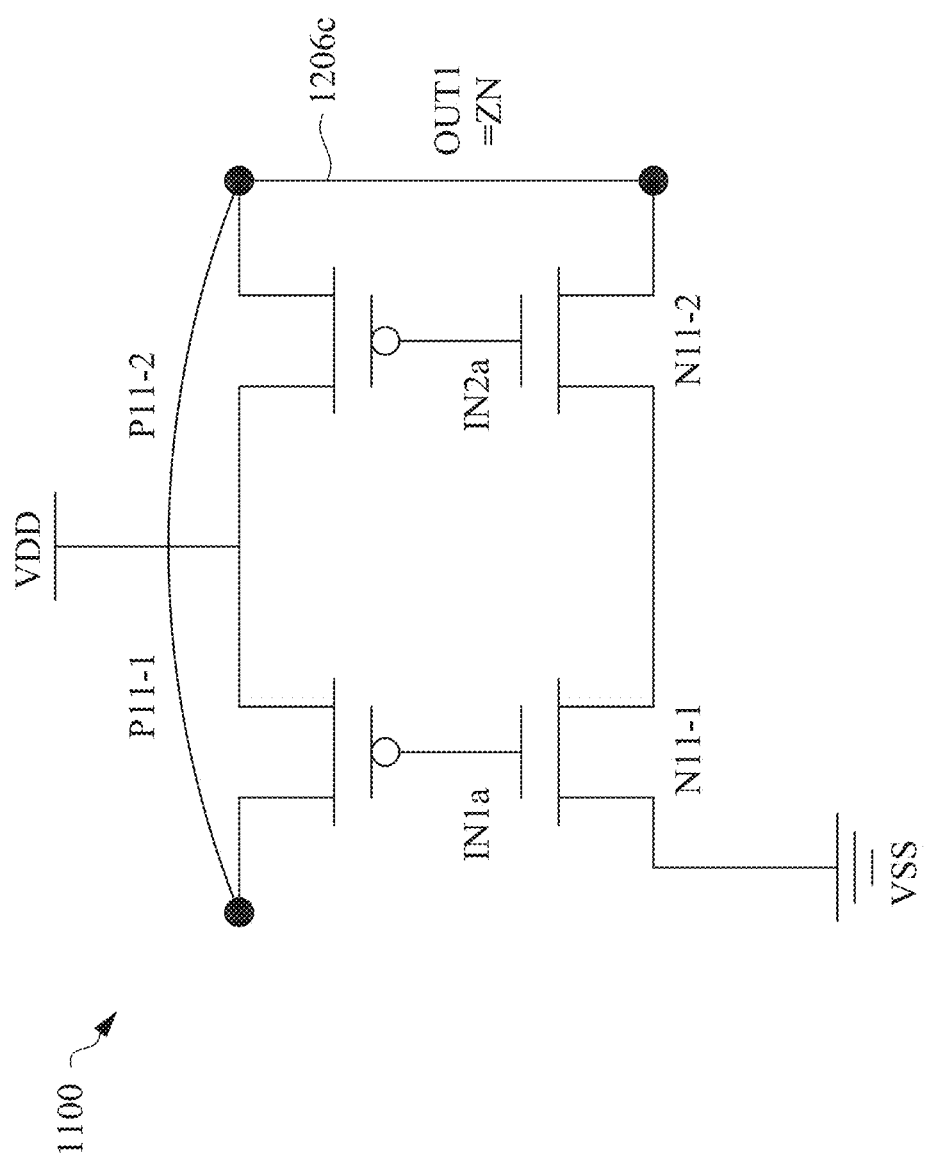
FIG. 11 is a circuit diagram of an integrated circuit, in accordance with some embodiments.

FIG. 11 is a circuit diagram of an integrated circuit 1100, in accordance with some embodiments. In some embodiments, integrated circuit 1100 is a NAND gate. A NAND gate is used for illustration, other types of circuits are within the scope of the present disclosure.

Integrated circuit 1100 includes PMOS transistors P11-1 and P11-2 coupled to NMOS transistors N11-1 and N11-2.

A gate terminal of PMOS transistor P11-1 and a gate terminal of NMOS transistor N11-1 are coupled together, and are configured as an input node IN1*a*. A gate terminal of PMOS transistor P11-2 and a gate terminal of NMOS transistor N11-2 are coupled together, and are configured as an input node IN2*a*.

A source terminal of PMOS transistor P11-1 and a source terminal of PMOS transistor P11-2 are coupled to the voltage supply VDD. A source terminal of NMOS transistor N11-1 is coupled to the reference voltage supply VSS. A source terminal of NMOS transistor N11-2 and a drain terminal of NMOS transistor N11-1 are coupled to each other.

A drain terminal of PMOS transistor P11-1, a drain terminal of PMOS transistor P11-2, and a drain terminal of NMOS transistor N11-2 are coupled to each other, and are configured as an output node OUT1. As shown in FIG. 11, the drain terminal of PMOS transistor P11-2 and the drain terminal of NMOS transistor N11-2 are electrically coupled by at least conductor 1206*c* (described in FIGS. 12A-12C). In some embodiments, one or more of the drains or sources are flipped with the other.

Figure 12A:
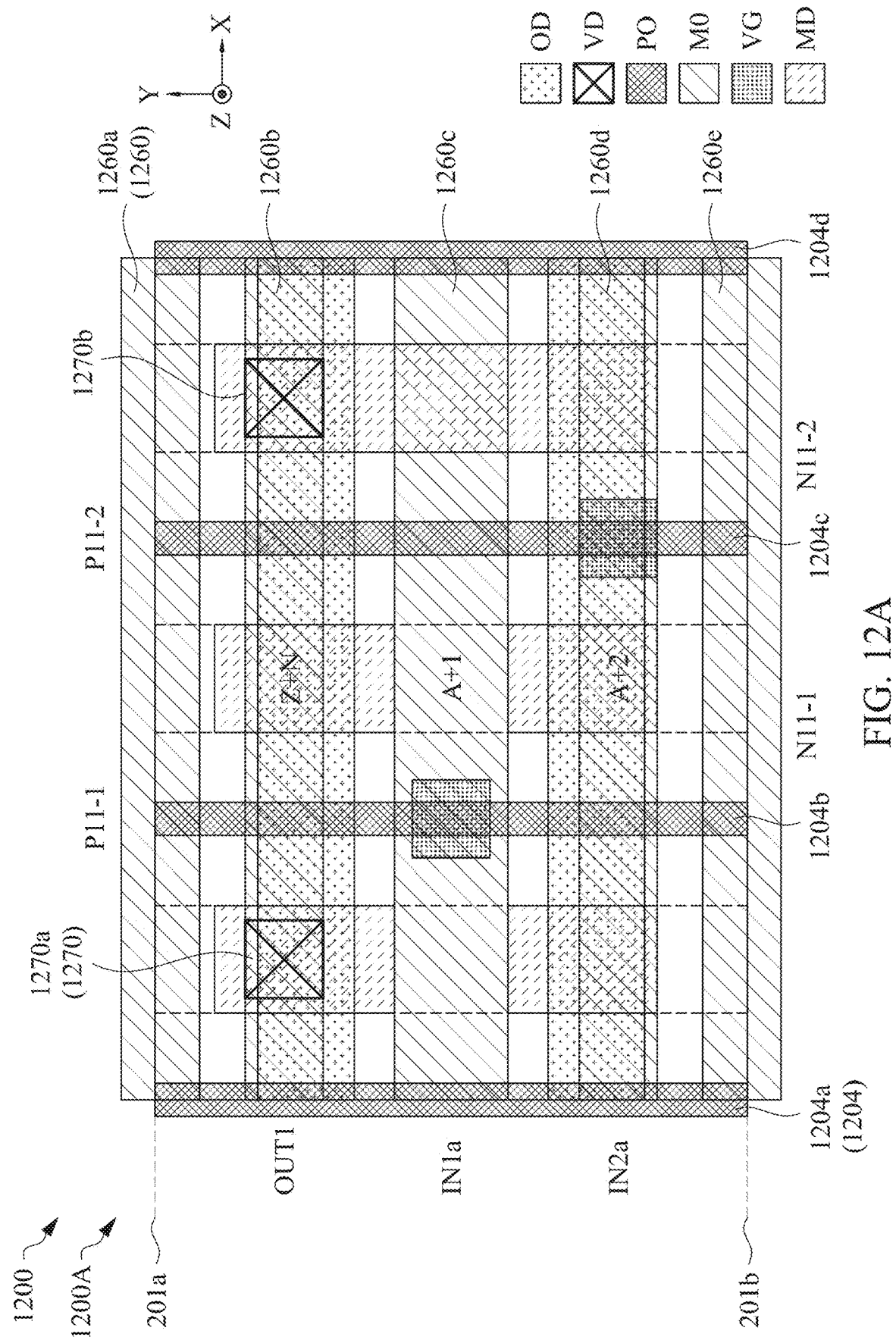
FIGS. 12A-12C are top views of corresponding portions of an integrated circuit, in accordance with some embodiments.
Figure 12B:
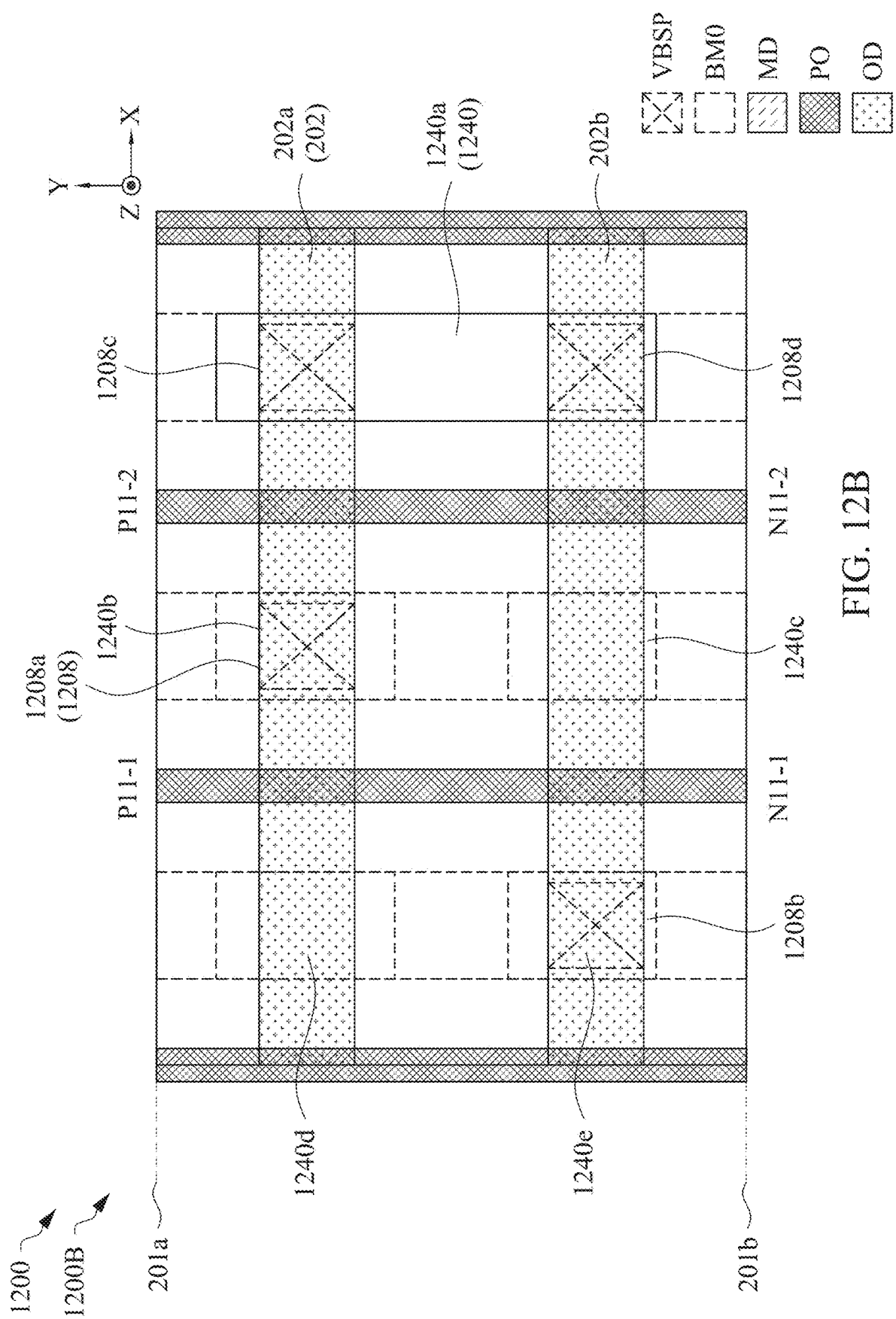
Figure 12C:
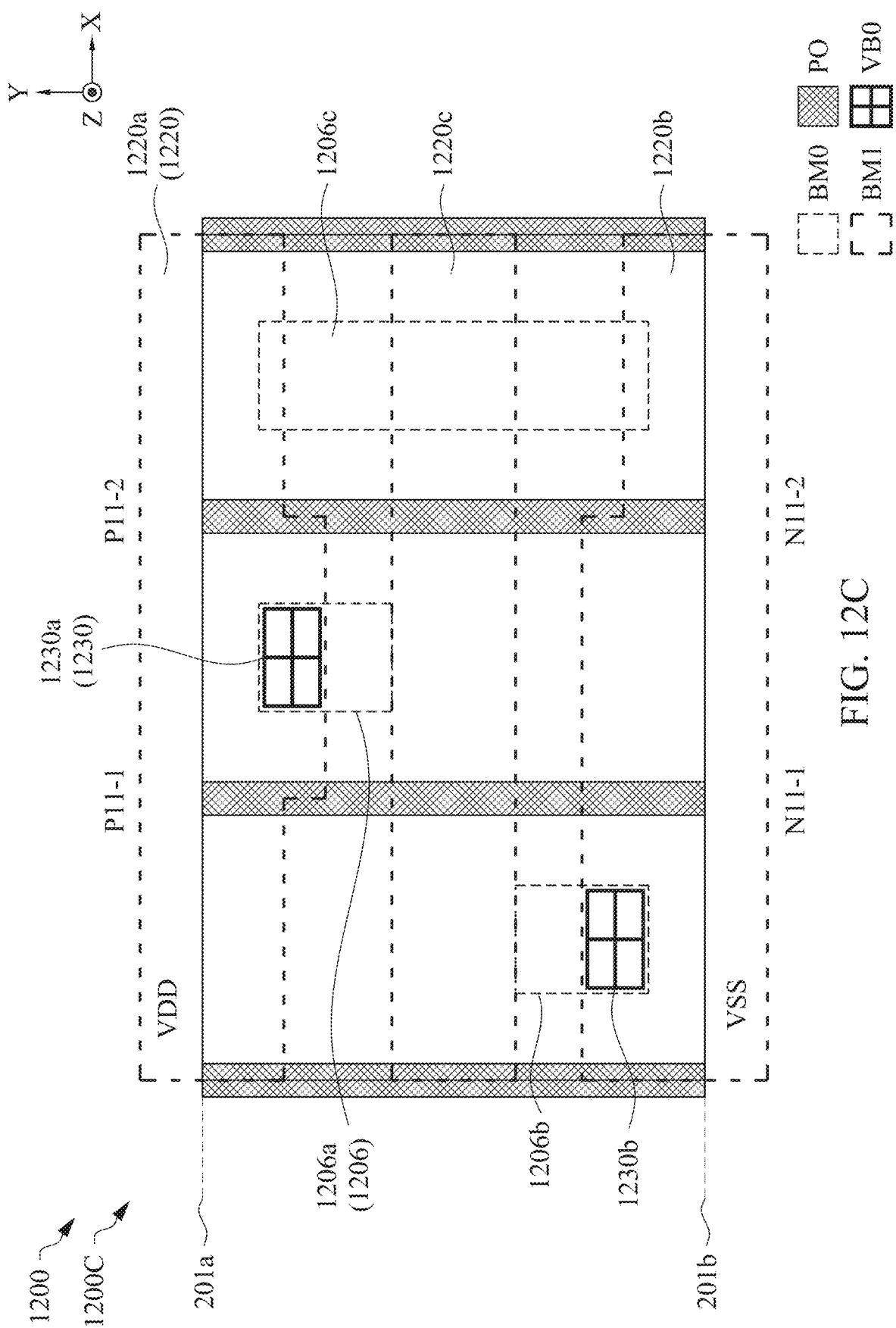

FIGS. 12A-12C are top views of corresponding portions 1200A-1200C of an integrated circuit 1200, in accordance with some embodiments.

Integrated circuit 1200 is manufactured by a corresponding layout design similar to integrated circuit 1200.

Integrated circuit 1200 is an embodiment of integrated circuit 1100.

FIG. 12A is a top view of a portion 1200A of integrated circuit 1200, simplified for ease of illustration. Portion 1200A includes one or more features of integrated circuit 1200 of the OD level, the POLY level, the MD level, the M0 level, the VG level and the VD level of integrated circuit 1200.

FIG. 12B is a top view of a portion 1200B of integrated circuit 1200, simplified for ease of illustration. Portion 1200B includes one or more features of integrated circuit 1200 of the OD level, the POLY level, the MD level, the BM0 level and the VBS/P level of integrated circuit 1200.

FIG. 12C is a top view of a portion 1200C of integrated circuit 1200, simplified for ease of illustration. Portion 1200C includes one or more features of integrated circuit 1200 of the POLY level, the BM0 level, the BM1 level and the VB0 level of integrated circuit 1200.

Integrated circuit 1200 is a variation of integrated circuit 500 (FIGS. 5A-5E) or integrated circuit 1000 (FIGS. 10A-10C), and similar detailed description is therefore omitted. For example, integrated circuit 1200 illustrates an example of the NAND gate of integrated circuit 1100 of FIG. 11 implemented with the details of integrated circuit 500 or 1000.

Integrated circuit 1200 includes at least the set of active regions 202, a set of gates 1204, a set of conductors 1206, a set of vias 1208, a set of conductors 1220, a set of vias 1230, a set of contacts 1240, a set of conductors 1260 and vias in the VG layer and set of vias 1270 in the VD layer. In some embodiments, vias in the VD layer between the set of contacts 1240 and the set of conductors 1260, and vias in the VG layer between the set of gates 1204 and the set of conductors 1260 are not described for brevity, but are shown in FIGS. 12A-12C.

In comparison with integrated circuit 500 of FIGS. 5A-5E, the set of gates 1204 replaces the set of gates 204, the set of conductors 1206 replaces the set of conductors 206, the set of vias 1208 replaces the set of vias 208, the set of conductors 1220 replaces the set of conductors 520, the set of vias 1230 replaces the set of vias 230, and the set of conductors 1260 replaces the set of conductors 260, and similar detailed description of each set and each individual member within each corresponding set are therefore omitted.

In FIGS. 12A-12C, active region 202a corresponds to the active region (e.g., source/drain) of PMOS transistors P11-1 and P11-2, and active region 202b corresponds to the active region (e.g., source/drain) of NMOS transistors N11-1 and N11-2.

The set of gates 1204 includes at least gate 1204a, 1204b, 1204c or 1204d. In FIGS. 12A-12C, gate 1204b corresponds to the gates of PMOS transistor P11-1 and NMOS transistor N11-1. In FIGS. 12A-12C, gate 1204c corresponds to the gates of PMOS transistor P11-2 and NMOS transistor N11-2. In some embodiments, gates 1204a and 1204d are dummy gates.

The set of contacts 1240 includes one or more contacts 1240a, 1240b, 1240c, 1240d or 1240e. In some embodiments, the set of contacts 1240 are located on the MD level of integrated circuit 1200.

In some embodiments, contact 1240a corresponds to drain terminals of PMOS transistor P11-2 and NMOS transistor N11-2, and electrically couples the drains of PMOS transistor P11-2 and NMOS transistor N11-2 together.

In some embodiments, contact 1240b corresponds to a source terminal of PMOS transistor P11-1 or a source terminal of PMOS transistor P11-2, and is electrically coupled to the source of PMOS transistor P11-1 and the source of PMOS transistor P11-2.

In some embodiments, contact 1240c corresponds to a drain terminal of NMOS transistor N11-1 or a source terminal of NMOS transistor N11-2, and is electrically coupled to the drain of NMOS transistor N11-1 and the source of NMOS transistor N11-2.

In some embodiments, contact 1240d corresponds to a drain terminal of PMOS transistor P11-1 and is electrically coupled to the drain of PMOS transistor P11-1.

In some embodiments, contact 1240e corresponds to a source terminal of NMOS transistor N11-1 and is electrically coupled to the source of NMOS transistor N11-1.

The set of conductors 1206 includes at least conductor 1206a, 1206b or 1206c.

The set of vias 1208 includes at least via 1208a, 1208b, 1208c or 1208d.

The set of conductors 1220 includes at least conductor 1220a, 1220b or 1220c. Conductor 1220a is the VDD power rail, and conductor 1220b is the VSS power rail.

The set of vias 1230 includes at least via 1230a or 1230b.

Conductor 1220a is electrically coupled to and configured to provide voltage VDD to the source of PMOS transistors P11-1 and P11-2. For example, conductor 1220a is electrically coupled to conductor 1206a by via 1230a, and conductor 1206a is electrically coupled to the source of PMOS transistors P11-1 and P11-2 by via 1208a.

Conductor 1220b is electrically coupled to and configured to provide reference voltage VSS to the source of NMOS transistor N11-1. For example, conductor 1220b is electrically coupled to conductor 1206b by via 1230b, and conductor 1206b is electrically coupled to the source of NMOS transistor N11-1 by via 1208b.

Conductor 1206c electrically couples the drain of PMOS transistor P11-2 and the drain of NMOS transistor N11-2 together. For example, the drain of PMOS transistor P11-2 is electrically coupled to conductor 1206c by via 1208c, and conductor 1206c is electrically coupled to the drain of NMOS transistor N11-2 by via 1208d.

The set of conductors 1260 includes at least conductor 1260a, 1260b, 1260c, 1260d or 1260e. In some embodiments, the set of conductors 1260 are configured as input node IN1a, input node IN2a and the output node OUT1 of integrated circuit 1200. For example, in some embodiments, conductor 1260b is the output node OUT1, conductor 1260c is the input node IN1a, and conductor 1260d is the input node IN2a.

Conductor 1260b electrically couples the drain of PMOS transistor P11-1 and the drain of PMOS transistor P11-2 together. For example, the drain of PMOS transistor P11-1 is electrically coupled to contact 1240d, contact 1240d is electrically coupled to conductor 1206c by a via 1270a, conductor 1206c is electrically coupled to contact 1240a by a via 1270b, and contact 1240a is electrically coupled to the drain of PMOS transistor P11-2.

Via 1270a and via 1270b are part of the set of vias 1270. The set of vias 1270 are similar to the set of vias 1208, but are on the VD level, and similar detailed description is therefore omitted. In some embodiments, one or more of drains or sources are flipped with the other.

In some embodiments, integrated circuit 1200 achieves one or more of the benefits discussed above in FIGS. 1A-5E.

Other configurations, arrangements on other levels or quantities of conductors in integrated circuit 1200 are within the scope of the present disclosure.

Figure 13:
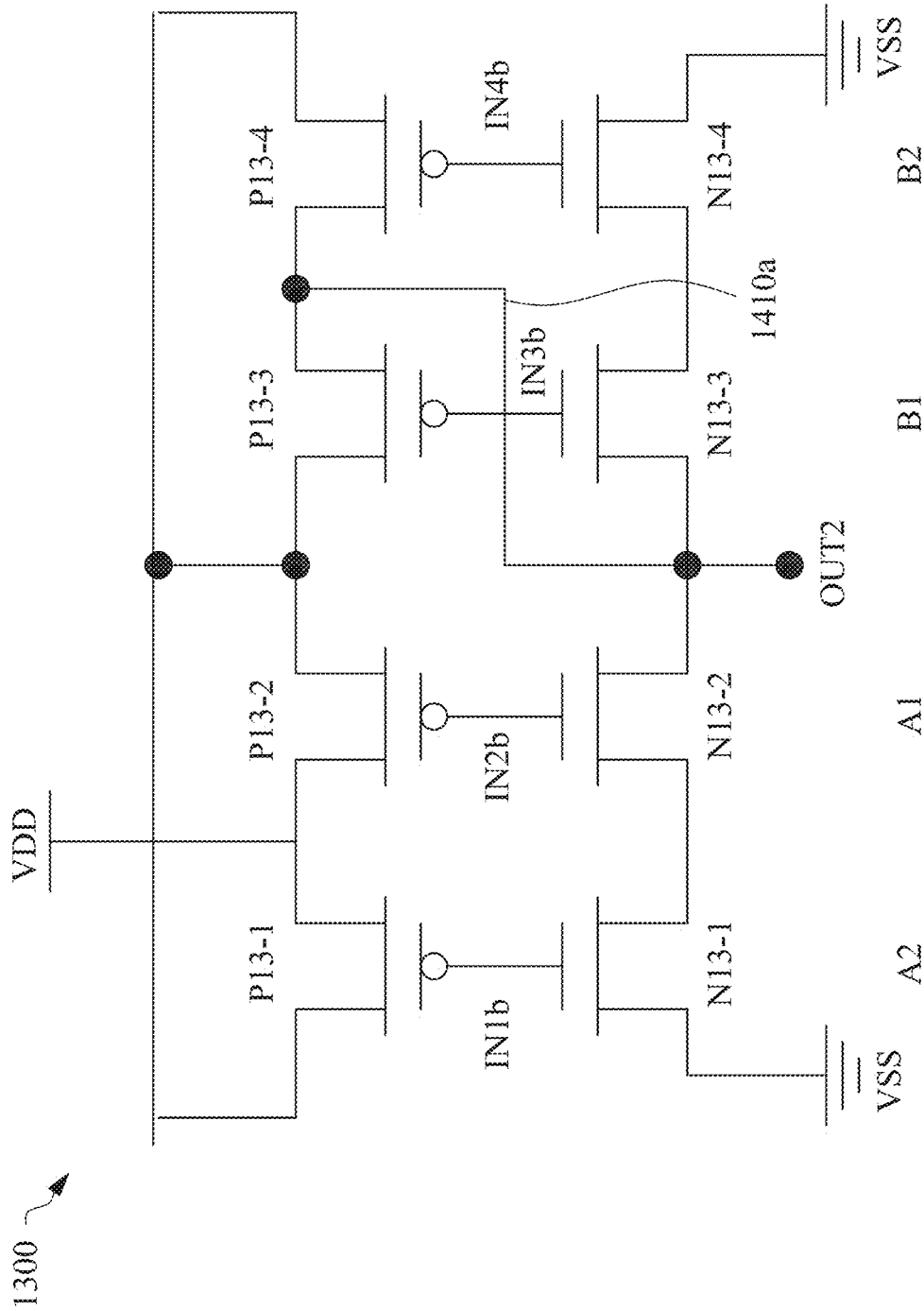
FIG. 13 is a circuit diagram of an integrated circuit, in accordance with some embodiments.

FIG. 13 is a circuit diagram of an integrated circuit 1300, in accordance with some embodiments. In some embodiments, integrated circuit 1300 is a 2-2 AND OR INVERT (AOI) circuit. A 2-2 AOI circuit is used for illustration, other types of circuits including other types of AOI circuits are within the scope of the present disclosure.

Integrated circuit 1300 includes PMOS transistors P13-1, P13-2, P13-3 and P13-4 coupled to NMOS transistors N13-1, N13-2, N13-3 and N13-4.

A gate terminal of PMOS transistor P13-1 and a gate terminal of NMOS transistor N13-1 are coupled together, and are configured as an input node IN1b. A gate terminal of PMOS transistor P13-2 and a gate terminal of NMOS transistor N13-2 are coupled together, and are configured as an input node IN2b. A gate terminal of PMOS transistor P13-3 and a gate terminal of NMOS transistor N13-3 are coupled together, and are configured as an input node IN3b. A gate terminal of PMOS transistor P13-4 and a gate terminal of NMOS transistor N13-4 are coupled together, and are configured as an input node IN4b.

A source terminal of PMOS transistor P13-1 and a source terminal of PMOS transistor P13-2 are coupled to the voltage supply VDD. A source terminal of NMOS transistor N13-1 and a source terminal of NMOS transistor N13-4 are each coupled to the reference voltage supply VSS.

A source terminal of NMOS transistor N13-2 and a drain terminal of NMOS transistor N13-1 are coupled to each other. A source terminal of NMOS transistor N13-3 and a drain terminal of NMOS transistor N13-4 are coupled to each other.

A source terminal of PMOS transistor P13-4, a source terminal of PMOS transistor P13-3, a drain terminal of PMOS transistor P13-2 and a drain terminal of PMOS transistor P13-1 are coupled to each other.

Figure 14A:
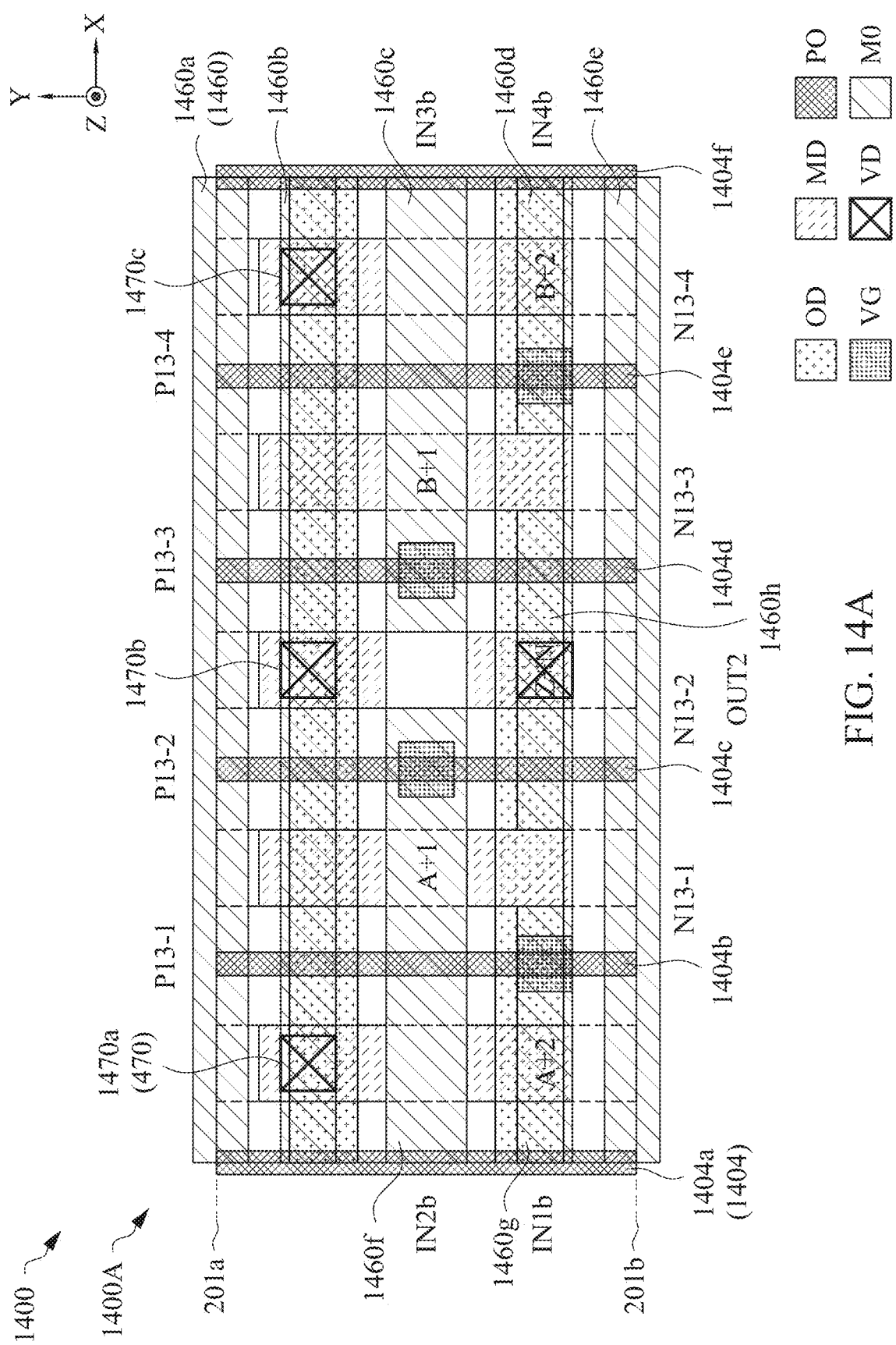
FIGS. 14A-14C are top views of corresponding portions of an integrated circuit, in accordance with some embodiments.
Figure 14B:
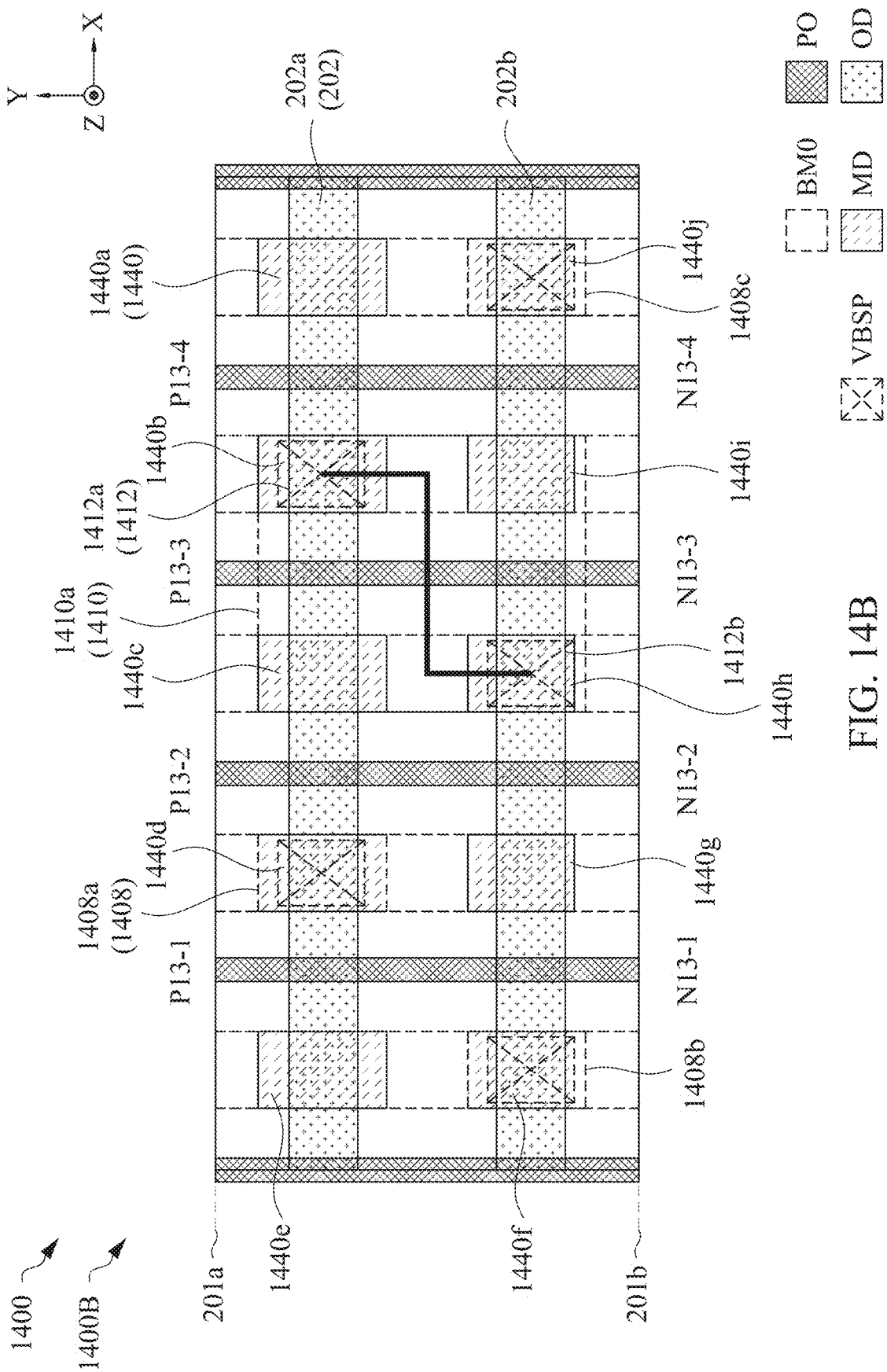
Figure 14C:
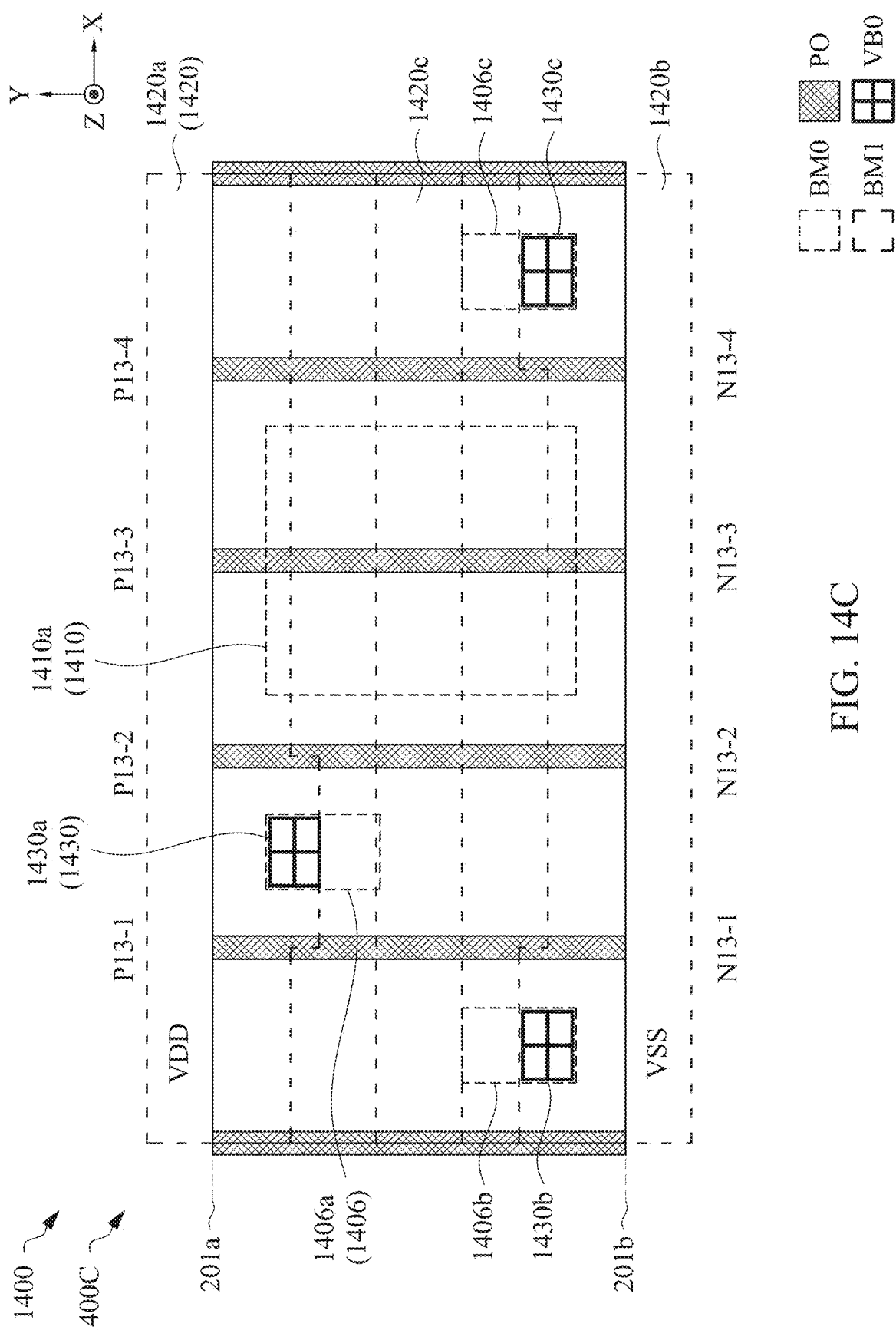

A drain terminal of PMOS transistor P13-4, a drain terminal of PMOS transistor P13-3, a drain terminal of NMOS transistor N13-2 and a drain terminal of NMOS transistor N13-3 are coupled to each other, and are configured as an output node OUT2. As shown in FIGS. 14A-14C, the drain terminals of PMOS transistors P13-3 and P13-4, and the drain terminals of NMOS transistors N13-2 and N13-3 are electrically coupled together by at least a conductor 1410a (described in FIGS. 14A-14C). In some embodiments, one or more of the drains or sources are flipped with the other.

Other configurations, arrangements or other circuits in integrated circuit 1300 are within the scope of the present disclosure.

FIGS. 14A-14C are top views of corresponding portions 1400A-1400C of an integrated circuit 1400, in accordance with some embodiments.

Integrated circuit 1400 is manufactured by a corresponding layout design similar to integrated circuit 1400. Integrated circuit 1400 is an embodiment of integrated circuit 1100.

FIG. 14A is a top view of a portion 1400A of integrated circuit 1400, simplified for ease of illustration. Portion 1400A includes one or more features of integrated circuit 1400 of the OD level, the POLY level, the MD level, the M0 level, the VG level and the VD level of integrated circuit 1400.

FIG. 14B is a top view of a portion 1400B of integrated circuit 1400, simplified for ease of illustration. Portion 1400B includes one or more features of integrated circuit 1400 of the OD level, the POLY level, the MD level, the BM0 level and the VBS/P level of integrated circuit 1400.

FIG. 14C is a top view of a portion 1400C of integrated circuit 1400, simplified for ease of illustration. Portion 1400C includes one or more features of integrated circuit 1400 of the POLY level, the BM0 level, the BM1 level and the VB0 level of integrated circuit 1400.

Integrated circuit 1400 is a variation of integrated circuit 500 (FIGS. 5A-5E), or integrated circuit 1000 (FIGS. 10A-10C) or integrated circuit 1200 (FIGS. 12A-12C), and similar detailed description is therefore omitted. For example, integrated circuit 1400 illustrates an example of AOI logic gate of integrated circuit 1300 of FIG. 13 implemented with the details of integrated circuit 500 or 1000.

Integrated circuit 1400 includes at least the set of active regions 202, a set of gates 1404, a set of conductors 1406, a set of vias 1408, a set of conductors 1410, a set of vias 1412, a set of conductors 1420, a set of vias 1430, a set of contacts 1440, a set of conductors 1460 and vias in the VG layer and set of vias 1470 in the VD layer. In some embodiments, vias in the VD layer between the set of contacts 1440 and the set of conductors 1460, and vias in the VG layer between the set of gates 1404 and the set of conductors 1460 are not described for brevity, but are shown in FIGS. 14A-14C.

In comparison with integrated circuit 500 of FIGS. 5A-5E, the set of gates 1404 replaces the set of gates 204, the set of conductors 1406 replaces the set of conductors 206, the set of vias 1408 replaces the set of vias 208, the set of conductors 1410 replaces the set of conductors 210, the set of vias 1408 replaces the set of vias 212, the set of conductors 1420 replaces the set of conductors 520, the set of vias 1430 replaces the set of vias 230, and the set of conductors 1460 replaces the set of conductors 260, and similar detailed description of each set and each individual member within each corresponding set are therefore omitted.

In FIGS. 14A-14C, active region 202a corresponds to the active region (e.g., source/drain) of PMOS transistors P13-1, P13-2, P13-3 and P13-4, and active region 202b corresponds to the active region (e.g., source/drain) of NMOS transistors N13-1, N13-2, N13-3 and N13-4.

The set of gates 1404 includes at least gate 1404a, 1404b, ..., 1404e or 1404f. In FIGS. 14A-14C, gate 1404b corresponds to the gates of PMOS transistor P13-1 and NMOS transistor N13-1. In FIGS. 14A-14C, gate 1404c corresponds to the gates of PMOS transistor P13-2 and NMOS transistor N13-2. In FIGS. 14A-14C, gate 1404d corresponds to the gates of PMOS transistor P13-3 and NMOS transistor N13-3. In FIGS. 14A-14C, gate 1404e corresponds to the gates of PMOS transistor P13-4 and NMOS transistor N13-4. In some embodiments, gates 1404a and 1404f are dummy gates.

The set of contacts 1440 includes one or more contacts 1440a, 1440b, 1440c, ..., 1440i or 1440j. In some embodiments, the set of contacts 1440 are located on the MD level of integrated circuit 1400.

In some embodiments, contact 1440a corresponds to a source terminal of PMOS transistor P13-4, and is electrically coupled to the source of PMOS transistor P13-4.

In some embodiments, contact 1440b corresponds to a drain terminal of PMOS transistor P13-4 or a drain terminal of PMOS transistor P13-3, and is electrically coupled to the drain of PMOS transistor P13-4 and the drain of PMOS transistor P13-3.

In some embodiments, contact 1440c corresponds to a source terminal of PMOS transistor P13-3 or a drain terminal of PMOS transistor P13-2, and is electrically coupled to the source of PMOS transistor P13-3 and the drain of PMOS transistor P13-2.

In some embodiments, contact 1440d corresponds to a source terminal of PMOS transistor P13-2 or a source terminal of PMOS transistor P13-1, and is electrically coupled to the source of PMOS transistor P13-2 and the source of PMOS transistor P13-1.

In some embodiments, contact 1440e corresponds to a drain terminal of PMOS transistor P13-1, and is electrically coupled to the drain of PMOS transistor P13-1.

In some embodiments, contact 1440f corresponds to a source terminal of NMOS transistor N13-1, and is electrically coupled to the source of NMOS transistor N13-1.

In some embodiments, contact 1440g corresponds to a drain terminal of NMOS transistor N13-1 or a source terminal of NMOS transistor N13-2, and is electrically coupled to the drain of NMOS transistor N13-1 and the source of NMOS transistor N13-2.

In some embodiments, contact 1440h corresponds to a drain terminal of NMOS transistor N13-2 or a drain terminal of NMOS transistor N13-3, and is electrically coupled to the drain of NMOS transistor N13-2 and the drain of NMOS transistor N13-3.

In some embodiments, contact 1440i corresponds to a source terminal of NMOS transistor N13-3 or a drain terminal of NMOS transistor N13-4, and is electrically coupled to the source of NMOS transistor N13-3 and the drain of NMOS transistor N13-4.

In some embodiments, contact 1440j corresponds to a source terminal of NMOS transistor N13-4, and is electrically coupled to the source of NMOS transistor N13-4.

The set of conductors 1406 includes at least conductor 1406a, 1406b or 1406c.

The set of vias 1408 includes at least via 1408a, 1408b or 1408c.

The set of conductors 1410 includes at least conductor 1410a.

The set of vias 1412 includes at least via 1412a or 1412b.

The set of conductors 1420 includes at least conductor 1420a, 1420b or 1420c. Conductor 1420a is the VDD power rail, and conductor 1420b is the VSS power rail.

The set of vias 1430 includes at least via 1430a, 1430b or 1430c.

Conductor 1420a is electrically coupled to and configured to provide voltage VDD to the source of PMOS transistors P13-1 and P13-2. For example, conductor 1420a is electrically coupled to conductor 1406a by via 1430a, and conductor 1406a is electrically coupled to the source of PMOS transistors P13-1 and P13-2 by via 1408a.

Conductor 1420b is electrically coupled to and configured to provide reference voltage VSS to the source of NMOS transistor N13-1 and the source of NMOS transistor N13-4. For example, conductor 1420b is electrically coupled to conductor 1406b by via 1430b, and conductor 1406b is electrically coupled to the source of NMOS transistor N13-1 by via 1408b. Furthermore, conductor 1420b is electrically coupled to conductor 1406c by via 1430c, and conductor 1406c is electrically coupled to the source of NMOS transistor N13-4 by via 1408c.

Conductor 1410a electrically couples the drains of PMOS transistors P13-3 and P13-4, and the drains of NMOS transistors N13-2 and N13-3 together. For example, the drain of PMOS transistor P13-3 and the drain of PMOS transistor P13-4 are electrically coupled to conductor 1410a by via 1412a, and conductor 1410a is electrically coupled to the drain of NMOS transistor N13-2 and the drain of NMOS transistor N13-3 by via 1412b.

The set of conductors 1460 includes at least conductor 1460a, 1460b, 1460c, 1460d, 1460e, 1460f, 1460g or 1460h. In some embodiments, the set of conductors 1460 are configured as input node IN1b, input node IN2b, input node IN1c, input node IN2d and output node OUT2 of integrated circuit 1400. For example, in some embodiments, conductor 1460c is input node IN3b, conductor 1460d is input node IN4b, conductor 1460f is input node IN2b, conductor 1460g is input node IN1b, and conductor 1460h is output node OUT2.

Conductor 1460b electrically couples each of the drain of PMOS transistor P13-1, the drain of PMOS transistor P13-2, the source of PMOS transistor P13-3 and the source of PMOS transistor P13-4 together. For example, conductor 1460b is electrically coupled to contact 1440e, 1440c, 1440a by a corresponding via 1470a, 1470b, 1470c. Contact 1440a is electrically coupled to the drain of PMOS transistor P13-4. Contact 1440c is electrically coupled to the drain of PMOS transistor P13-2 and the source of PMOS transistor P13-3. Contact 1440e is electrically coupled to the source of PMOS transistor P13-1.

Vias 1470a, 1470b and 1470c are part of the set of vias 1470. The set of vias 1470 are similar to the set of vias 1408, but are on the VD level, and similar detailed description is therefore omitted. In some embodiments, one or more of drains or sources are flipped with the other.

In some embodiments, integrated circuit 1400 achieves one or more of the benefits discussed above in FIGS. 1A-5E.

Other configurations, arrangements on other levels or quantities of conductors in integrated circuit 1400 are within the scope of the present disclosure.

Figure 15:
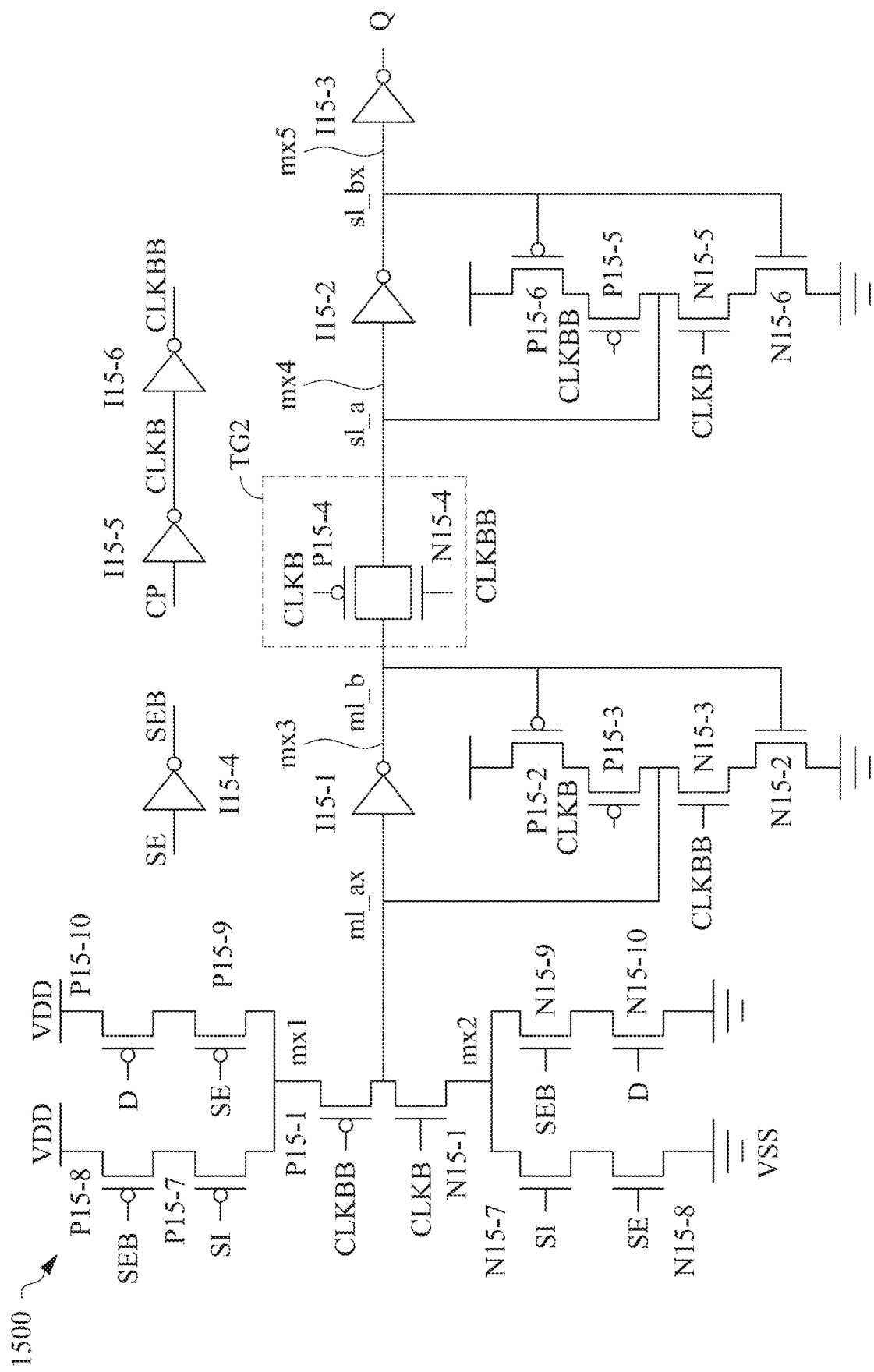
FIG. 15 is a circuit diagram of an integrated circuit, in accordance with some embodiments.

FIG. 15 is a circuit diagram of an integrated circuit 1500, in accordance with some embodiments.

In some embodiments, integrated circuit 1500 is a flip-flop circuit. In some embodiments, integrated circuit 1500 is a multi-bit flip-flop (MBFF) circuit.

Integrated circuit 1500 is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 1500 includes PMOS transistors P15-1, P15-2, P15-3, P15-4, P15-5, P15-6, P15-7, P15-8, P15-9 and P15-10, NMOS transistors N15-1, N15-2, N15-3, N15-4, N15-5, N15-6, N15-7, N15-8, N15-9 and N15-10, and inverters I15-1, I15-2, I15-3, I15-4, I15-5 and I15-6.

In some embodiments, signal sl_a is a latched version of signal SI or Ml_ax.

In some embodiments, NMOS transistor N15-1, PMOS transistor P15-1, NMOS transistors N15-2 and N15-3 and PMOS transistors P15-2 and P15-3 form a first latch (not labelled).

A gate terminal of PMOS transistor P15-1 is configured to receive clock signal CLKBB. A gate terminal of NMOS transistor N15-1 is configured to receive clock signal CLKB.

Each of a source terminal of PMOS transistor P15-1, a drain terminal of PMOS transistor P15-7, a drain terminal of PMOS transistor P15-9 and node mx1 are coupled together.

Each of a source terminal of NMOS transistor N15-1, a drain terminal of NMOS transistor N15-7, a drain terminal of NMOS transistor N15-9 and node mx2 are coupled together.

Each of the drain terminal of PMOS transistor P15-1, the drain terminal of NMOS transistor N15-1, a drain terminal of NMOS transistor N15-3, a drain terminal of PMOS transistor P15-3, and an input terminal of inverter I15-1 are coupled together.

A gate terminal of PMOS transistor P15-2 and a gate terminal of NMOS transistor N15-2 are coupled together, and are further coupled to at least node mx3.

A source terminal of PMOS transistor P15-2 is coupled to the voltage supply VDD. A drain terminal of PMOS transistor P15-2 is coupled to a source terminal of PMOS transistor P15-3.

A gate terminal of PMOS transistor P15-3 is configured to receive clock signal CLKB. In some embodiments, the gate terminal of PMOS transistor P15-3 is coupled to at least an output terminal of inverter I15-5.

A gate terminal of NMOS transistor N15-3 is configured to receive clock signal CLKBB. In some embodiments, the gate terminal of NMOS transistor N15-3 is coupled to at least an output terminal of inverter I15-6.

A source terminal of NMOS transistor N15-3 is coupled to a drain terminal of NMOS transistor N15-2. A source terminal of transistor N15-2 is coupled to the reference voltage supply VSS.

In some embodiments, inverter I15-1, a transmission gate TG2, NMOS transistors N15-5 and N15-6 and PMOS transistors P15-5 and P15-6 form a second latch (not labelled).

An input terminal of inverter I15-1 is configured to receive signal Ml_ax. An output terminal of inverter I15-1 is coupled to at least node mx3, and is configured to output a signal M1_b to the gate of PMOS transistor P15-2, the gate of NMOS transistors N15-2 and transmission gate TG2.

Transmission gate TG2 is coupled between node mx3 and node mx4. Transmission gate TG2 is configured to receive the signal Ml_b, clock signal CLKB and clock signal CLKBB. Transmission gate TG2 is configured to output signal Sl_a to inverter I15-2, PMOS transistor P15-5 and NMOS transistor N15-5. Transmission gate TG2 includes an NMOS transistor N15-4 and a PMOS transistor P15-4 that are coupled together.

A gate terminal of PMOS transistor P15-4 is configured to receive clock signal CLKB. A gate terminal of NMOS transistor N15-4 is configured to receive clock signal CLKBB.

Each of a source terminal of PMOS transistor P15-4, a source terminal of NMOS transistor N15-4, node mx3, the output terminal of inverter I15-1, the gate terminal of PMOS transistor P15-2 and the gate terminal of NMOS transistor N15-2 are coupled together. In some embodiments, a drain terminal of PMOS transistor P15-4 and a drain terminal of NMOS transistor N15-4 are coupled to node mx3, the output terminal of inverter I15-1, the gate terminal of PMOS transistor P15-2 and the gate terminal of NMOS transistor N15-2.

Each of the drain terminal of PMOS transistor P15-4, the drain terminal of NMOS transistor N15-4, node mx4, an input terminal of inverter I15-2, a drain terminal of NMOS transistor N15-5 and a drain terminal of PMOS transistor P15-5 are coupled together. In some embodiments, the source terminal of PMOS transistor P15-4 and the source terminal of NMOS transistor N15-4 are coupled to node mx4, an input terminal of inverter I15-2, a drain terminal of NMOS transistor N15-5 and a drain terminal of PMOS transistor P15-5.

A gate terminal of PMOS transistor P15-6 and a gate terminal of NMOS transistor N15-6 are coupled together, and are further coupled to at least node mx5.

A source terminal of PMOS transistor P15-6 is coupled to the voltage supply VDD. A drain terminal of PMOS transistor P15-6 is coupled to a source terminal of PMOS transistor P15-5.

A gate terminal of PMOS transistor P15-5 is configured to receive clock signal CLKBB. In some embodiments, the gate terminal of PMOS transistor P15-5 is coupled to at least an output terminal of inverter I15-6. Each of a drain terminal of PMOS transistor P15-5 and a drain terminal of NMOS transistor N15-5 are coupled to each other, and are further coupled to at least node mx4.

A gate terminal of NMOS transistor N15-5 is configured to receive clock signal CLKB. In some embodiments, the gate terminal of NMOS transistor N15-5 is coupled to at least an output terminal of inverter I15-5.

A source terminal of NMOS transistor N15-5 is coupled to a drain terminal of NMOS transistor N15-6. A source terminal of transistor N15-6 is coupled to the reference voltage supply VSS.

An input terminal of inverter I15-2 is coupled to at least node mx4, and is configured to receive signal Sl_a. An output terminal of inverter I15-2 is coupled to and configured to output a signal Sl_bx to at least an input terminal of inverter I15-3, the gate of PMOS transistor P15-6, the gate of NMOS transistor N15-6 or node mx5.

An input terminal of inverter I15-3 is coupled to at least node mx5, and is configured to receive the signal Sl_bx from inverter I15-2. An output terminal of inverter I15-3 is configured to output the output signal Q.

An input terminal of inverter I15-4 is configured to receive a scan enable signal SE. An output terminal of inverter I15-4 is configured to output an inverted scan enable signal SEB. In some embodiments, the output terminal of inverter I15-4 is coupled to at least a gate terminal of PMOS transistor P15-8 or a gate terminal of NMOS transistor N15-9.

An input terminal of inverter I15-5 is configured to receive a clock signal CP. An output terminal of inverter I15-5 is configured to output the clock signal CLKB to at least an input terminal of inverter I15-6. In some embodiments, the output terminal of inverter I15-5 is coupled to at least the gate terminal of PMOS transistor P15-3, the gate terminal of NMOS transistor N15-5, the gate terminal of PMOS transistor P15-4 or the gate terminal of NMOS transistor N15-1.

An input terminal of inverter I15-6 is coupled to at least the output terminal of inverter I15-5, and is configured to receive clock signal CLKB. An output terminal of inverter I15-6 is configured to output the clock signal CLKBB. In some embodiments, the output terminal of inverter I15-6 is coupled to and outputs the clock signal CLKBB to at least the gate terminal of PMOS transistor P15-5, the gate terminal of NMOS transistor N15-3, the gate terminal of PMOS transistor P15-1 or the gate terminal of NMOS transistor N15-4.

In some embodiments, NMOS transistors N15-7, N15-8, N15-9 and N15-10, and PMOS transistors P15-7, P15-8, P15-9 and P15-10 form a multiplexer (not labelled). In some embodiments, the positions of PMOS transistor P15-8 and signal SEB are swapped with the positions of PMOS transistor P15-7 and signal SI, and vice versa. In some embodiments, the positions of NMOS transistor N15-8 and signal SE are swapped with the positions of NMOS transistor N15-7 and signal SI, and vice versa.

A gate terminal of PMOS transistor P15-7 is configured to receive scan in signal SI. A gate terminal of NMOS transistor N15-7 is configured to receive scan in signal SI. In some embodiments, the gate terminal of PMOS transistor P15-7 is coupled to the gate terminal of NMOS transistor N15-7.

A source terminal of PMOS transistor P15-8 is coupled to the voltage supply VDD. A drain terminal of PMOS transistor P15-8 is coupled to a source terminal of PMOS transistor P15-7.

A gate terminal of PMOS transistor P15-8 is configured to receive inverted scan enable signal SEB.

A gate terminal of PMOS transistor P15-9 is configured to receive scan enable signal SE. A source terminal of PMOS transistor P15-9 is coupled to a drain terminal of PMOS transistor P15-10.

A source terminal of PMOS transistor P15-10 is coupled to the voltage supply VDD. A gate terminal of PMOS transistor P15-10 is configured to receive data signal D. A gate terminal of NMOS transistor N15-10 is configured to receive data signal D. In some embodiments, the gate terminal of PMOS transistor P15-10 is coupled to the gate terminal of NMOS transistor N15-10.

A source terminal of NMOS transistor N15-8 is coupled to the reference voltage supply VSS. A drain terminal of NMOS transistor N15-8 is coupled to a source terminal of NMOS transistor N15-7.

A gate terminal of NMOS transistor N15-8 is configured to receive scan enable signal SE. In some embodiments, the gate terminal of NMOS transistor N15-8 is coupled to the gate terminal of PMOS transistor P15-9.

A gate terminal of NMOS transistor N15-9 is configured to receive inverted scan enable signal SEB. In some embodiments, the gate terminal of NMOS transistor N15-9 is coupled to the gate terminal of PMOS transistor P15-8. A source terminal of NMOS transistor N15-9 is coupled to a drain terminal of NMOS transistor N15-10.

A source terminal of NMOS transistor N15-10 is coupled to the reference voltage supply VSS.

In some embodiments, inverter I15-1 includes an NMOS transistor N15-11 and a PMOS transistor P15-11 (not shown in FIG. 15). Inverter I15-2 includes an NMOS transistor N15-12 and a PMOS transistor P15-12 (not shown in FIG. 15). Inverter I15-3 includes an NMOS transistor N15-13 and a PMOS transistor P15-13 (not shown in FIG. 15). Inverter I15-5 includes NMOS transistor N15-14 and PMOS transistor P15-14 (not shown in FIG. 15). Inverter I15-6 includes NMOS transistor N15-15 and PMOS transistor P15-15 (not shown in FIG. 15). Inverter I15-4 includes NMOS transistor N15-16 and PMOS transistor P15-16 (not shown in FIG. 15). In some embodiments, one or more of the drains or sources are flipped with the other.

Other configurations, arrangements or other circuits in integrated circuit 1500 are within the scope of the present disclosure.

Figure 16A:
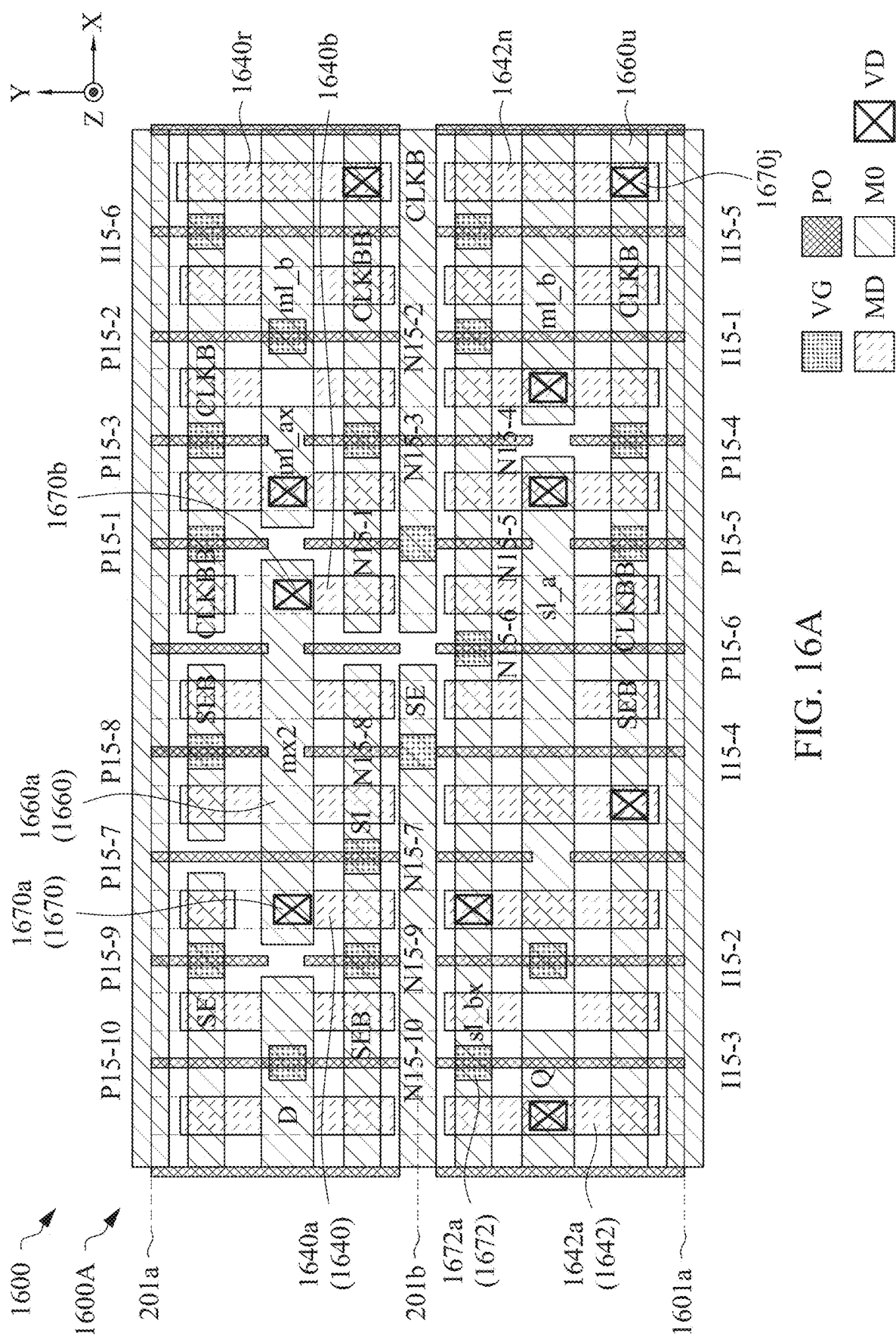
FIGS. 16A-16C are top views of corresponding portions of an integrated circuit, in accordance with some embodiments.
Figure 16B:
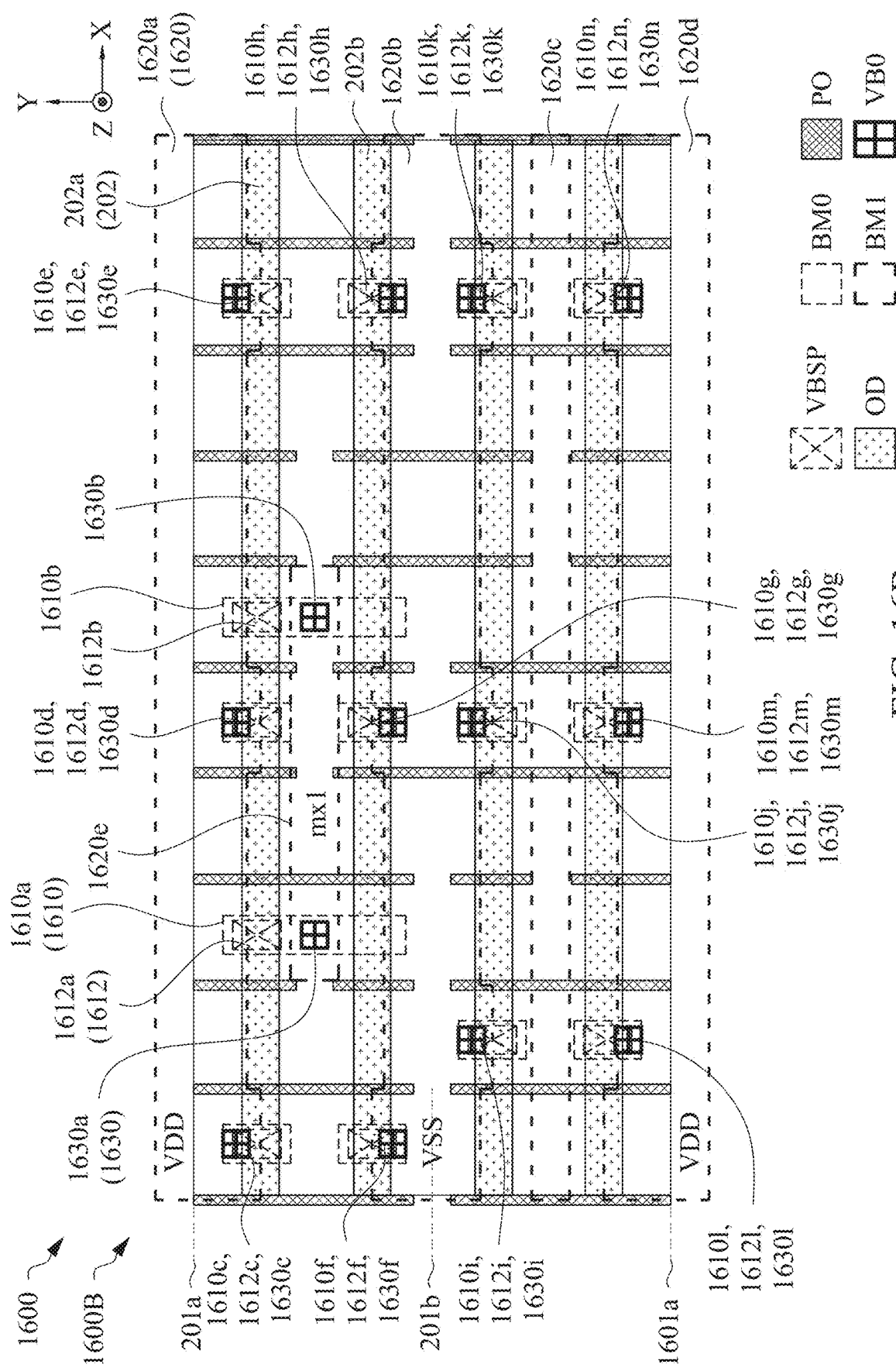
Figure 16C:
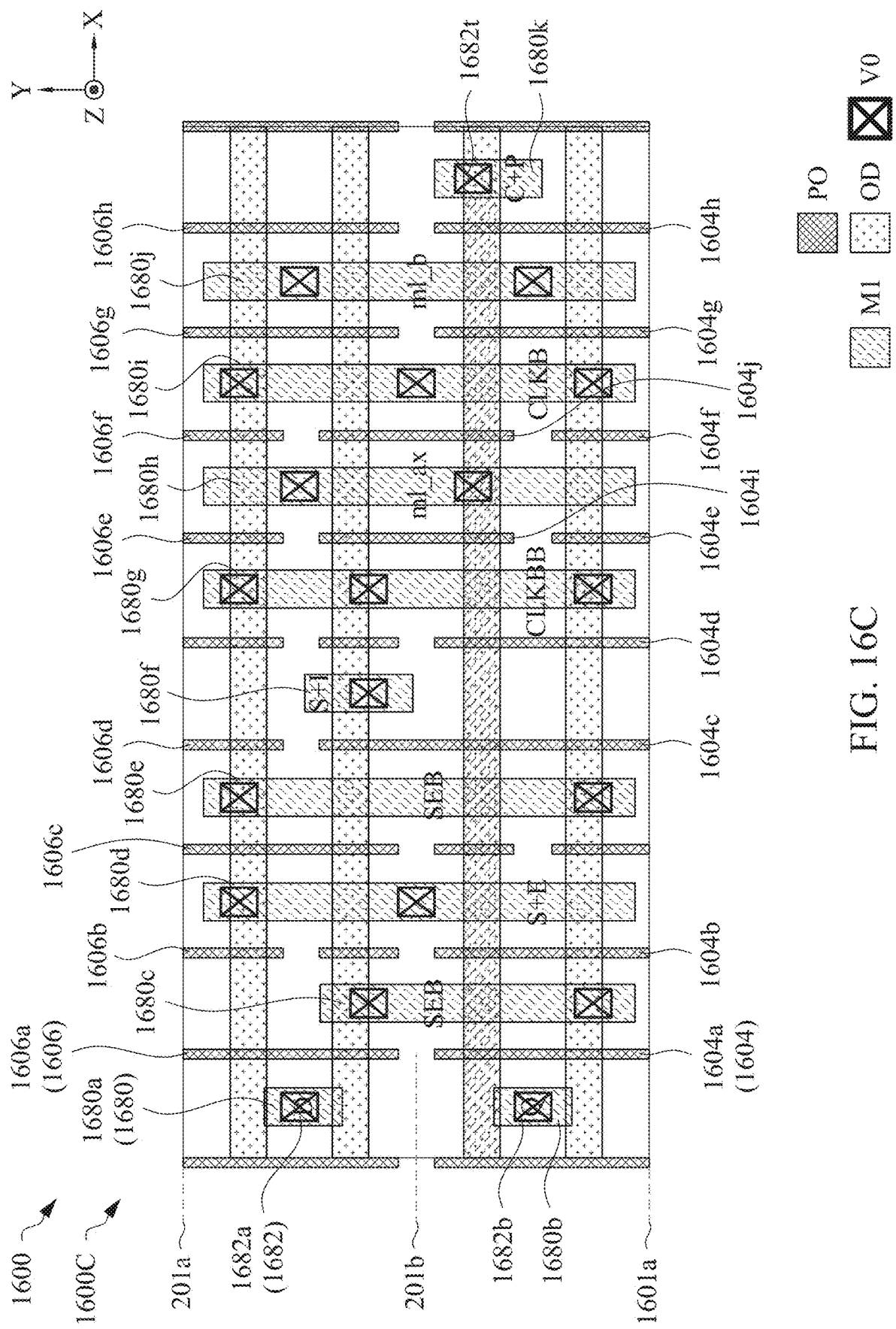

FIGS. 16A-16C are top views of corresponding portions 1600A-1600C of an integrated circuit 1600, in accordance with some embodiments.

Integrated circuit 1600 is manufactured by a corresponding layout design similar to integrated circuit 1600. Integrated circuit 1600 is an embodiment of integrated circuit 1500.

FIG. 16A is a top view of a portion 1600A of integrated circuit 1600, simplified for ease of illustration. Portion 1600A includes one or more features of integrated circuit 1600 of the POLY level, the MD level, the M0 level, the VG level and the VD level of integrated circuit 1600.

FIG. 16B is a top view of a portion 1600B of integrated circuit 1600, simplified for ease of illustration. Portion 1600B includes one or more features of integrated circuit 1600 of the OD level, the POLY level, the BM0 level, the BM1 level and the VB0 level, and the VBS/P level of integrated circuit 1600.

FIG. 16C is a top view of a portion 1600C of integrated circuit 1600, simplified for ease of illustration. Portion 1600C includes one or more features of integrated circuit 1600 of the OD level, the POLY level, metal 1 (M1) level, and a via 0 (V0) level of integrated circuit 1600. In some embodiments, the V0 level is between the M1 level and the M0 level.

Integrated circuit 1600 is a variation of integrated circuit 500 (FIGS. 5A-5E), or integrated circuit 1000 (FIGS. 10A-10C), integrated circuit 1200 (FIGS. 12A-12C) or integrated circuit 1400 (FIGS. 14A-14C), and similar detailed description is therefore omitted. For example, integrated circuit 1600 illustrates an example of the flip-flop of integrated circuit 1500 of FIG. 15 implemented with the details of integrated circuit 500.

Integrated circuit 1600 includes at least the set of active regions 202 and 1602, a set of gates 1604 and 1606, a set of conductors 1610, a set of vias 1612, a set of conductors 1620, a set of vias 1630, a set of contacts 1640 and 1642, a set of conductors 1660, a set of vias 1670, a set of vias 1672, a set of conductors 1680, and a set of conductors 1682. Integrated circuit 1600 is similar to integrated circuit 1500, and similar detailed description is therefore omitted. In some embodiments, items in similar layers as integrated circuit 1400 are not described for brevity.

In FIGS. 16A-16C, active region 202a corresponds to the active region (e.g., source/drain) of PMOS transistors P15-1, P15-2, P15-3, P15-7, P15-8, P15-9, P15-10 and inverter I15-6, active region 202b corresponds to the active region (e.g., source/drain) of NMOS transistors N15-1, N15-2, N15-3, N15-7, N15-8, N15-9, N15-10 and inverter I15-6, active region 1602a of set of active regions 1602 corresponds to the active region (e.g., source/drain) of PMOS transistors P15-4, P15-5 and P15-6, and inverters I15-1, I15-2, I15-3, I15-4 and I15-5, active region 1602b of set of active regions 1602 corresponds to the active region (e.g., source/drain) of NMOS transistors N15-4, N15-5 and N15-6, and inverters I15-1, I15-2, I15-3, I15-4 and I15-5.

The set of gates 1604 includes one or more of gates 1604a, ..., 1604k. The set of gates 1606 includes one or more of gates 1606a, ..., 1606k. In some embodiments, the set of gates 1604 and 1606 are located on the POLY level of integrated circuit 1600.

The set of conductors 1610 includes at least conductor 1610a, 1610b, ..., 1610n. In some embodiments, the set of conductors 1610 are located on the BM0 level of integrated circuit 1600.

The set of vias 1612 includes one or more of vias 1612a, ..., 1612n. In some embodiments, the set of vias 1612 are located on the VBSP level of integrated circuit 1600.

The set of conductors 1620 includes at least conductor 1620a, 1620b ..., 1620e. In some embodiments, the set of conductors 1610 are located on the BM1 level of integrated circuit 1600.

The set of vias 1630 includes one or more of vias 1630a, ..., 1630n. In some embodiments, the set of vias 1630 are located on the VB0 level of integrated circuit 1600.

The set of contacts 1640 includes one or more contacts 1640a, ..., 1640r. The set of contacts 1642 includes one or more contacts 1642a, ..., 1642n. In some embodiments, the set of contacts 1640 or 1642 are located on the MD level of integrated circuit 1600.

The set of conductors 1660 includes one or more of 1660a, 1660b, ..., 1660u. In some embodiments, the set of conductors 1660 are located on the M0 level of integrated circuit 1600.

The set of vias 1670 includes one or more of vias 1670a, ..., 1670j. In some embodiments, the set of vias 1670 are located on the VD level of integrated circuit 1600. In some embodiments, the set of vias 1670 are configured to electrically couple one or more conductors of the set of conductors 1660 to the set of contacts 1640 or 1642, and vice versa.

The set of vias 1672 includes one or more of vias 1672a, ..., 1672s. In some embodiments, the set of vias 1672 are located on the VG level of integrated circuit 1600. In some embodiments, the set of vias 1672 are configured to electrically couple one or more conductors of the set of conductors 1660 to the set of gates 1604 or 1606, and vice versa.

The set of conductors 1680 includes one or more of 1680a, 1680b, ..., 1680k. In some embodiments, the set of conductors 1680 are located on the M1 level of integrated circuit 1600. The set of conductors 1680 are M1 routing tracks extending in the second direction Y. In some embodiments, the set of conductors 1680 are routing tracks in other metal layers. In some embodiments, one or more conductors of the set of conductors 1680 are input pins configured to receive a corresponding signal (e.g., as labelled in FIG. 16C).

The set of vias 1682 includes one or more of vias 1682a, ..., 1682t. In some embodiments, the set of vias 1682 are located on the V0 level of integrated circuit 1600. The set of vias 1682 are configured to electrically couple one or more conductors of the set of conductors 1680 to the set of conductors 1660, and vice versa. The set of vias 1682 are between the set of conductors 1680 and the set of conductors 1660.

The set of gates 1604 and 1606 correspond to one or more gates of PMOS transistors P15-1 through P15-10, NMOS transistors N15-1 through N15-10, and inverters I15-1 through I15-6 of integrated circuit 1500. In some embodiments, each of the gates in the set of gates 1604 and 1606 are shown in FIGS. 16A-16C with corresponding labels that identify corresponding transistors of FIG. 15 having corresponding gates in FIGS. 16A-16C, and are omitted for brevity.

Conductors 1620a and 1620d are the VDD power rail, and conductor 1620b is the VSS power rail. Conductors 1620c and 1620e are signal lines.

Conductor 1620a is electrically coupled to and configured to provide voltage VDD to the source of PMOS transistors P15-10, P15-8, P15-2 and the source of the PMOS transistor of inverter I15-6. For example, conductor 1620a is electrically coupled to conductors 1610c, 1610d, 1610e by corresponding vias 1630c, 1630d, 1630e. Conductors 1610c, 1610d, are coupled to the corresponding source of PMOS transistors P15-10 and P15-8 by corresponding vias 1612c, 1612d. Conductor 1610e is coupled to the source of PMOS transistor P15-2 and the source of the PMOS transistor of inverter I15-6 by via 1612e.

Conductor 1620b is electrically coupled to and configured to provide voltage VSS to the source of NMOS transistors N15-10, N15-8, N15-2, the source of the NMOS transistor of inverter I15-6, the source of the NMOS transistor of inverters I15-3 and I15-2, the source of the NMOS transistor of inverter I15-4 and the source of NMOS transistor N15-6, and the source of the NMOS transistor of inverters I15-1 and I15-5. For example, conductor 1620b is electrically coupled to conductors 1610f, 1610g, 1610h, 1610i, 1610j, 1610k by corresponding vias 1630f, 1630g, 1630h, 1630i, 1630j, 1630k. Conductors 1610f and 1610g are coupled to the corresponding sources of NMOS transistors N15-10 and N15-8 by corresponding vias 1630f and 1630g. Conductor 1610h is coupled to the source of NMOS transistor N15-2 and the source of the NMOS transistor of inverter I15-6 by via 1612h. Conductor 1610i is coupled to the source of the NMOS transistor of inverter I15-3 and source of the NMOS transistor of inverter I15-2 by via 1612i. Conductor 1610j is coupled to the source of the NMOS transistor of inverter I15-4 and source of NMOS transistor N15-6 by via 1612j. Conductor 1610k is coupled to the source of the NMOS transistor of inverter I15-1 and source of the NMOS transistor of inverter I15-5 by via 1612k.

Conductor 1620d is electrically coupled to and configured to provide voltage VDD to the sources of the PMOS transistors of inverters I15-3, I15-2, I15-4, I15-1, I15-5 and the source of PMOS transistor P15-6. For example, conductor 1620d is electrically coupled to conductors 1610l, 1610m, 1610n by corresponding vias 1630l, 1630m, 1630n. Conductor 1610l is coupled to the source of the PMOS transistor of inverter I15-3 and the source of the PMOS transistor of inverter I15-2 by via 16121. Conductor 1610m is coupled to the source of the PMOS transistor of inverter I15-4 and the source of PMOS transistor P15-6 by via 1612m. Conductor 1610n is coupled to the source of the PMOS transistor of inverter I15-1 and the source of the PMOS transistor of inverter I15-5 by via 1612n.

Conductor 1620e electrically couples the drains of PMOS transistors P15-7 and P15-9, and the source of PMOS transistor P15-1 together. For example, the drain of PMOS transistor P15-7 and the drain of PMOS transistor P15-9 are electrically coupled to conductor 1610a by via 1612a, and conductor 1610a is electrically coupled to conductor 1620e by via 1630a, and conductor 1620e is electrically coupled to conductor 1610b by via 1630b, and conductor 1610b is electrically coupled to the source of PMOS transistor P15-1 by via 1612b.

Conductor 1660a electrically couples each of the source of NMOS transistor N15-1, the drain of NMOS transistor N15-7 and the drain of NMOS transistor N15-9 together. For example, conductor 1660a is electrically coupled to contact 1640a, 1640b by a corresponding via 1670a, 1670b. Contact 1640a is electrically coupled to the drain of NMOS transistor N15-7 and the drain of NMOS transistor N15-9. Contact 1640b is electrically coupled to the source of NMOS transistor N15-1.

In some embodiments, integrated circuit 1600 achieves one or more of the benefits discussed above in FIGS. 1A-5E.

Other configurations, arrangements on other levels or quantities of conductors in integrated circuit 1600 are within the scope of the present disclosure.

FIG. 17A is a functional flow chart of a method of manufacturing an IC device, in accordance with some embodiments. It is understood that additional operations may be performed before, during, and/or after the method 1700A depicted in FIG. 17A, and that some other processes may only be briefly described herein.

In some embodiments, other order of operations of method 1700A-1700B is within the scope of the present disclosure. Method 1700A-1700B includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 1700A, 1700B, 1900 or 2000 is not performed.

In some embodiments, methods 1700A-1700B are an embodiment of operation 1904 of method 1900. In some embodiments, the methods 1700A-1700B is usable to manufacture or fabricate at least integrated circuit 200, 300A-300F, 500, 700-1600 or 1800, or an integrated circuit with similar features as at least layout design 100, 400 or 600. In some embodiments, other order of operations of methods 1700A-1700B are within the scope of the present disclosure. Methods 1700A-1700B includes exemplary operations, but the operations are not necessarily performed in the order shown. Operations may be added, replaced, changed order, and/or eliminated as appropriate, in accordance with the spirit and scope of disclosed embodiments.

FIGS. 18A-18F are cross-sectional views of intermediate device structures obtained when fabricating the backside routing tracks and the backside via connector for connecting a backside routing track with a source/drain terminal of a transistor, in accordance with some embodiments. In some embodiments, FIGS. 18A-18E are cross-sectional views of intermediate device structures of integrated circuit 200.

Figures 18A, 18B, 18C:
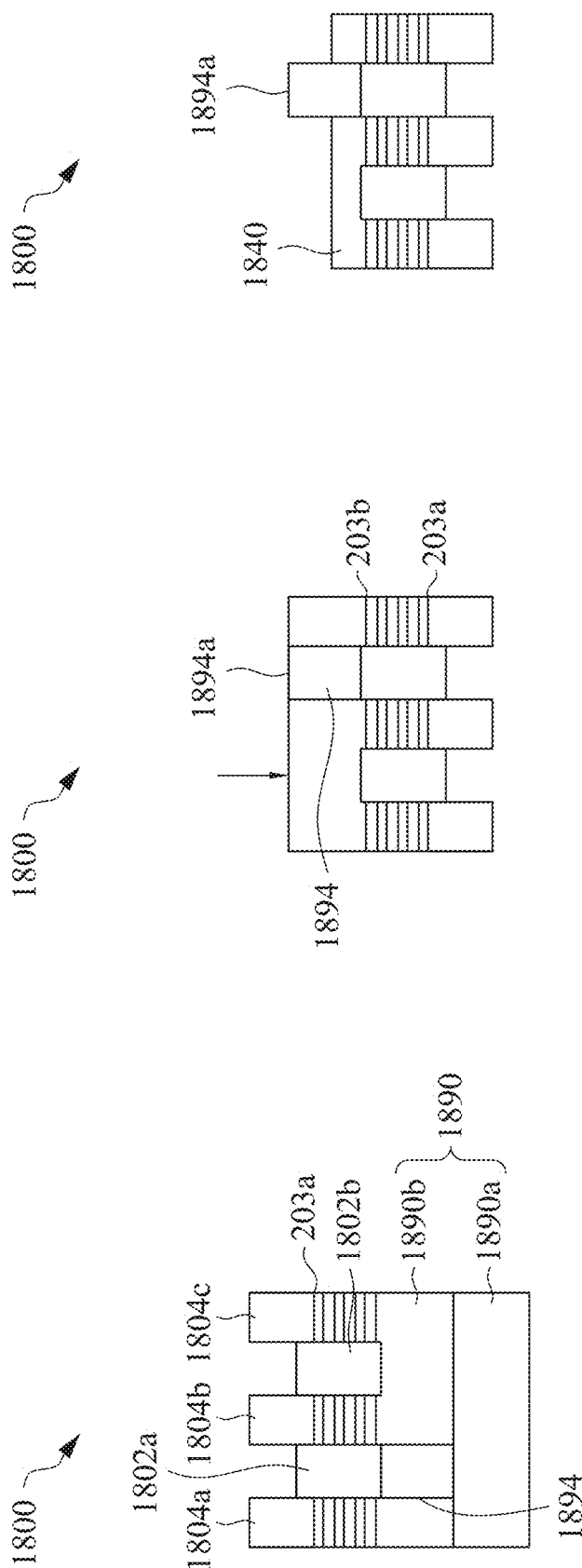

The device structures in FIGS. 18A-18C correspond to intermediate versions of integrated circuit 200 along line A1-A1' of FIG. 2A. The device structures in FIGS. 18D-18F correspond to intermediate versions of integrated circuit 200 along line A2-A2' of FIG. 2A.

In operation 1702 of method 1700A, a set of transistors and a dummy via are fabricated on a front-side 203a of a semiconductor wafer or substrate. In some embodiments, the set of transistors of method 1700A includes one or more transistors in the set of active regions 202, 1602 or 1802.

In some embodiments, the device structures prepared at operation 1702 includes the device structures of FIG. 18A.

In some embodiments, operation 1702 includes fabricating source and drain regions of the set of transistors in a first well. In some embodiments, the first well comprises p-type dopants. In some embodiments, the p-type dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^3$ to about $1 \times 10^{14}$ atoms/cm$^3$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1702 further includes forming contacts (e.g., set of contacts 1040, 1240, 1440 or 1640) of the set of transistors. In some embodiments, operation 1702 further includes forming a gate region 1804 of the set of transistors. In some embodiments, the gate region is between the drain region and the source region. In some embodiments, the gate region is over the first well and the substrate. In some embodiments, fabricating the gate regions of operation 1702 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In the cross-sectional view of FIG. 18A, the source region 1802*a* and the drain region 1802*b* are part of an active region 1802 of the n-type or p-type transistor, and are formed on the front-side 203*a* of substrate 1890. The front-side 203*a* of substrate 1890 is above a portion 1890*b* of substrate 1890. Dummy via structures 1894 are formed in portion 1890*b* of substrate 1890 below the active region 1802. Gate structures 1804*a*, 1804*b* and 1804*c* are formed above the active region 1802 on the front-side 203*a* of substrate 1890. In some embodiments, dummy via 1894 is an insulating layer. In some embodiments, dummy via 1894 is a photoresist, and is deposited in the recess of the wafer during a spin-coating process.

In operation 1704 of method 1700A, thinning is performed on the back-side 203*b* of the wafer or substrate 1890. In some embodiments, operation 1704 includes a thinning process performed on the back-side 203*b* of the semiconductor wafer or substrate 1890. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside 203*b* of the semiconductor wafer or substrate 1890.

In the cross-sectional view of FIG. 18B, portion 1890*a* is removed by thinning operation 1704 thereby exposing a top surface 1894*a* of dummy via 1894. In the cross-sectional view of FIG. 18C, portion 1890*b* is also removed by thinning operation 1704 thereby exposing the back-side of the wafer or substrate 1890.

In operation 1706 of method 1700A, a first set of conductors and a first set of vias are formed on the back-side 203*b* of the wafer or substrate on a first level (e.g., BM0). In some embodiments, operation 1706 includes at least depositing a first set of conductive regions over the back-side of the integrated circuit. In some embodiments, method 1700B is an embodiment of operation 1706.

In some embodiments, the first set of conductors of method 1700A includes one or more portions of at least the set of conductors 206, 210, 310, 312, 314, 316, 1006, 1206, 1406, 1410, 1610 or 1810. In some embodiments, the first set of vias of method 1700A includes one or more portions at least the set of vias 208, 212, 1008, 1208, 1408, 1412, 1608, 1612, or 1812. In some embodiments, operation 1706 includes forming a first set of self-aligned contacts (SACs) in the insulating layer over the back-side 203b of the wafer.

In operation 1708 of method 1700A, a second set of vias are fabricated on the back-side 203b of the wafer or substrate opposite from the front-side 203a. In some embodiments, the second set of vias of method 1700A includes at least portions of one or more of the set of vias 230, 1030, 1230, 1430 or 1630. In some embodiments, operation 1708 includes forming a second set of SACs in an insulating layer over the back-side of the wafer.

In operation 1710 of method 1700A, conductive material is deposited on the back-side 203b of the wafer or substrate on a second level (e.g., BM1) of the integrated circuit thereby forming a second set of conductive structures. In some embodiments, operation 1710 further includes at least forming a set of power rails and forming a set of signal lines.

In some embodiments, the second set of conductive structures of method 1700A includes at least portions of one or more of the set of conductors 120, 420, 320, 620, 820, 1020, 1220, 1420 or 1620.

In some embodiments, one or more of operations 1706, 1708 or 1710 of method 1700A include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 22:
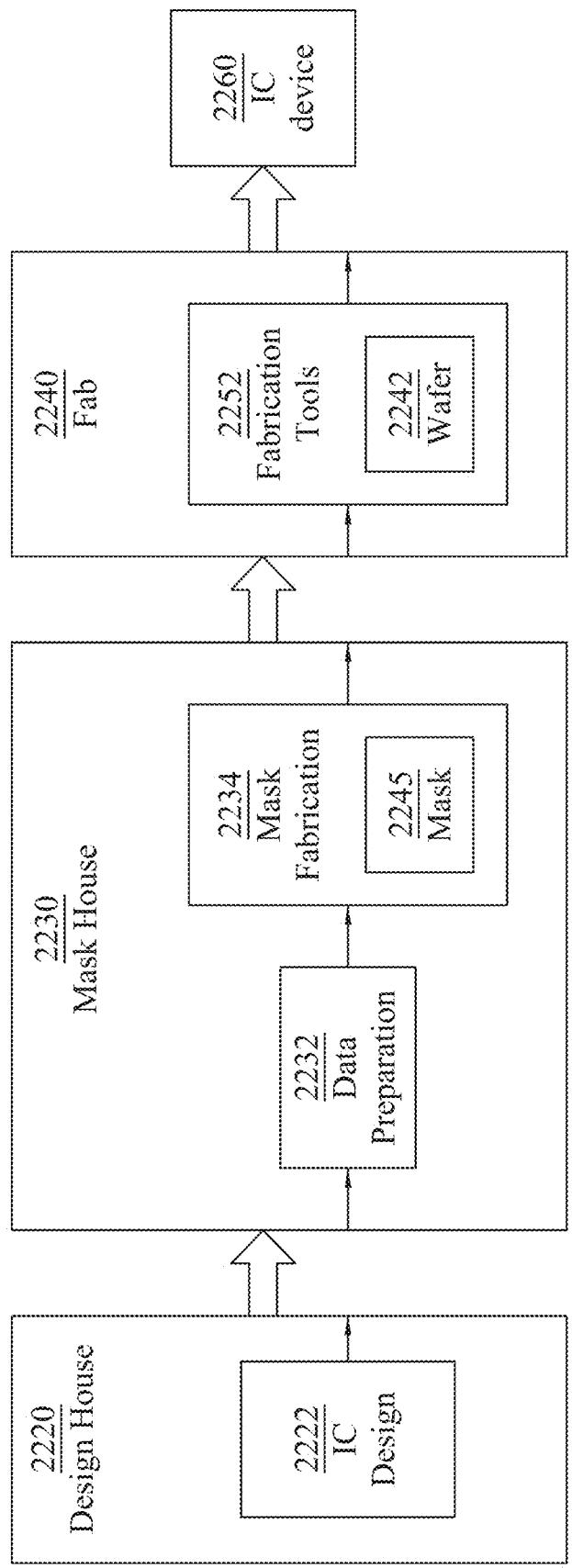
FIG. 22 is a block diagram of an IC manufacturing system, and an IC manufacturing flow associated therewith, in accordance with at least one embodiment of the present disclosure.

In some embodiments, at least one or more operations of method 1700A or 1700B is performed by system 2200 of FIG. 22. In some embodiments, at least one method(s), such as method 1700A discussed above or method 1700B discussed below, is performed in whole or in part by at least one manufacturing system, including system 2200. One or more of the operations of method 1700A or 1700B is performed by IC fab 2240 (FIG. 22) to fabricate IC device 2260. In some embodiments, one or more of the operations of method 1700A is performed by fabrication tools 2252 to fabricate wafer 2242.

FIG. 17B is a flow chart showing a method 1700B of fabricating a first set of conductors and a first set of vias on the back-side of an integrated circuit, in accordance with some embodiments.

In some embodiments, the first set of conductors of method 1700A includes one or more portions of at least the set of conductors 206, 210, 310, 312, 314, 316, 1006, 1206, 1406, 1410, 1610 or 1810. In some embodiments, the first set of vias of method 1700A includes one or more portions of at least the set of vias 208, 212, 1008, 1208, 1408, 1412, 1612 or 1812.

In some embodiments, method 1700B is an embodiment of operation 1706 of method 1700A.

In operation 1720 of method 1700B, an insulating layer 1840 is deposited on the back-side 203b of the wafer or substrate. In some embodiments, the insulating layer 1840 electrically isolates the underlying layers from one or more upper layers deposited in at least one or more of operations 1708, 1710, 1722, 1724 or 1726. In some embodiments, the insulating layer 1840 covers the back-side 203b of the substrate, but exposes the top surface 1894a of dummy via 1894.

In some embodiments, the insulating layer 1840 is a dielectric material. In some embodiments, the dielectric material includes silicon dioxide, silicon oxy-nitride, or the like.

In the cross-sectional view of FIG. 18C, insulating layer 1840 covers the back-side 203b of the wafer or substrate 1890, but the top surface 1894a of dummy via 1894 is exposed.

In operation 1722 of method 1700B, a hard mask 1852 is deposited on the insulating layer 1840. In some embodiments, operation 1722 further includes removing the dummy via 1894 thereby forming a trench 1844 in the hard mask 1852 and the insulating layer 1840. In some embodiments, the hard mask 1852 electrically isolates the underlying layers from one or more upper layers deposited in at least one or more of operations 1708, 1710 or 1726.

In some embodiments, the hard mask 1852 includes amorphous carbon or silicon. In some embodiments, the hard mask 1852 includes silicon carbide, silicon nitride, silicon oxy-nitride, or the like. In some embodiments, the hard mask 1852 is deposited by CVD or some other deposition technique compatible with method 1700B. Other hard-mask materials compatible with methods 1700A-1700B are also included within the scope of the present disclosure. In some embodiments, after hard-mask formation, the back-side 203b is planarized to provide a level surface for subsequent steps.

In the cross-sectional view of FIG. 18D, the trench 1844 is formed in the hard mask 1852 and the insulating layer 1840, and the top surface 1802a1 of active region 1802a is exposed.

In operation 1724 of method 1700B, lateral portions of the hard mask 1852 are removed by directional etching. In some embodiments, operation 1724 causes the hard mask 1852 to have an opening 1846 that is greater in the second direction Y than the trench 1844 formed in the insulating layer 1850. In some embodiments, the directional etching of operation 1724 includes a plasma etching process that includes an etchant gas such as chlorine, fluorine or the like.

In the cross-sectional view of FIG. 18D, the opening 1846 formed in the hard mask 1852 has a length L1 or a width $BM0_{HW1b}$ in the second direction Y. In the cross-sectional view of FIG. 18D, the trench 1844 formed in the insulating layer 1850 has a width $BVB_{W1b}$ in the second direction Y.

In operation 1726 of method 1700B, conductive material is deposited in the trench within the insulating layer 1850 and the opening 1846 within the hard mask 1852. In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in operation 1726, the conductive material is planarized to provide a level surface for subsequent steps.

In some embodiments, one or more of the operations of method 1700A, 1700B, 1900 or 2000 is not performed.

One or more of the operations of methods 1900-2000 is performed by a processing device configured to execute instructions for manufacturing an integrated circuit, such as at least integrated circuit 200, 300A-300F, 500, 700-1600 or 1800. In some embodiments, one or more operations of methods 1900-2000 is performed using a same processing device as that used in a different one or more operations of methods 1900-2000. In some embodiments, a different processing device is used to perform one or more operations of methods 1900-2000 from that used to perform a different one or more operations of methods 1900-2000. In some embodiments, other order of operations of method 1700A, 1700B, 1900 or 2000 is within the scope of the present disclosure. Method 1700A, 1700B, 1900 or 2000 includes exemplary operations, but the operations are not necessarily performed in the order shown. Operations in method 1700A, 1700B, 1900 or 2000 may be added, replaced, changed order, and/or eliminated as appropriate, in accordance with the spirit and scope of disclosed embodiments.

Figure 19:
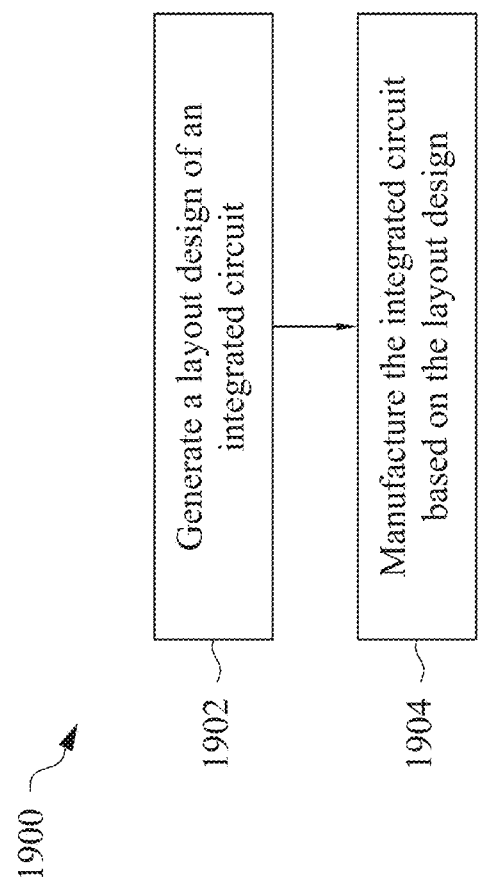
FIG. 19 is a flow chart of a method of manufacturing an IC device, in accordance with some embodiments.

FIG. 19 is a flowchart of a method 1900 of forming or manufacturing an integrated circuit in accordance with some embodiments. It is understood that additional operations may be performed before, during, and/or after the method 1900 depicted in FIG. 19, and that some other operations may only be briefly described herein. In some embodiments, the method 1900 is usable to form integrated circuits, such as at least integrated circuit 200, 300A-300F, 500, 700-1600 or 1800. In some embodiments, the method 1900 is usable to form integrated circuits having similar features and similar structural relationships as one or more of layout design 100, 400 or 600.

In operation 1902 of method 1900, a layout design of an integrated circuit is generated. Operation 1902 is performed by a processing device (e.g., processor 2102 (FIG. 21)) configured to execute instructions for generating a layout design. In some embodiments, the layout design of method 1900 includes one or more patterns of at least layout design 100, 400 or 600, or one or more features similar to at least integrated circuit 200, 300A-300F, 500, 700-1600 or 1800. In some embodiments, the layout design of the present application is in a graphic database system (GDSII) file format.

In operation 1904 of method 1900, the integrated circuit is manufactured based on the layout design. In some embodiments, operation 1904 of method 1900 comprises manufacturing at least one mask based on the layout design, and manufacturing the integrated circuit based on the at least one mask.

Figure 20:
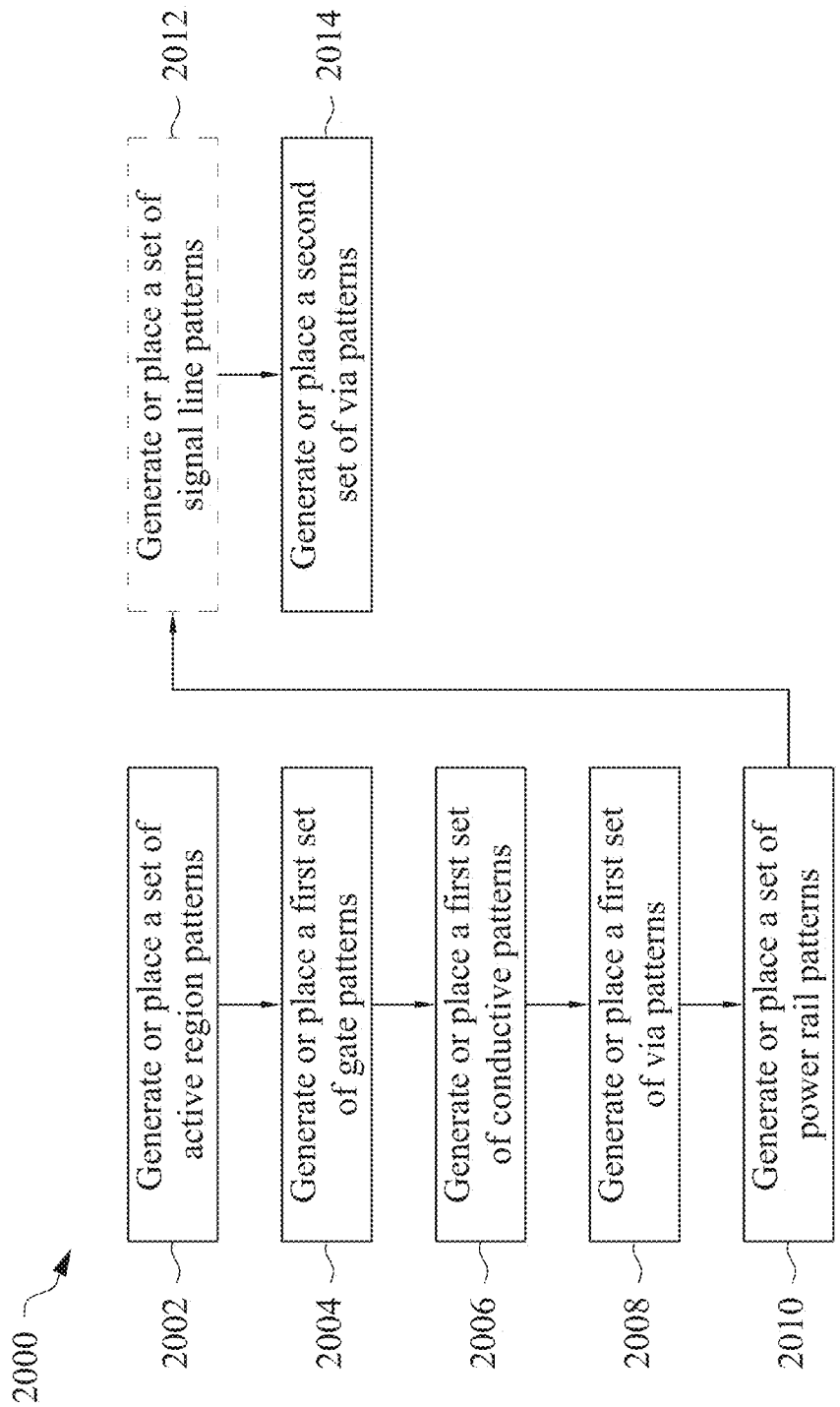
FIG. 20 is a flowchart of a method of generating a layout design of an integrated circuit in accordance with some embodiments.

FIG. 20 is a flowchart of a method 2000 of generating a layout design of an integrated circuit, in accordance with some embodiments. It is understood that additional operations may be performed before, during, and/or after the method 2000 depicted in FIG. 20, and that some other processes may only be briefly described herein. In some embodiments, method 2000 is an embodiment of operation 1902 of method 1900. In some embodiments, method 2000 is usable to generate one or more layout patterns of at least layout design 100, 400 or 600, or one or more features similar to at least integrated circuit 200, 300A-300F, 500, 700-1600 or 1800.

In some embodiments, method 2000 is usable to generate one or more layout patterns having structural relationships including alignment, lengths and widths, as well as configurations and layers of at least layout design 100, 400 or 600, or one or more features similar to at least integrated circuit 200, 300A-300F, 500, 700-1600 or 1800, and similar detailed description will not be described in FIG. 20, for brevity.

In operation 2002 of method 2000, a set of active region patterns is generated or placed on the layout design. In some embodiments, the set of active region patterns of method 2000 includes at least portions of one or more patterns of set of active region patterns 102. In some embodiments, the set of active region patterns of method 2000 includes one or more regions similar to the set of active regions 1602.

In operation 2004 of method 2000, a first set of gate patterns is generated or placed on the layout design. In some embodiments, the first set of gate patterns of method 2000 includes at least portions of one or more patterns of set of gate patterns 104. In some embodiments, the first set of gate patterns of method 2000 includes one or more gates similar to at least the set of gates 1004, 1204, 1404 or 1604.

In operation 2006 of method 2000, a first set of conductive patterns is generated or placed on the layout design. In some embodiments, the first set of conductive patterns of method 2000 includes at least portions of one or more patterns of at least the set of conductive patterns 106 or 110.

In some embodiments, the first set of conductive patterns of method 2000 includes one or more conductors similar to at least the set of conductors 310, 312, 314, 316, 1006, 1206, 1406, 1410 or 1610. In some embodiments, the first set of conductive patterns of method 2000 includes one or more conductors similar to at least conductors in the BM0 layer.

In some embodiments, the first set of conductive patterns of method 2000 includes at least portions of one or more patterns of at least the set of conductive patterns 160. In some embodiments, the first set of conductive patterns of method 2000 includes one or more conductors similar to at least the set of conductors 1060, 1260, 1460 or 1660.

In some embodiments, the first set of conductive patterns of method 2000 includes one or more contacts similar to at least the set of contacts 1040, 1240, 1440 or 1640. In some embodiments, the first set of conductive patterns of method 2000 includes one or more conductors similar to at least contacts in the MD layer.

In operation 2008 of method 2000, a first set of via patterns is generated or placed on the layout design. In some embodiments, the first set of via patterns of method 2000 includes at least portions of one or more patterns of set of via patterns 108 or 112. In some embodiments, the first set of via patterns of method 2000 includes one or more patterns similar to at least the set of vias 1008, 1208, 1408, 1412 or 1612.

In some embodiments, the first set of via patterns of method 2000 includes one or more patterns similar to at least the set of vias 1270, 1470 or 1670. In some embodiments, the first set of via patterns of method 2000 includes one or more vias similar to at least vias in the VG or VD layer.

In operation 2010 of method 2000, a set of power rail patterns is generated or placed on the layout design.

In some embodiments, the set of power rail patterns of method 2000 includes at least portions of one or more patterns of set of conductive feature patterns 120, 420 or 620. In some embodiments, the set of power rail patterns of method 2000 includes at least portions of one or more patterns of conductive feature patterns 120a, 120b, 420a, 420b, 620a or 620b.

In some embodiments, the set of power rail patterns of method 2000 includes one or more patterns similar to at least the set of conductors 320, 820, 1020, 1220, 1420 or 1620. In some embodiments, the set of power rail patterns of method 2000 includes one or more patterns similar to at least conductors 320*a*, 320*b*, 822, 824, 1020*a*, 1020*b*, 1220*a*, 1220*b*, 1420*a*, 1420*b*, 1620*a* or 1620*b*.

In operation 2012 of method 2000, a set of signal line patterns is generated or placed on the layout design. In some embodiments, the set of signal line patterns of method 2000 includes at least portions of one or more patterns of set of conductive feature patterns 120, 420 or 620. In some embodiments, the set of signal line patterns of method 2000 includes at least portions of one or more patterns of conductive feature patterns 420*c* or 620*c*.

In some embodiments, the set of signal line patterns of method 2000 includes one or more patterns similar to at least the set of conductors 320, 1020, 1220, 1420 or 1620. In some embodiments, the set of signal line patterns of method 2000 includes one or more patterns similar to at least conductors 320*c*, 826, 1020*c*, 1220*c*, 1420*c*, 1620*c* or 1620*e*.

In operation 2014 of method 2000, a second set of via patterns is generated or placed on the layout design. In some embodiments, the second set of via patterns of method 2000 includes at least portions of one or more patterns of set of via patterns 130.

In some embodiments, the second set of via patterns of method 2000 includes one or more patterns similar to at least the set of vias 1030, 1230, 1430 or 1630. In some embodiments, the second set of via patterns of method 2000 includes one or more vias similar to at least vias in the VB0 layer.

Figure 21:
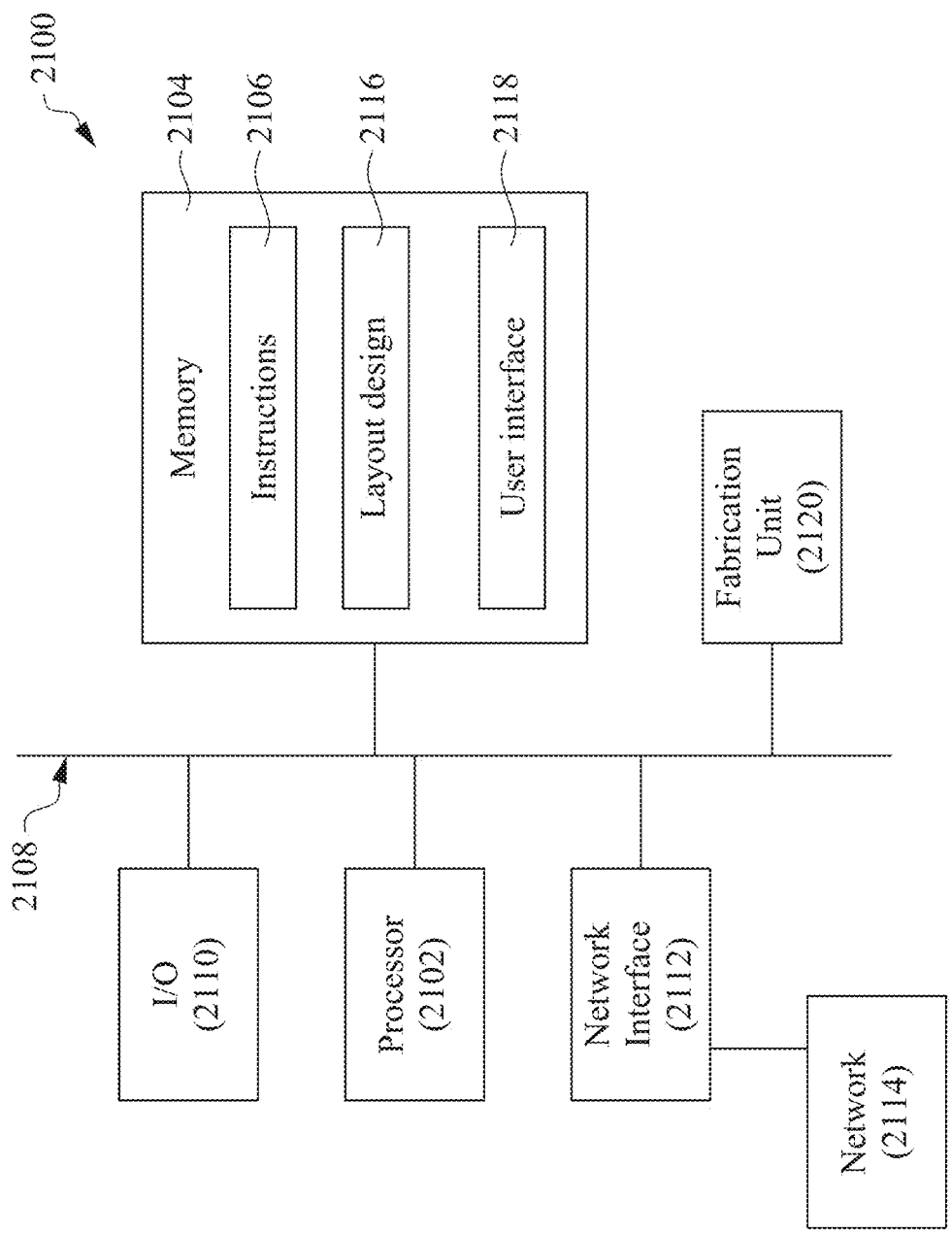
FIG. 21 is a schematic view of a system for designing an IC layout design and manufacturing an IC circuit in accordance with some embodiments.

FIG. 21 is a schematic view of a system 2100 for designing an IC layout design and manufacturing an IC circuit in accordance with some embodiments.

In some embodiments, system 2100 generates or places one or more IC layout designs described herein. System 2100 includes a hardware processor 2102 and a non-transitory, computer readable storage medium 2104 (e.g., memory 2104) encoded with, i.e., storing, the computer program code 2106, i.e., a set of executable instructions 2106. Computer readable storage medium 2104 is configured for interfacing with manufacturing machines for producing the integrated circuit. The processor 2102 is electrically coupled to the computer readable storage medium 2104 via a bus 2108. The processor 2102 is also electrically coupled to an I/O interface 2110 by bus 2108. A network interface 2112 is also electrically connected to the processor 2102 via bus 2108. Network interface 2112 is connected to a network 2114, so that processor 2102 and computer readable storage medium 2104 are capable of connecting to external elements via network 2114. The processor 2102 is configured to execute the computer program code 2106 encoded in the computer readable storage medium 2104 in order to cause system 2100 to be usable for performing a portion or all of the operations as described in method 1900-2000.

In some embodiments, the processor 2102 is a central processing unit (CPU), a multi-processor, a distributed processing system, an application specific integrated circuit (ASIC), and/or a suitable processing unit.

In some embodiments, the computer readable storage medium 2104 is an electronic, magnetic, optical, electromagnetic, infrared, and/or a semiconductor system (or apparatus or device). For example, the computer readable storage medium 2104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2104 includes a compact disk-read only memory (CD-ROM), a compact disk-read/write (CD-R/W), and/or a digital video disc (DVD).

In some embodiments, the storage medium 2104 stores the computer program code 2106 configured to cause system 2100 to perform method 1900-2000. In some embodiments, the storage medium 2104 also stores information needed for performing method 1900-2000 as well as information generated during performing method 1900-2000, such as layout design 2116, user interface 2118 and fabrication unit 2120, and/or a set of executable instructions to perform the operation of method 1900-2000. In some embodiments, layout design 2116 comprises one or more of layout patterns of at least layout design 100, 400 or 600, or features similar to at least integrated circuit 200, 300A-300F, 500, 700-1600 or 1800.

In some embodiments, the storage medium 2104 stores instructions (e.g., computer program code 2106) for interfacing with manufacturing machines. The instructions (e.g., computer program code 2106) enable processor 2102 to generate manufacturing instructions readable by the manufacturing machines to effectively implement method 1900-2000 during a manufacturing process.

System 2100 includes I/O interface 2110. I/O interface 2110 is coupled to external circuitry. In some embodiments, I/O interface 2110 includes a keyboard, keypad, mouse, trackball, trackpad, and/or cursor direction keys for communicating information and commands to processor 2102.

System 2100 also includes network interface 2112 coupled to the processor 2102. Network interface 2112 allows system 2100 to communicate with network 2114, to which one or more other computer systems are connected. Network interface 2112 includes wireless network interfaces such as BLUETOOTH, WIFI, WIMAX, GPRS, or WCDMA; or wired network interface such as ETHERNET, USB, or IEEE-2094. In some embodiments, method 1900-2000 is implemented in two or more systems 2100, and information such as layout design, and user interface are exchanged between different systems 2100 by network 2114.

System 2100 is configured to receive information related to a layout design through I/O interface 2110 or network interface 2112. The information is transferred to processor 2102 by bus 2108 to determine a layout design for producing at least integrated circuit 200, 300A-300F, 500, 700-1600 or 1800. The layout design is then stored in computer readable medium 2104 as layout design 2116. System 2100 is configured to receive information related to a user interface through I/O interface 2110 or network interface 2112. The information is stored in computer readable medium 2104 as user interface 2118. System 2100 is configured to receive information related to a fabrication unit 2120 through I/O interface 2110 or network interface 2112. The information is stored in computer readable medium 2104 as fabrication unit 2120. In some embodiments, the fabrication unit 2120 includes fabrication information utilized by system 2100. In some embodiments, the fabrication unit 2120 corresponds to mask fabrication 2234 of FIG. 22.

In some embodiments, method 1900-2000 is implemented as a standalone software application for execution by a processor. In some embodiments, method 1900-2000 is implemented as a software application that is a part of an additional software application. In some embodiments, method 1900-2000 is implemented as a plug-in to a software application. In some embodiments, method 1900-2000 is implemented as a software application that is a portion of an EDA tool. In some embodiments, method 1900-2000 is implemented as a software application that is used by an EDA tool. In some embodiments, the EDA tool is used to generate a layout of the integrated circuit device.

In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1900-2000 is implemented by a manufacturing device to manufacture an integrated circuit using a set of masks manufactured based on one or more layout designs generated by system 2100. In some embodiments, system 2100 is a manufacturing device configured to manufacture an integrated circuit using a set of masks manufactured based on one or more layout designs of the present disclosure. In some embodiments, system 2100 of FIG. 21 generates layout designs of an integrated circuit that are smaller than other approaches. In some embodiments, system 2100 of FIG. 21 generates layout designs of integrated circuit structure that occupy less area and provide better routing resources than other approaches.

FIG. 22 is a block diagram of an integrated circuit (IC) manufacturing system 2200, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 2200.

In FIG. 22, IC manufacturing system 2200 (hereinafter "system 2200") includes entities, such as a design house 2220, a mask house 2230, and an IC manufacturer/fabricator ("fab") 2240, that interact with one another in the design, development, and manufacturing cycles and/or services related to manufacturing an IC device 2260. The entities in system 2200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 2220, mask house 2230, and IC fab 2240 is owned by a single larger company. In some embodiments, one or more of design house 2220, mask house 2230, and IC fab 2240 coexist in a common facility and use common resources.

Design house (or design team) 2220 generates an IC design layout 2222. IC design layout 2222 includes various geometrical patterns designed for an IC device 2260. The geometrical patterns correspond to patterns of metal, oxide, or semiconductor layers that make up the various components of IC device 2260 to be fabricated. The various layers combine to form various IC features. For example, a portion of IC design layout 2222 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 2220 implements a proper design procedure to form IC design layout 2222. The design procedure includes one or more of logic design, physical design or place and route. IC design layout 2222 is presented in one or more data files having information of the geometrical patterns. For example, IC design layout 2222 can be expressed in a GDSII file format or DFII file format.

Mask house 2230 includes data preparation 2232 and mask fabrication 2234. Mask house 2230 uses IC design layout 2222 to manufacture one or more masks 2245 to be used for fabricating the various layers of IC device 2260 according to IC design layout 2222. Mask house 2230 performs mask data preparation 2232, where IC design layout 2222 is translated into a representative data file (RDF). Mask data preparation 2232 provides the RDF to mask fabrication 2234. Mask fabrication 2234 includes a mask writer. A mask writer converts the RDF to an image on a substrate, such as a mask (reticle) 2245 or a semiconductor wafer 2242. The design layout 2222 is manipulated by mask data preparation 2232 to comply with particular characteristics of the mask writer and/or requirements of IC fab 2240. In FIG. 22, mask data preparation 2232 and mask fabrication 2234 are illustrated as separate elements. In some embodiments, mask data preparation 2232 and mask fabrication 2234 can be collectively referred to as mask data preparation.

In some embodiments, mask data preparation 2232 includes optical proximity correction (OPC) which uses lithography enhancement techniques to compensate for image errors, such as those that can arise from diffraction, interference, other process effects and the like. OPC adjusts IC design layout 2222. In some embodiments, mask data preparation 2232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 2234, which may undo part of the modifications performed by OPC in order to meet mask creation rules.

In some embodiments, mask data preparation 2232 includes lithography process checking (LPC) that simulates processing that will be implemented by IC fab 2240 to fabricate IC device 2260. LPC simulates this processing based on IC design layout 2222 to create a simulated manufactured device, such as IC device 2260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 2222.

It should be understood that the above description of mask data preparation 2232 has been simplified for the purposes of clarity. In some embodiments, data preparation 2232 includes additional features such as a logic operation (LOP)

to modify the IC design layout according to manufacturing rules. Additionally, the processes applied to IC design layout 2222 during data preparation 2232 may be executed in a variety of different orders.

After mask data preparation 2232 and during mask fabrication 2234, a mask 2245 or a group of masks 2245 are fabricated based on the modified IC design layout 2222. In some embodiments, mask fabrication 2234 includes performing one or more lithographic exposures based on IC design layout 2222. In some embodiments, an electron-beam (e-beam) or a mechanism of multiple e-beams is used to form a pattern on a mask (photomask or reticle) 2245 based on the modified IC design layout 2222. The mask 2245 can be formed in various technologies. In some embodiments, the mask 2245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 2245 includes a transparent substrate (e.g., fused quartz) and an opaque material (e.g., chromium) coated in the opaque regions of the binary mask. In another example, the mask 2245 is formed using a phase shift technology. In the phase shift mask (PSM) version of mask 2245, various features in the pattern formed on the mask are configured to have proper phase difference to enhance the resolution and imaging quality. In various examples, the phase shift mask can be attenuated PSM or alternating PSM. The mask(s) generated by mask fabrication 2234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 2240 is an IC fabrication entity that includes one or more manufacturing facilities for the fabrication of a variety of different IC products. In some embodiments, IC Fab 2240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 2240 includes wafer fabrication tools 2252 (hereinafter "fabrication tools 2252") configured to execute various manufacturing operations on semiconductor wafer 2242 such that IC device 2260 is fabricated in accordance with the mask(s), e.g., mask 2245. In various embodiments, fabrication tools 2252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 2240 uses mask(s) 2245 fabricated by mask house 2230 to fabricate IC device 2260. Thus, IC fab 2240 at least indirectly uses IC design layout 2222 to fabricate IC device 2260. In some embodiments, a semiconductor wafer 2242 is fabricated by IC fab 2240 using mask(s) 2245 to form IC device 2260. In some embodiments, the IC fabrication includes performing one or more lithographic exposures based at least indirectly on IC design layout 2222. Semiconductor wafer 2242 includes a silicon substrate or other proper substrate having material layers formed thereon. Semiconductor wafer 2242 further includes one or more of various doped regions, dielectric features, multilevel interconnects, and the like (formed at subsequent manufacturing steps).

System 2200 is shown as having design house 2220, mask house 2230 or IC fab 2240 as separate components or entities. However, it is understood that one or more of design house 2220, mask house 2230 or IC fab 2240 are part of the same component or entity.

Details regarding an integrated circuit (IC) manufacturing system (e.g., system 2200 of FIG. 22), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a set of power rails, a set of active regions, a first set of conductive lines and a first set of vias and a second set of vias. In some embodiments, the set of power rails extending in a first direction, configured to supply a first supply voltage or a second supply voltage, and being on a first level of a back-side of a substrate. In some embodiments, the set of active regions extending in the first direction, and being on a second level of a front-side of the substrate opposite from the back-side, the second level being different from the first level, and the set of active regions being overlapped by the set of power rails. In some embodiments, the first set of conductive lines extending in a second direction different from the first direction, being on a third level of the back-side of the substrate, the third level being different from the first level and the second level, and overlapping the set of active regions. In some embodiments, the first set of vias between the set of active regions and the first set of conductive lines, the first set of vias electrically coupling the set of active regions to the first set of conductive lines. In some embodiments, the second set of vias between the first set of conductive lines and the set of power rails, the second set of vias electrically coupling the first set of conductive lines and the set of power rails.

Another aspect of this description relates to an integrated circuit. In some embodiments, the integrated circuit includes a first power rail, a second power rail, a first signal line, a first active region, a second active region, and a first conductive line. In some embodiments, the first power rail extending in a first direction, configured to supply a first supply voltage and being on a first level of a back-side of a substrate. In some embodiments, the second power rail extending in the first direction, configured to supply a second supply voltage different from the first supply voltage, and the second power rail being on the first level and being separated from the first power rail in a second direction different from the first direction. In some embodiments, the first signal line extending in the first direction, being on the first level, and being between the first power rail and the second power rail. In some embodiments, the first active region extending in the first direction, and being on a second level of a front-side of the substrate opposite from the back-side, the second level being different from the first level, and the first active region being overlapped by and electrically coupled to the first power rail. In some embodiments, the second active region extending in the first direction, being on the second level, being separated from the first active region in the second direction, and being overlapped by and electrically coupled to the second power rail. In some embodiments, the first conductive line extending in the second direction, being on a third level of the back-side of the substrate, the third level being different from the first level and the second level, overlapping the first active region and the second active region, and electrically coupling the first active region and the second active region to the first signal line.

Still another aspect of this description relates to a method of fabricating an integrated circuit. In some embodiments, the method includes fabricating a set of transistors and a dummy via in a front-side of a substrate, performing thinning on a back-side of the substrate opposite from the front-side, fabricating a first set of vias and a first set of conductors on the back-side of the thinned substrate on a first level, the first set of conductors being electrically coupled to the set of transistors by the first set of vias, fabricating a second set of vias on the back-side of the thinned substrate, and depositing a conductive material on the back-side of the thinned substrate on a second level thereby forming a second set of conductors, the second set of conductors being electrically coupled to the first set of conductors by the second set of vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a set of power rails extending in a first direction, configured to supply a first supply voltage or a second supply voltage, and being on a first level of a back-side of a substrate;
   a set of active regions extending in the first direction, and being on a second level of a front-side of the substrate opposite from the back-side, the second level being different from the first level, and the set of active regions being overlapped by the set of power rails;
   a first set of conductive lines extending in a second direction different from the first direction, being on a third level of the back-side of the substrate, the third level being different from the first level and the second level, and overlapping the set of active regions;
   a first set of vias between the set of active regions and the first set of conductive lines, the first set of vias electrically coupling the set of active regions to the first set of conductive lines; and
   a second set of vias between the first set of conductive lines and the set of power rails, the second set of vias electrically coupling the first set of conductive lines and the set of power rails;
   wherein the set of active regions comprises:
      a first active region extending in the first direction; and
      a second active region extending in the first direction, and being separated from the first active region in the second direction;
   wherein the set of power rails comprises:
      a first power rail extending in the first direction, configured to supply the first supply voltage to the first active region, and overlapping the first active region; and
      a second power rail extending in the first direction, configured to supply the second supply voltage to the second active region, overlapping the second active region, and being separated from the first power rail in the second direction.

2. The integrated circuit of claim 1, wherein the first set of conductive lines comprises:
   a first conductive line extending in the second direction, overlapping the first active region, and being overlapped by the first power rail; and
   a second conductive line extending in the second direction, overlapping the second active region, and being overlapped by the second power rail.

3. The integrated circuit of claim 2, wherein the first set of vias comprises:
   a first via between the first active region and the first conductive line, the first via electrically coupling the first active region to the first conductive line; and
   a second via between the second active region and the second conductive line, the second via electrically coupling the second active region to the second conductive line.

4. The integrated circuit of claim 3, wherein the second set of vias comprises:
   a third via between the first conductive line and the first power rail, the third via electrically coupling the first conductive line to the first power rail; and
   a fourth via between the second conductive line and the second power rail, the fourth via electrically coupling the second conductive line to the second power rail.

5. The integrated circuit of claim 3, further comprising:
   a first conductor extending in at least the first direction or the second direction, being on the third level of the back-side of the substrate, overlapping the first active region and the second active region.

6. The integrated circuit of claim 5, further comprising:
   a third via between a first drain/source of the first active region and the first conductor, the third via electrically coupling the first drain/source of the first active region to the first conductor; and
   a fourth via between a second drain/source of the second active region and the first conductor, the fourth via electrically coupling the second drain/source of the second active region to the first conductor.

7. The integrated circuit of claim 1, further comprising:
   a set of gates extending in the second direction, being on a fourth level of the front-side of the substrate, the fourth level being different from the first level, the second level and the third level.

8. An integrated circuit comprising:
   a first power rail extending in a first direction, configured to supply a first supply voltage and being on a first level of a back-side of a substrate;
   a second power rail extending in the first direction, configured to supply a second supply voltage different from the first supply voltage, and the second power rail being on the first level and being separated from the first power rail in a second direction different from the first direction;
   a first signal line extending in the first direction, being on the first level, and being between the first power rail and the second power rail;

a first active region extending in the first direction, and being on a second level of a front-side of the substrate opposite from the back-side, the second level being different from the first level, and the first active region being overlapped by and electrically coupled to the first power rail;

a second active region extending in the first direction, being on the second level, being separated from the first active region in the second direction, and being overlapped by and electrically coupled to the second power rail; and a first conductive line extending in the second direction, being on a third level of the back-side of the substrate, the third level being different from the first level and the second level, overlapping the first active region and the second active region, and electrically coupling the first active region and the second active region to the first signal line.

9. The integrated circuit of claim 8, further comprising:
a second conductive line extending in the second direction, being on the third level, overlapping the first active region and the second active region, being separated from the first conductive line in the first direction, and further electrically coupling the first active region and the second active region to the first signal line.

10. The integrated circuit of claim 9, further comprising:
a first via between a first drain/source of the first active region and the first conductive line, the first via electrically coupling the first drain/source of the first active region to the first conductive line; and
a second via between a second drain/source of the first active region and the second conductive line, the second via electrically coupling the second drain/source of the first active region to the second conductive line.

11. The integrated circuit of claim 10, further comprising:
a third via between the first conductive line and the first signal line, the third via electrically coupling the first conductive line to the first signal line; and
a fourth via between the second conductive line and the first signal line, the fourth via electrically coupling the second conductive line to the first signal line.

12. The integrated circuit of claim 8, further comprising:
a first conductor extending in at least the first direction or the second direction, being on the third level of the back-side of the substrate, overlapping the first active region and the second active region.

13. The integrated circuit of claim 12, further comprising:
a first via between a first drain/source of the first active region and the first conductor, the first via electrically coupling the first drain/source of the first active region to the first conductor; and
a second via between a second drain/source of the second active region and the first conductor, the second via electrically coupling the second drain/source of the second active region to the first conductor.

14. The integrated circuit of claim 8, further comprising:
a second conductive line extending in the second direction, being on the third level, overlapping the first active region, and being separated from the first conductive line in the first direction; and
a third conductive line extending in the second direction, being on the third level, overlapping the second active region, and being separated from the first conductive line in the first direction.

15. The integrated circuit of claim 14, further comprising:
a first via between the first active region and the second conductive line, the first via electrically coupling the first active region to the second conductive line;
a second via between the second active region and the third conductive line, the second via electrically coupling the second active region to the third conductive line;
a third via between the second conductive line and the first power rail, the third via electrically coupling the second conductive line to the first power rail; and
a fourth via between the third conductive line and the second power rail, the fourth via electrically coupling the third conductive line to the second power rail.

16. The integrated circuit of claim 8, wherein the first power rail or the second power rail comprises:
a central conductor extending in the first direction, and having a first side and a second side opposite from the first side;
a first set of conductive portions coupled to the first side of the central conductor, extending in the second direction, and each conductive portion of the first set of conductive portions being separated from each other in the first direction; and
a second set of conductive portions coupled to the second side of the central conductor, the second set of conductive portions extending in the second direction, each conductive portion of the second set of conductive portions being separated from each other in the first direction,
wherein the first set of conductive portions alternates with the second set of conductive portions in the first direction.

17. An integrated circuit comprising:
a first power rail extending in a first direction, configured to supply a first supply voltage and being on a first level of a back-side of a substrate;
a second power rail extending in the first direction, configured to supply a second supply voltage different from the first supply voltage, and the second power rail being on the first level and being separated from the first power rail in a second direction different from the first direction;
a set of active regions extending in the first direction, and being on a second level of a front-side of the substrate opposite from the back-side, the second level being different from the first level, and the set of active regions being overlapped by the first power rail and the second power rail, and being electrically coupled to the first power rail and the second power rail;
a first set of conductive lines extending in the second direction, being on a third level of the back-side of the substrate, the third level being different from the first level and the second level, and overlapping the set of active regions; and
a first set of vias between the set of active regions and the first set of conductive lines, the first set of vias electrically coupling the set of active regions to the first set of conductive lines.

18. The integrated circuit of claim 17, further comprising:
a second set of vias between the first set of conductive lines and at least one of the first power rail or the second power rail, the second set of vias electrically coupling the first set of conductive lines and the at least one of the first power rail or the second power rail.

19. The integrated circuit of claim 18, wherein the first set of conductive lines comprises:

a first conductive line extending in the second direction, being on the third level of the back-side of the substrate; and a second conductive line extending in the second direction, being on the third level of the back-side of the substrate, and being separated from the first conductive line in the first direction.

20. The integrated circuit of claim 19, wherein the second set of vias comprises:

a first via between the first power rail and the first conductive line, the first via electrically coupling the first power rail and the first conductive line together; and a second via between a first active region of the set of active regions and the second conductive line, the second via electrically coupling the first active region of the set of active regions and the second conductive line together.

* * * * *